United States Patent
Inomata et al.

(10) Patent No.: US 6,365,286 B1
(45) Date of Patent: Apr. 2, 2002

(54) MAGNETIC ELEMENT, MAGNETIC MEMORY DEVICE, MAGNETORESISTANCE EFFECT HEAD, AND MAGNETIC STORAGE SYSTEM

(75) Inventors: Koichiro Inomata; Yoshiaki Saito; Shinichi Nakamura, all of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/388,604

(22) Filed: Sep. 2, 1999

(30) Foreign Application Priority Data

Sep. 11, 1998 (JP) ............................ 10-258950
Sep. 14, 1998 (JP) ............................ 10-260640

(51) Int. Cl.$^7$ ................................ G11B 5/60
(52) U.S. Cl. ............... 428/692; 428/654 R; 428/694 T; 428/634 TM; 428/694 TS; 428/900; 365/171; 365/173; 360/113
(58) Field of Search ............... 428/692, 694 R, 428/694 T, 694 TM, 694 TS; 360/113; 365/173, 171

(56) References Cited

U.S. PATENT DOCUMENTS 6,069,820 A  *  5/2000  Inomata ...................... 365/171
6,114,056 A  *  9/2000  Inomata ...................... 428/692

OTHER PUBLICATIONS

F. Schelp et al, "Spin–dependent tunneling between ferromagnetic metals in a new type of tunnel junction (abstract)", *J. Appl. Phys.*, 81 (8), Apr. 15, 1997, p. 5508.

S. Sankar et al, "Spin–polarized tunneling in discontinuous CoFe/HfO$_2$ multilayers", *J. Appl. Phys.*, 81 (8), Apr. 15, 1997, pp. 5512–5514.

Koichiro Inomata et al, "Spin–Dependent Tunneling between a Soft Ferromagnetic Layer and Hard Magnetic Nanosize Particles", *Jpn. J. Appl. Phys.*, vol. 36, 1997, Pt. 2, No. 10B, pp. L1380–L1383.

K. Inomata et al, "Spin–dependent tunneling through layered ferromagnetic nanoparticles", *Applied Physics Letters*, vol. 73, No. 8, Aug. 24, 1998, pp. 1143–1145.

F. Schelp, et al., "Spin–dependent Tunneling Between Ferromagnetic Metals In A New Type of Tunnel Junction," J. Appl. Phys. 81 (8), Apr. 15, 1997.

M. N. Baibich, et al., "Giant Magnetoresistance Of (001) Fe/(001) Cr Magnetic Superlattices," Physical Review Letters, vol. 61, No. 21, Nov. 21, 1988, pp. 2472–2475.

D. H. Mosca, et al., "Oscillatory Interlayer Coupling and Giant Magnetoresistance in Co/Cu Multilayers," Journal of Magnetism and Magnetic Materials 94, (1991), pp. L1–L5.

W. P. Pratt, Jr., et al., "Perpendicular Giant Magnetoresistances of Ag/Co Mulilayers," Physical Review Letters, vol. 66, No. 23, Jun. 10, 1991, pp. 3060–3063.

(List continued on next page.)

Primary Examiner—Leszek Kiliman
(74) Attorney, Agent, or Firm—Oblon, Spivak, McClelland, Maier & Neustadt, P.C.

(57) ABSTRACT

A magnetic element which has a laminate film composed of ferromagnetic-dielectric mixed layer and dielectric layer laminated alternately, said ferromagnetic-dielectric mixed layer being a mixture of a ferromagnetic material having coercive force and a dielectric material, with the volume of the former being equal to or larger than that of the latter. The ferromagnetic-dielectric mixed layer 3 has the ferromagnetic layer 1 which is arranged close thereto with a dielectric layer interposed between them. Tunnel current flows between the ferromagnetic-dielectric mixed layer. The magnetic layer with a smaller coercive force has its spin switched so that the magnetoresistance effect is produced. The magnetic element having a ferromagnetic tunnel junction is designed such that the rate of change in magnetoresistance increases and the resistance of the element decreases and the rate of change in magnetoresistance varies less depending on voltage.

33 Claims, 37 Drawing Sheets

OTHER PUBLICATIONS

A. E. Berkowitz, et al., "Giant Magnetoresistance in Heterogeneous Cu–Co Alloys," Physical Review Letters, vol. 68, No. 25, Jun. 22, 1992, pp. 3745–3748.

L. F. Schelp, et al., "Spin–dependent Tunneling With Coulomb Blockade," Physical Review B, vol. 56, No. 10, Sep. 1, 1997, pp. R5747–R5750.

J. S. Moodera, et al., "Large Magnetoresistance at Room Temperature in Ferromagnetic Thin Film Tunnel Junctions," Physical Review Letters, vol. 74, No. 16, Apr. 17, 1995, pp. 3273–3276.

* cited by examiner

MAGNETIC ELEMENT, MAGNETIC MEMORY DEVICE, MAGNETORESISTANCE EFFECT HEAD, AND MAGNETIC STORAGE SYSTEM

BACKGROUND OF THE INVENTION

1. Field of the Invention

The present invention relates to a magnetic tunnel device, magnetic memory device, magnetoresistance effect head, and magnetic storage system.

2. Description of the Related Art

A magnetic substance of certain kind changes in electric resistance when it is placed in a magnetic field. This phenomenon is referred to as magnetoresistance effect. This effect is utilized for magnetoresistance effect elements (MR elements), such as magnetic head and magnetic sensor, in which the magnetic substance is in the form of magnetic layer. New magnetic memory based on MR elements has been proposed. (It is referred to as magnetic random access memory (MRAM).) Such MR elements are required to be highly sensitive to an external magnetic field and have a high speed of response.

MR elements with a ferromagnetic substance are characterized by good temperature stability and broad range of operating temperature. They are conventionally made with thin film of ferromagnetic alloy such as NiFe alloy. Unfortunately, it does not afford magnetic heads with a sufficient sensitivity because it changes only a little (2 to 3%) in magnetoresistance.

The magnetoresistance effect also manifests itself in a metal laminate film composed of magnetic layers and nonmagnetic layers (several nanometers thick) laminated alternately. In this case, it is referred to as the great magnetoresistance effect (GMR), which is due to conduction electrons scattering depending on the direction of spin of the magnetic layer. GMR is attracting attention. For example, it has been reported that GMR is observed in Fe/Cr artificial superlattice film (*Phys. Rev. Lett.*, 61, 2472 (1988)) and Co/Cu artificial superlattice film (*J. Mag. Mag. Matter.*, 94, L1 (1991)). Unfortunately, such metal artificial superlattice film, with its magnetic layers bonded by antiferromagnetism, has a great antiferromagnetic exchange coupling constant and hence needs a strong magnetic field for saturation and suffers a great hysteresis.

There has been developed a new laminate film composed of two ferromagnetic layers and one nonmagnetic layer interposed between them. This film, referred to as spin-valve film, is constructed such that the nonmagnetic layer is thick, one ferromagnetic layer has its magnetization pinned, and the other ferromagnetic layer is readily magnetized (with spin reversal) by the external magnetic field. Unfortunately, the spin-valve film is low in resistance and hence low in output voltage; therefore, for the spin-valve film to produce a high output voltage, it is necessary that the sense current should be large. The result in the case of magnetic head with spin-valve film is that magnetization in the magnetization-pinned layer is reversed by electrostatic destruction (ESD).

The above-mentioned multilayer film (such as artificial metal superlattice film) greatly changes in magnetoresistance when current passes through it in the direction perpendicular to the film surface, as reported in *Phys. Rev. Lett.*, 66, 3060 (1991). (This phenomenon is called the perpendicular magnetoresistance effect.) However, this effect cannot be measured at room temperature without microfabrication of submicron order because the current path is small and each metal layer has a low resistance.

The GMR effect due to spin-dependent conduction is found in the granular film which is composed of a nonmagnetic metal matrix and magnetic superfine particles dispersed therein, as reported in *Phys. Rev. Lett.*, 68, 3745 (1992). In the absence of magnetic field, this granular film has a high electric resistance because individual magnetic superfine particles have their spin oriented in irregular directions. In the presence of magnetic field, they have their spin aligned with the direction of magnetic field, decreasing in resistance. This produces the spin-dependent magnetoresistance effect. However, the magnetic field for saturation in this case is inherently strong because the magnetic superfine particles exhibit the superparamagnetism.

On the other hand, there has been found another great magnetoresistance effect which results from the ferromagnetic tunnel effect rather than the spin-dependent scattering. This effect manifests itself in a laminate film with tunnel junctions, which is composed of two ferromagnetic metal layers and one dielectric layer interposed between them, when current flows in the direction perpendicular to the film surface such that tunnel current occurs in the dielectric layer. The great magnetoresistance effect is due to the fact that when spin reversal takes place in the ferromagnetic metal layer with a small coercive force, the tunnel current greatly varies depending on whether spins in the two ferromagnetic metal layers are parallel or antiparallel to each other. This is known to stem from the spin asymmetry of state density in the Fermi surface.

The ferromagnetic tunnel junction element as mentioned above changes in magnetoresistance rather greatly but suffers the disadvantage that it increases in resistance to 1 to 10 MΩ when it is in the form of microfabricated element of the order of several micrometers squared. This high resistance leads to low response speeds and large noises.

There has been proposed a ferromagnetic tunnel junction which utilizes cobalt fine particles (2 to 4 nm in diameter) dispersed in a dielectric material. (*Phys. Rev.*, B56(10), R5747 (1997)) Unfortunately, such cobalt fine particles exhibit superparamagnetism and inherently need a strong magnetic field for saturation like the granular film mentioned above. Moreover, the ferromagnetic tunnel junction element using cobalt fine particles changes in magnetoresistance only half as much as the one using a dielectric layer.

It is theoretically predicted that the double tunnel junction constructed of Fe/Ge/Fe/Ge/ferromagnetic material produces significant magnetoresistance owing to the spin-polarized resonance tunnel effect. (*Phys. Rev.*, B56, 5484 (1997)) This prediction, however, is about behavior at an extremely low temperature (say, 8 K) and no predictions have been made about behavior at room temperature. Moreover, nothing has been reported about actual production of double tunnel junction.

SUMMARY OF THE INVENTION

Among other tunnel effect elements than mentioned above is a ferromagnetic tunnel effect element, which has been applied for patent (U.S. patent application Ser. No. 09/074,588). It is composed of a granular magnetic film and two electrodes arranged in the proximity thereof, the former being made of ferromagnetic fine powder (with coercive force) dispersed in a non-magnetic dielectric matrix, at least either of the latter being made of a ferromagnetic material. The advantage of this element is that the granular magnetic film is so thick (tens of nanometers) that it does not greatly fluctuate in magnetoresistance but greatly changes in magnetoresistance even in a small magnetic field. However, the fact that the element has two tunnel barriers at the boundaries between the two electrodes and the particles in the granular magnetic film leads to the disadvantage that the two tunnel barriers would fluctuate. In addition, it is likely that the ferromagnetic particles in the granular magnetic film have a small coercive force if they are small in size.

It is an object of the present invention to provide a new magnetic element which is different from the above-mentioned tunnel effect element. It is another object of the present invention to provide a magnetic element which readily and stably exhibits a large rate of change of magnetoresistance in a small magnetic field and fluctuates only little in resistance and sensitivity to magnetic field. It is another object of the present invention to provide a magnetic device, such as magnetic head and magnetic memory element, that is based on said magnetic element.

The first aspect of the present invention is a magnetic element. This element is constructed such that tunnel current flows between a ferromagnetic layer and a ferromagnetic-dielectric mixed layer and the magnetic layer with a smaller coercive force has its spin switched, thereby producing the magnetoresistance effect.

The magnetic element according to the first aspect of the present invention should preferably be constructed such that the dielectric material in the ferromagnetic-dielectric mixed layer is dispersed in granular form in the matrix of ferromagnetic material.

The magnetic element of the present invention has a laminate film composed of a ferromagnetic-dielectric mixed layer and a layer of dielectric material, and the layer arrangement of the laminate film may be represented as follows:

$A/(B/A)_N$ (where $N \geq 1$, denoting the number of layers)

A: the layer of dielectric material
B: the ferromagnetic-dielectric mixed layer.
In the vicinity of this laminate film is arranged a ferromagnetic layer. A few examples of the laminate structure are given below.

A laminate film of $A/(B/A)_N$ structure in combination with a ferromagnetic layer.

A laminate film with two or more ferromagnetic layers separately arranged on the surface thereof. (planar structure).

The second aspect of the present invention is a magnetic element.

The present inventors carried out extensive studies on a magnetic element consisting of a discontinuous magnetic film and electrodes of a ferromagnetic material, said discontinuous magnetic film being made of a mixture of a dielectric material and a ferromagnetic material, and said electrodes being arranged adjacently to the discontinuous magnetic film through a tunnel barrier. As the result, it was found that it is possible to obtain a more remarkable magnetoresistance effect and to realize a ferromagnetic tunnel effect element with a smaller resistance, if one electrode of ferromagnetic material is laminated on the discontinuous magnetic film, with a dielectric layer interposed between them, and the other electrode of ferromagnetic material is substantially in contact with the ferromagnetic material in the discontinuous magnetic film.

The magnetic element as mentioned above produces the tunnel magnetoresistance due only to the tunnel current across the electrode of ferromagnetic material and the discontinuous magnetic film through the layer of dielectric material. Therefore, it is only necessary to control the thickness of one layer of dielectric material. This permits one to prevent the fluctuation of resistance and magnetic field sensitivity due to variation in tunnel barrier thickness. In addition, the fact that one of the electrodes is substantially in contact with the ferromagnetic material in the discontinuous magnetic film makes it difficult for the ferromagnetic material in the granular magnetic film to undergo spin reversal due to temperature rise or disturbed magnetic field. This means that the magnetic element is stable.

The magnetic element of the present invention may be constructed such that the first and second electrodes of ferromagnetic material are arranged on the layer of dielectric material along the surface of the discontinuous magnetic film. In other words, it is a ferromagnetic tunnel effect element of planar type, which can be manufactured easily.

The magnetic tunnel element according to the first and second aspects of the present invention may be applied to storage systems (such as magnetic memory and magnetic reproducing head for magnetic recording and reproducing units) and magnetic devices (such as magnetic sensor).

BRIEF DESCRIPTION OF THE DRAWINGS

A more complete appreciation of the invention and many of the attendant advantages thereof is readily obtained as the same becomes better understood by reference to the following detailed description when considered in connection with the accompanying drawings.

DESCRIPTION OF THE PREFERRED EMBODIMENTS

The First Embodiment

The following explanation of the first embodiment is concerned with the reason why the magnetic element of the present invention greatly changes in magnetoresistance even in a weak magnetic field.

Figure 1A:
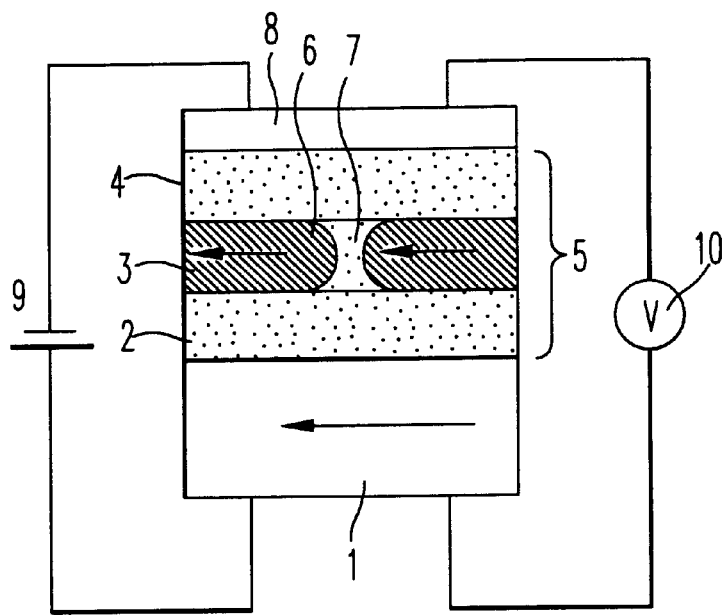
FIGS. 1A and 1B are schematic diagrams showing the fundamental structure of the first embodiment according to the first aspect of the present invention, together with its voltage supply means and its voltage variation detecting means.
Figure 1B:
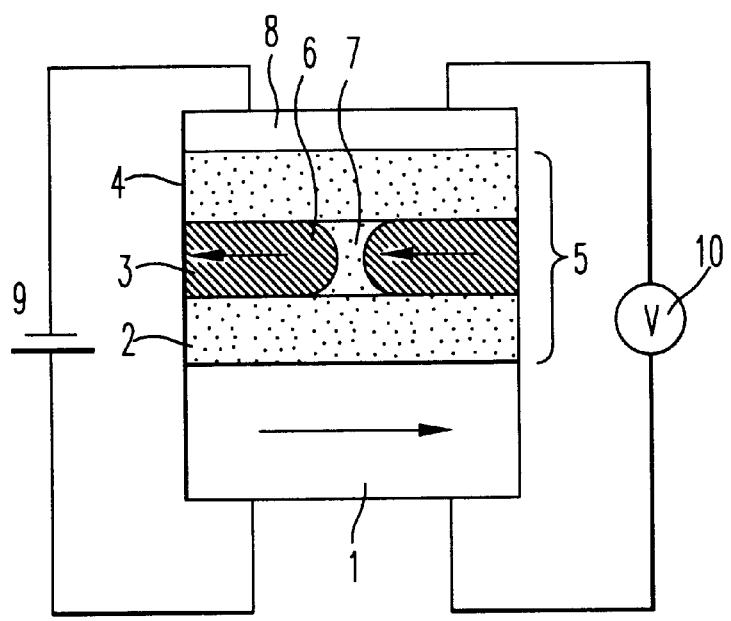

FIG. 1 is a schematic sectional view showing the fundamental structure of the magnetic element of the present invention. The magnetic element has a double ferromagnetic tunnel junction which is provided with a voltage supply means and a voltmeter. The tunnel junction is composed of a ferromagnetic layer 1, a laminate layer 5, and an electrode layer 8. The laminate layer 5 is composed of a dielectric tunnel barrier layer 2, a ferromagnetic-dielectric mixed layer 3, and a dielectric tunnel barrier layer 4. The latter two layers constitute a unit of layers. The arrow in the drawing indicates the spin direction. The power source 9 applies a voltage to the double tunnel junction. This voltage produces a potential across the ferromagnetic layer 1 and the electrode layer 8, and the potential is measured by the voltmeter.

Figure 2A:
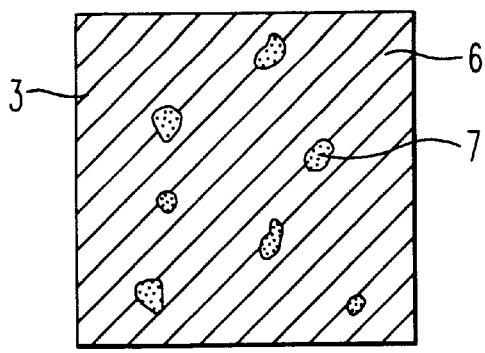
FIGS. 2A to 2C are schematic diagrams showing the internal structure of the ferromagnetic-dielectric mixed layer in the magnetic element according to the first aspect of the present invention.
Figure 2B:
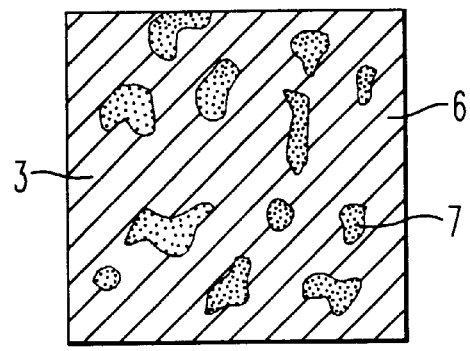
Figure 2C:
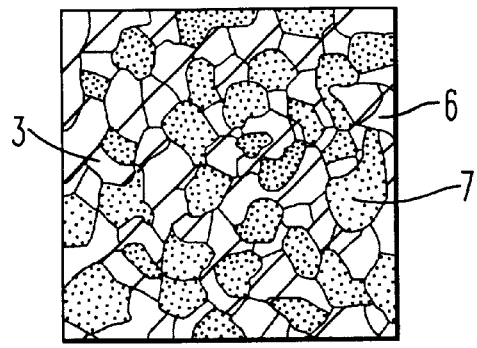

The magnetic element of the present invention has the ferromagnetic-dielectric mixed layer 3 which is composed of a ferromagnetic material 6 and a dielectric material 7, the former exceeding the latter in volume as shown in FIGS. 2A to 2C. The mixture does not exhibit the superparamagnetism but is a ferromagnetic material with a limited coercive force. Ideally, the ferromagnetic material 6 should have spin oriented in one direction.

When a voltage is applied (from the power source 9) across the ferromagnetic layer 1 and the electrode layer 8, with the laminate layer 5 interposed between them, conduction electrons in the ferromagnetic layer 1 move into the ferromagnetic-dielectric mixed layer 3 via the dielectric tunnel barrier 2. This makes tunnel current to flow. The ferromagnetic-dielectric mixed layer 3 is held between two thin dielectric tunnel barrier layers 2 and 4, so that tunnel current flows across the ferromagnetic electrode layer 1 and the ferromagnetic-dielectric mixed layer 3 via the dielectric tunnel barrier layer 2 and tunnel current also flows across the ferromagnetic-dielectric mixed layer 3 and the electrode layer 8 via the dielectric tunnel barrier layer 4.

During tunnel conduction through each tunnel barrier layer, electrons usually conserve the spin direction. The following illustrates what happens when an external magnetic field is applied to the state in which the spin of conduction electrons is conserved.

It is assumed that the ferromagnetic layer 1 and the ferromagnetic material 6 have the same spin direction in the initial state, as shown in FIG. 1A. Under this circumstance, tunnel conduction takes place, with the spin direction of the ferromagnetic layer 1 and the ferromagnetic material 6 conserved. Therefore, electrons (whose spin is indicated by ↓ in FIG. 3A) in the spin band with a great state density greatly contribute to conduction. This permits electrons to undergo tunnel conduction easily. In other words, current merely encounters a low resistance.

Figure 3A:
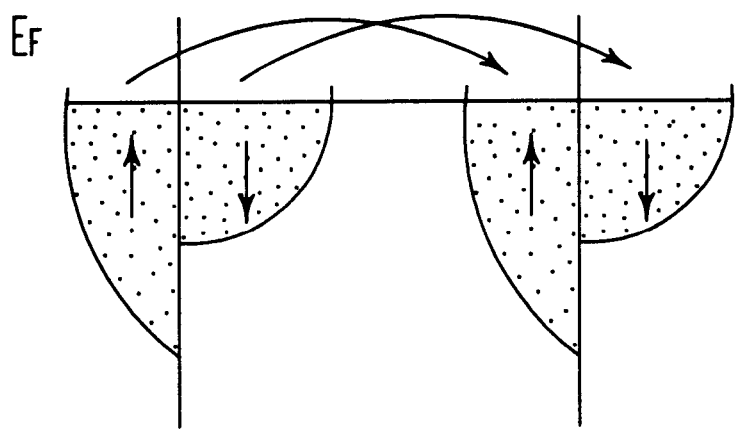
FIGS. 3A and 3B are schematic diagrams illustrating how the magnetoresistance effect is produced in the magnetic element according to the first aspect of the present invention.
Figure 3B:
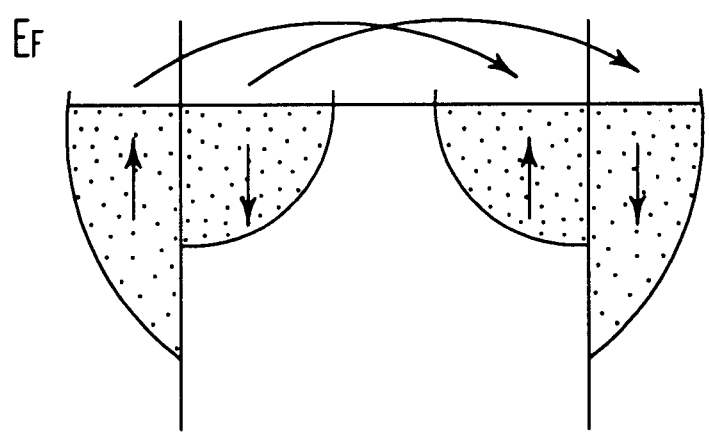

Then, an external magnetic field is applied. This external magnetic field is weak but strong enough to reverse the spin of either the ferromagnetic layer 1 or the ferromagnetic material 3, whichever has a relatively smaller coercive force. (In FIG. 1, the spin of the ferromagnetic layer 1 is reversed.) Under this circumstance, the spin band of the magnetic layers 1 and 5 pass through the spin band with a low state density, as shown in FIG. 3E. Thus, electrons in FIG. 3B become less liable to tunnel conduction than electrons in FIG. 3A. In other words, current encounters a larger resistance.

In this way it is possible to make magnetoresistance to greatly change by application of an external magnetic field which reverses only the spin of the magnetic layer with a smaller coercive force. The above-mentioned mechanism works in the same way as above even in the case where the ferromagnetic material 6 has a higher coercive force than the ferromagnetic layer 1 and the spin of the ferromagnetic material 6 is reversed.

The magnetic element can be made more sensitive if a soft magnetic material with a small coercive force is selected so that the magnetic field for saturation is weak.

As mentioned above, the ferromagnetic-dielectric mixed layer 3 is composed of a ferromagnetic material 6 and a dielectric material 7, the former exceeding the latter in volume. In other words, it is not superparamagnetic but ferromagnetic, and hence it does not suffer the disadvantage of requiring a strong magnetic field for saturation unlike the conventional granular GMR material and granular TMR material.

The multiple tunnel junction having two or more layers as in the present invention is one or two orders of magnitude smaller in electric resistance than the ordinary tunnel junction. Moreover, it is more stable with less variation. The advantage of its having at least two dielectric tunnel barriers 2 and 4 is that the voltage effectively applied to the junction is small and magnetoresistance changes only a little regardless of voltage applied or current passing through the magnetic element to produce a desired output voltage.

The fact that the ferromagnetic-dielectric mixed layer 3 contains the ferromagnetic material 6 whose volume is equal to or larger than that of the dielectric material 7 permits the spin of the ferromagnetic material to be aligned easily, thereby producing magnetoresistance more effectively. The ratio (by volume) of the ferromagnetic material 6 to the dielectric material 7 should preferably be greater than 1:1. (In other words, the former is present more than the latter.) In such a case, the ferromagnetic material 6 has its spin aligned easily and magnetoresistance is produced more effectively, as mentioned above. The ferromagnetic material-dielectric mixed layer 3 should preferably be formed such that the dielectric material 7 is dispersed in the matrix of the ferromagnetic material 6 (as shown in FIGS. 2A and 2B which are conceptual plan views.) In such a case, the ferromagnetic material 6 has its spin aligned particularly easily and improves in crystallinity, which leads to enhanced magnetoresistance.

The magnetic element of the present invention may be applied to magnetoresistance-type magnetic heads, magnetic field sensors, and magnetic recording elements. It is desirable that the magnetic layer constituting the magnetic element should be given uniaxial anisotropy. In the case where one of the magnetic layers is intended to be the magnetization pinned layer, the structure may be modified such that the ferromagnetic layer 1 or the ferromagnetic material-dielectric mixed layer 3 is provided with an anti-ferromagnetic layer so that a bias magnetic field is applied.

The Second Embodiment

Figure 4:
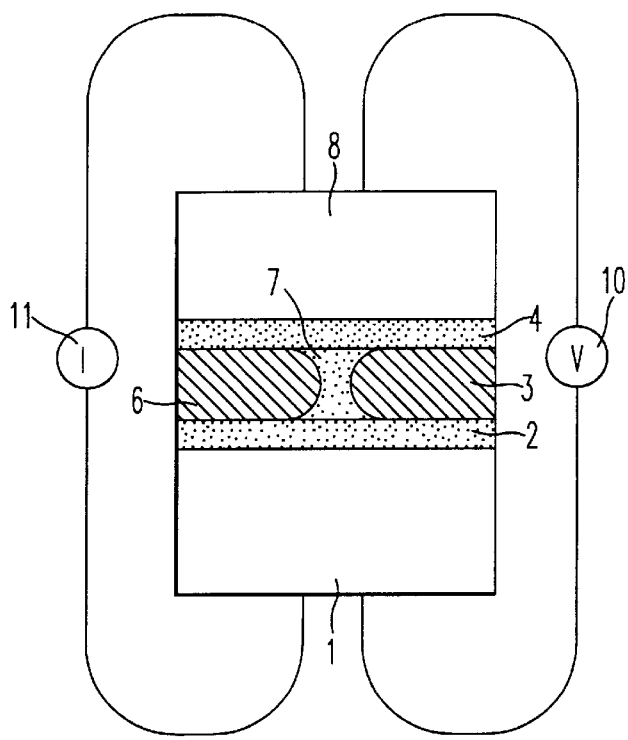
FIG. 4 is a sectional view showing the structure of the magnetic element as the second embodiment according to the first aspect of the present invention.

The second embodiment of the present invention is concerned with a magnetic element used to measure resistance change with an ammeter 11, as shown in FIG. 4. The magnetic element shown in FIG. 4 has a laminate layer 6 which is composed of an electrode layer 1 of ferromagnetic material, a tunnel barrier layer 2 of dielectric material, a layer 3 of ferromagnetic material and dielectric material mixed together, a tunnel barrier layer 4 of dielectric material, and an electrode layer 5. The second electrode layer 5 may be made of either ferromagnetic metal or non-magnetic metal.

The magnetic element produces the great magnetoresistance effect as either of the magnetic layers 1 and 3 has its spin reversed. The magnetic layer which has its spin reversed by an external magnetic field is not limited to the above-mentioned electrode layer 1 of ferromagnetic material; it may be either of the magnetic layer 1 or the magnetic layer 3, whichever has a smaller coercive force.

Figure 5:
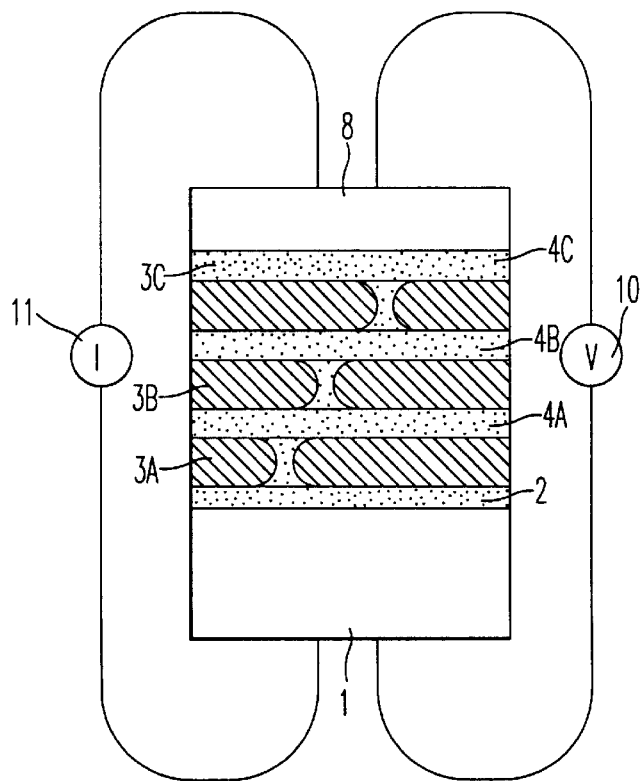
FIG. 5 is a sectional view showing the structure of a modified example of the magnetic element shown in FIG. 4.

The magnetic element of the present invention may have more than one ferromagnetic-dielectric mixed layer 3. For example, it may be constructed as shown in FIG. 5. In other words, it may have a plurality of ferromagnetic-dielectric mixed layers 3a, 3b, and 3c and a plurality of dielectric layers 2, 4a, 4b, and 4c, which are laminated alternately, so that triple (or multiple) ferromagnetic tunnel junctions are formed. The magnetic element of the present invention may be composed of a ferromagnetic electrode layer 1, a dielectric layer 2, N laminate layers each consisting of a ferromagnetic-dielectric mixed layer 3 and a dielectric layer 4 (where $N \geq 1$), and an electrode layer 5, so that it has (N+1)-tuple tunnel junctions. 11 in FIG. 5 indicates current detector.

The Third Embodiment

Figure 6:
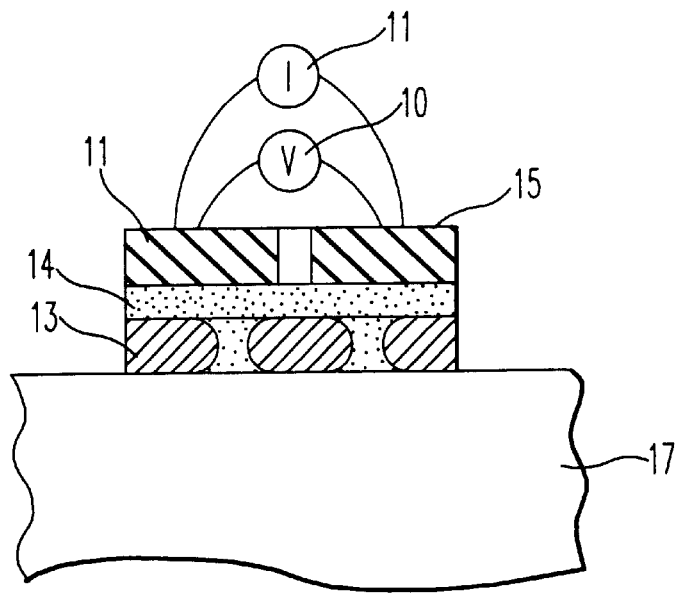
FIG. 6 is a sectional view showing a planar-type magnetic element as the third embodiment according to the first aspect of the present invention.

The third embodiment of the present invention is concerned with a planar-type element that permits current to flow along the film surface, as shown in FIG. 6. It is composed of a ferromagnetic-dielectric mixed layer 13, a dielectric tunnel layer 14, and divided ferromagnetic electrode layers 11 and 15, which are laminated on top of the other. This structure causes the dielectric tunnel layer 14 to provide two tunnel barriers. In other words, a first dielectric tunnel barrier exists between the ferromagnetic electrode 11 and the ferromagnetic-dielectric mixed layer 13, and a second dielectric tunnel barrier exists between the ferromagnetic electrode 15 and the ferromagnetic-dielectric mixed layer 13. This element is called planar type because the electrodes 11 and 15 are formed on the same film surface. In this element, tunnel current flows in the direction perpendicular to the principal plane of the dielectric tunnel layer 14 through the tunnel barrier, and current in the ferromagnetic-dielectric mixed layer 13 flows in the direction parallel to the film surface.

The planar-type element can be manufactured easily by the microfabrication technology; hence resulting elements have stable characteristics and are suitable for high-density arrangement.

In FIG. 6, there is shown a substrate 17. If this substrate 17 is a dielectric material, the lower dielectric layer may be omitted and the ferromagnetic-dielectric mixed layer 13 is formed on the principal plane of the substrate 17, as shown in FIG. 6. In this case, the dielectric layer 2 used in the first and second embodiments is not necessarily required; it may be replaced by N laminate layers each consisting of a ferromagnetic-dielectric mixed layer 13 and a dielectric tunnel layer 14 (where $N \geq 1$).

Figure 7:
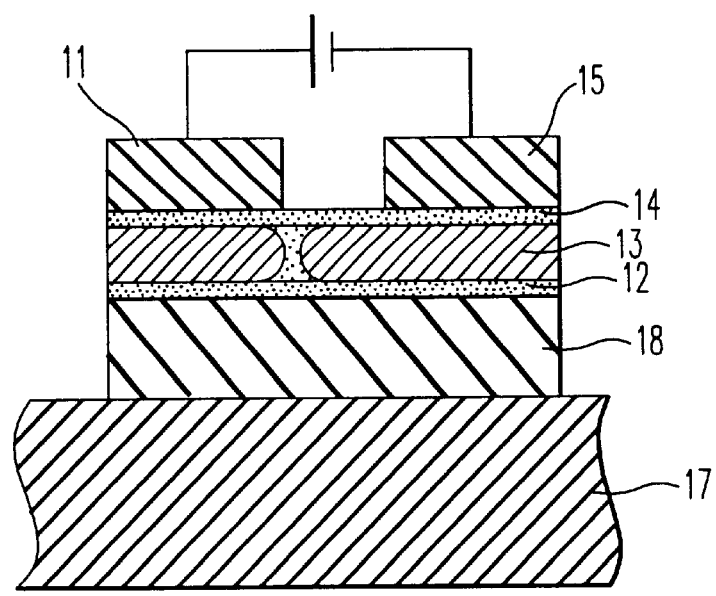
FIG. 7 is a sectional view showing the structure of a modified example of the magnetic element shown in FIG. 6.

The planar-type element like this may have an low resistance layer 18 under the laminate layer composed of a dielectric layer 12, a ferromagnetic-dielectric mixed layer 13, and a dielectric layer 14, as shown in FIG. 7. The underlying layer 18 may be a ferromagnetic metal or a non-magnetic metal.

The Fourth Embodiment

Figure 8:
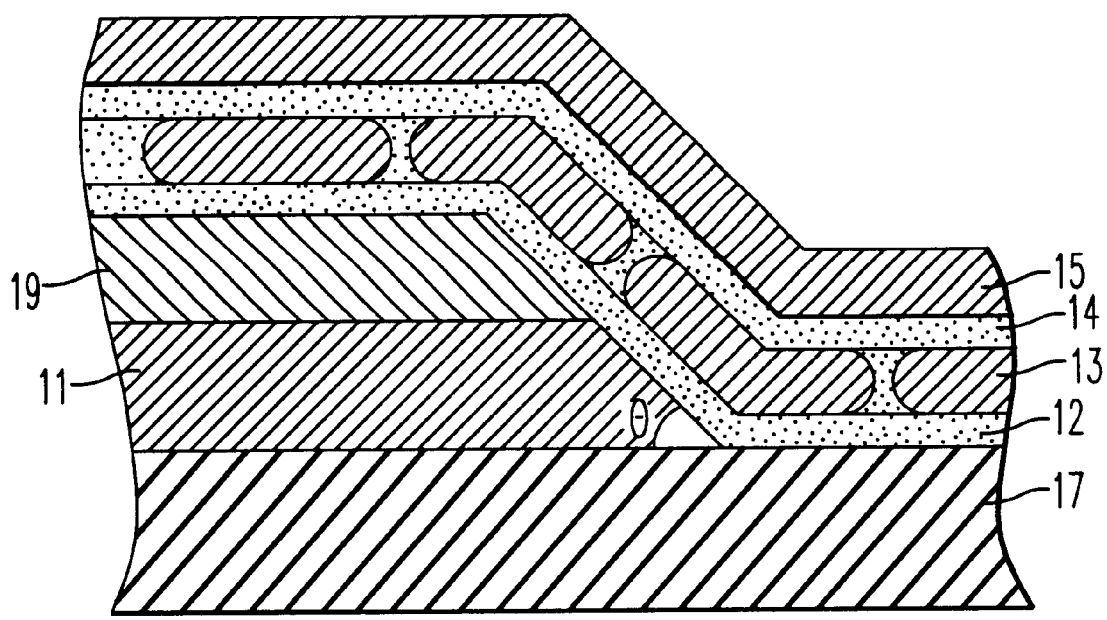
FIG. 8 is a sectional view showing the structure of a magnetic element as the fourth embodiment according to the first aspect of the present invention.

The magnetic element of the present invention may be of edge-junction type, as sectionally shown in FIG. 8. The magnetic element of edge-junction type shown in FIG. 8 is composed of a substrate 17, a ferromagnetic electrode layer 11, and an insulating layer 19, which are laminated sequentially. The laminate film has its edge surface inclined by a prescribed angle θ. The inclined edge surface of the laminate film (composed of a ferromagnetic electrode layer 11 and an insulating layer 19) is covered with another laminate layer (composed of a dielectric layer 12, a ferromagnetic-dielectric mixed layer 13, and a dielectric layer 14) and an upper electrode layer 15.

The magnetic element of edge-junction type mentioned above has a ferromagnetic tunnel junction which is formed along the slope between the ferromagnetic electrode layer 11 and the ferromagnetic-dielectric mixed layer 13, with a tunnel barrier 12 interposed between them. Incidentally, either of the upper and lower electrode layers 11 and 15 may be non-magnetic metal in place of ferromagnetic material. The magnetic element of edge-junction type like this works in the same way as the planar-type magnetic element explained in the third embodiment.

The planar-type magnetic element as well as the edge junction-type magnetic element may be provided with a film to apply a bias magnetic field (such as antiferromagnetic layer), if necessary. The magnetic element greatly varies in magnetoresistance when it is given tunnel current across the ferromagnetic electrode layer 11 and the ferromagnetic-dielectric mixed layer 13 and an external magnetic field which changes the direction of spin of the magnetic layer with a weaker coercive force (such as the ferromagnetic electrode layer 11).

The foregoing first to fourth embodiments have been referred so as to explain the fundamental and modified structure of the magnetic element pertaining to the present invention. Now, the following clarifies the material and structure desirable for the layers constituting the magnetic element of the present invention.

A variety of ferromagnetic materials may be used for the ferromagnetic electrode layer (1 or 11) or the ferromagnetic material 6 in the ferromagnetic-dielectric mixed layer (3, 3n, or 13). A preferred ferromagnetic material is Co, Co—Pt alloy, Fe—Pt alloy, or transition metal-rare earth metal alloy, which has a large magnetic anisotropy, in the case where the ferromagnetic electrode layer (1 or 11) or the ferromagnetic-dielectric mixed layer (3, 3n, or 13) is the magnetization pinned layer.

When used as the magnetization free layer, the ferromagnetic material is not specifically restricted. It may include Fe, Co, Ni, alloys thereof; oxide magnetic materials, such as magnetite, $CrO_2$, $RXMnO_{3-y}$ (R is a rare earth metal, and X is at least one element selected from Ca, Ba, and Sr), which have a large spin polarization; and Heusler alloys, such as NiMnSb and PtMnSb. If the magnetic layer is made of an oxide or half-metal (such as Heusler alloy), the decrease in magneto resistance by bias voltage can be avoided. The magnetic layer functions as a soft layer if it is replaced by a laminate magnetic film (with two or more layers) in which the hard film is adjacent to the soft layer. It is also possible to employ a multilayer film (with two or more layers) in which the soft magnetic layer itself is bonded by antiferromagnetism. The laminate film bonded anti-parallel prevents magnetic flux from leaking from the ferromagnetic film. This makes the recording layer more stable.

Incidentally, the above-mentioned magnetic material may contain a small amount of nonmagnetic element, such as Ag, Cu, Au, Al, Mg, Si, Bi, Ta, B, C, O, N, Si, Pd, Pt, Zr, Ir, W, Mo, and Nb, so long as it retains the ferromagnetism.

There are no restrictions on the kind of magnetic material when the magnetic layer is intended to be a hard layer by providing an antiferromagnetic film (such as FeMn, PtMn, PtCrMn, NiMn, IrMn, NiO, and $Fe_2O_3$) which fixes the direction of magnetization of the magnetic layer, and various magnetic materials mentioned above can be used. A laminate film of Co/Ru/Co or Co/Ir/Co may be placed under the antiferromagnetic film to fix the direction of magnetization of the magnetic layer.

The electrode layer 15 maybe made of a ferromagnetic metal or a nonmagnetic metal. In the former case, it is not always necessary that the electrode layer 15 and the ferromagnetic electrode layer 11 should be made of the same material. These ferromagnetic electrode layers 11 and 15 may be either of single-layer structure or laminate structure. The laminate may be composed of two or more ferromagnetic layers, with a nonmagnetic layer interposed between them, which are bonded together such that their magnetization is antiparallel to each other. The laminate film constructed in this way prevents magnetic flux from leaking from the ferromagnetic electrode layers 11 and 15.

The ferromagnetic electrode layer 1 or 11 and the ferromagnetic-dielectric mixed layer 3, 3n, or 13 (and the electrode layer 16 made of a ferromagnetic material) should preferably have a uniaxial magnetic anisotropy in the film plane. This permits a sharp magnetization reversal and keeps the state of magnetization stable.

The dielectric material 7 in the ferromagnetic-dielectric mixed layer 3, 3n, or 13, and the dielectric layer 2, 4, 4n, 12, or 14 may be any of various dielectric materials such as $Al_2O_3$, $SiO_2$, MgO, AlN, $Bi_2O_3$, $MgF_2$, and $CaF_2$. The ferromagnetic-dielectric mixed layer 3 is formed by dividing the dielectric material 7 by the ferromagnetic material 6. Incidentally, the above-mentioned oxide, nitride, and fluoride usually have defective elements; however, such dielectric materials do not pose any problem.

The ferromagnetic-dielectric mixed layer 3, 3n, or 13 should have a certain thickness so that it does not become superparamagnetic. A preferred thickness is 0.4 nm to 50 nm. If the ferromagnetic-dielectric mixed layer 13 is thinner than 3.5 nm, a quantum level occurs in the thin ferromagnetic material 6 (ferromagnetic matrix) in the ferromagnetic-dielectric mixed layer 13. This quantum level prevents magnetoresistance from decreasing by magnon excitation because the spin of the ferromagnetic electrode layer 11, when fluctuated by magnon excitation, does not tunnel readily through this quantum level. The ferromagnetic-dielectric mixed layer 13 should preferably be thicker than 1.9 nm so that the dielectric material 7 is uniformly dispersed in the ferromagnetic matrix 6.

The thickness of the electrode layer 1, 5, 11, or 15 should preferably be about 0.1 to 100 nm. The thickness of the dielectric layer 2, 4, 4n, 12, and 14 should be thinner than 10 nm, preferably thinner than 3 nm, although not specifically restricted. The substrate may be formed from any of Si, $Sio_2$, $Al_2O_3$, spinel, MgO, and AlN, which are not specifically restricted. The laminate film is formed on this substrate according to the present invention.

The magnetic element of layer structure as mentioned above is typically in the form of thin film. It can be manufactured by the ordinary thin film fabricating method, such as molecular beam epitaxy (MBE), sputtering, and vapor deposition. Alternate lamination of a ferromagnetic material 6 and a dielectric material 7 may be applied to form the ferromagnetic-dielectric mixed layer 3, 3n, or 13 (which is composed of a ferromagnetic material 6 and a dielectric material 7, the former exceeding the latter in volume) or the ferromagnetic-dielectric mixed layer 3, 3n, or 13 (which is composed of a ferromagnetic material 6 and a dielectric material 7 dispersed in the former as a matrix).

The dielectric tunnel barrier layer may be formed from a film of metal (such as Al), rare earth element (such as Mg), or semiconductor (such as Si) which subsequently undergoes oxidation or plasma-oxidation with oxygen alone or mixed with a rare gas (such as Ar). Alternatively, it may be formed directly by sputtering from a target of dielectric material, with or without subsequent oxidation or plasma-oxidation with high-purity oxygen.

The magnetic element explained above with reference to the first to fourth embodiments may be used for the magnetoresistance effect head, magnetic head assembly provided with it, magnetic recording system, magnetic memory element, and integrated magnetic memory system, which are explained in the following.

The Fifth Embodiment

Figure 9:
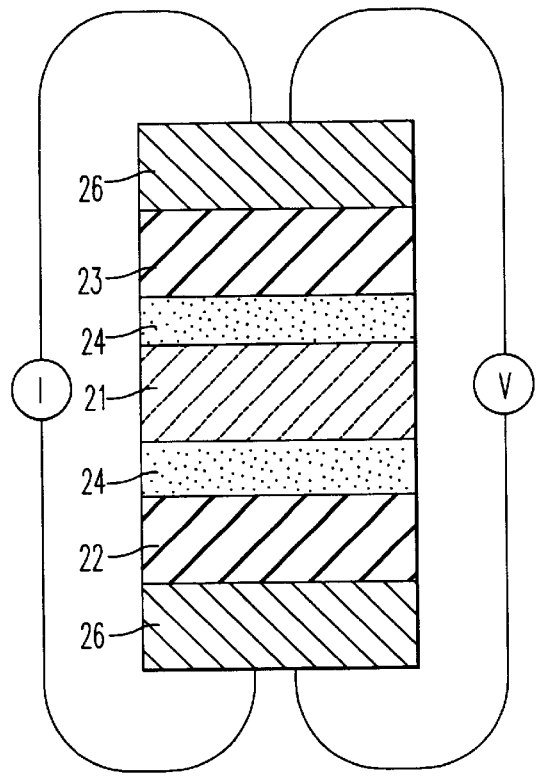
FIG. 9 is a sectional view showing the film structure of a magnetoresistance effect head as the fifth embodiment according to the first aspect of the present invention.
Figure 10:
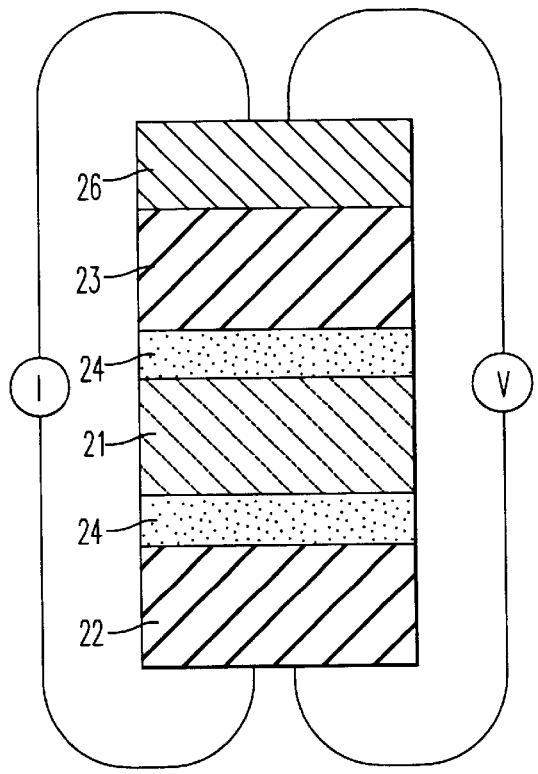
FIG. 10 is a sectional view showing the film structure of a magnetoresistance effect head as the fifth embodiment according to the first aspect of the present invention.
Figure 11:
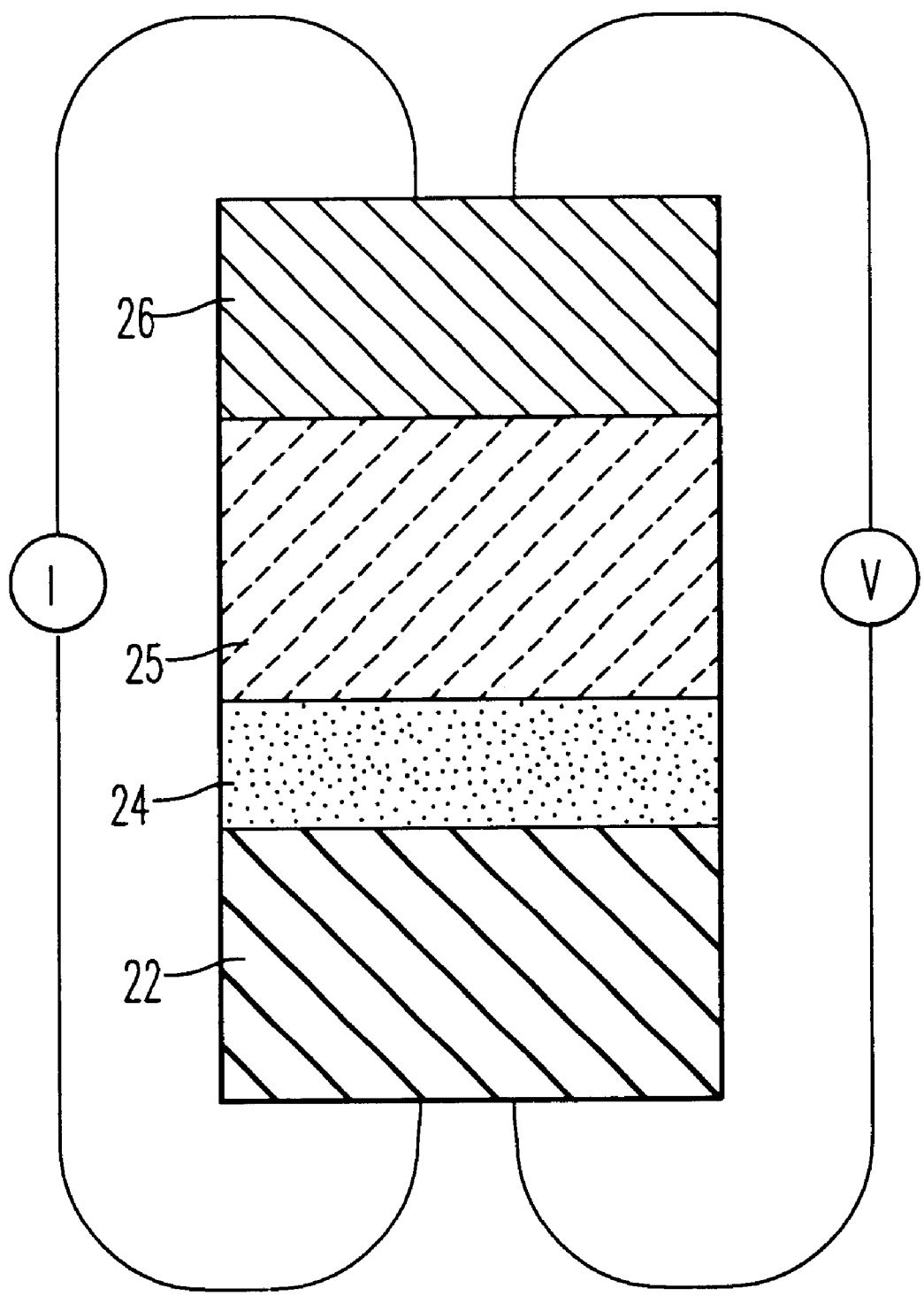
FIG. 11 is a sectional view showing the film structure of a magnetoresistance effect head as the fifth embodiment according to the first aspect of the present invention.

If the magnetic element of the present invention is to be applied to a magnetic head, it should be constructed as follows. FIGS. 9 to 11 are sectional views showing the film structure of the magnetic element to be used for a magnetoresistance effect head. In these figures, reference numerals 21, 22, 23, 24, and 25 respectively denote a ferromagnetic-dielectric mixed layer (which may be replaced by a multi-layer film composed of a dielectric layer and a ferromagnetic-dielectric mixed layer), a ferromagnetic electrode layer, an electrode layer (of ferromagnetic material, for example), a dielectric tunnel barrier layer, and a multilayer film composed of a ferromagnetic-dielectric mixed layer and a dielectric tunnel barrier layer. The film structure like this functions in such a way that when a voltage is applied across the ferromagnetic electrode layers 22 and 23, with the ferromagnetic-dielectric mixed layer 21 between them or the laminate film 25 (composed of a ferromagnetic-dielectric mixed layer and a dielectric tunnel barrier layer) between them, conduction electrons in the ferromagnetic material held between the dielectric tunnel barrier layers move through the tunnel effect.

If the magnetic element of the present invention is to be used for a magnetic head, it is desirable that the ferromagnetic electrode layer 22 or 23 and the ferromagnetic-dielectric mixed layer 21 or 25 should adjoin the antiferromagnetic film 26 which contains an antiferromagnetic material such as FeMn, PtMn, IrMn, PtCrMn, NiMn, NiO, and $Fe_2O_3$, as shown in FIGS. 9 to 11. This antiferromagnetic film 26 applies a bias magnetic field so that the spin of the magnetic layer is fixed in one direction. .

The film structure shown in FIGS. 9 to 11 makes it possible to construct a good magnetic head by combining the magnetic characteristics (soft magnetism and hard magnetism) of the layers. For example, in FIG. 9, the ferromagnetic-dielectric mixed layer 21 functions as a soft magnetic layer and the ferromagnetic electrode layers 22 and 23 function as a hard magnetic layer. In FIG. 10, the ferromagnetic electrode layer 22 functions as a soft magnetic layer and the ferromagnetic-dielectric mixed layer 21 and the ferromagnetic electrode layer 23 function as a hard magnetic layer. In FIG. 11, the ferromagnetic electrode layer 22 functions as a soft magnetic layer and the multilayer film 25 (composed of a ferromagnetic-dielectric mixed layer and a dielectric material) functions as a hard magnetic layer.

The above-mentioned layer combination offers the advantage of providing a good linear response to magnetic flux leaking from an HDD recording medium if the film is formed in a magnetic field or the film undergoes heat treatment in a magnetic field so that the spin of one magnetic layer is almost orthogonal to that of its adjoining magnetic layer. The structure like this can be used for magnetic heads of any structure.

Figure 12:
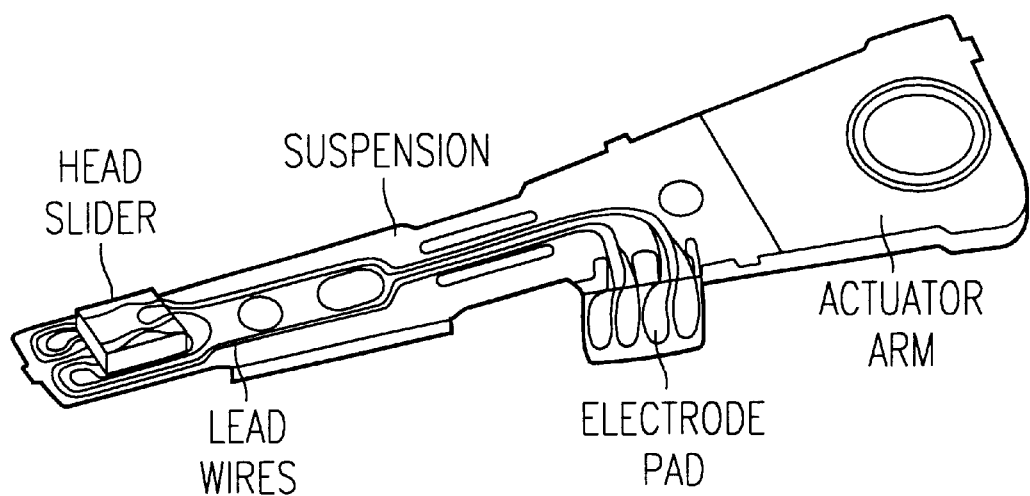
FIG. 12 is a perspective view showing a magnetic head assembly on which is mounted the magnetoresistance effect head with the magnetic element according to the first or second aspect of the present invention.

FIG. 12 is a perspective view showing a magnetic head assembly provided with the magnetoresistance effect head pertaining to the first aspect of the present invention mentioned above or the magnetoresistance effect head pertaining to the second aspect of the present invention mentioned below.

The actuator arm has a hole with which it is fixed to a magnetic disk unit. To one end of the actuator arm is connected a suspension.

To the forward end of the suspension is attached a head slider provided with the magnetoresistance effect head of various form as mentioned above. The suspension is provided with lead wires for writing and reading signals. One end of the lead wire is electrically connected to the electrode of the magnetoresistance effect head built into the head slider, and another end of the lead wire is connected to the electrode pad.

Figure 13:
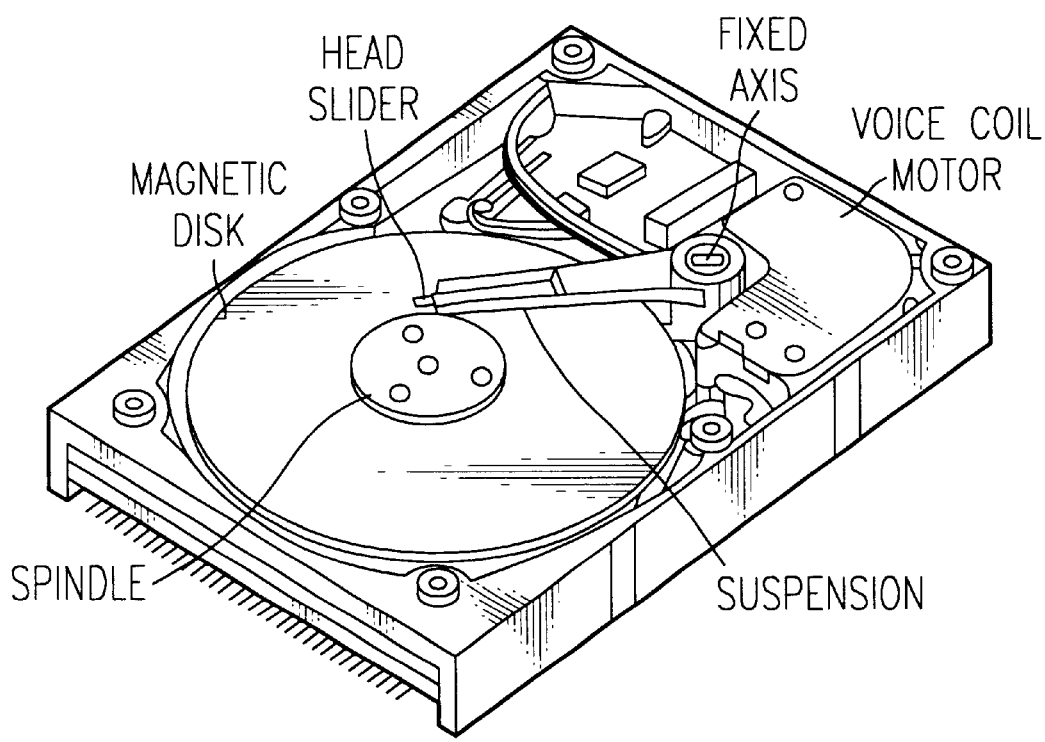
FIG. 13 is a perspective view showing a magnetic disk assembly on which is mounted the magnetoresistance effect head with the magnetic element according to the first or second aspect of the present invention.

FIG. 13 is a perspective view showing the internal structure of the magnetic disk unit provided with the magnetic head assembly shown in FIG. 12, which is one of the magnetic recording systems pertaining to the present invention.

The magnetic disk is mounted on a spindle, which is rotated by a motor (not shown) responding to control signals from a drive control (not shown). The head slider is attached to the forward end of the suspension (in the form of thin film), so that it writes and reads information while it floats on the magnetic disk. The head slider is provided with the magnetoresistance effect reproducing head mentioned above.

As the magnetic disk rotates, the head slider (facing the medium) floats to a prescribed height from the surface of the magnetic disk.

The suspension is connected to one end of the actuator arm, which has a bobbin for a drive coil (not shown). At the other end of the actuator arm is a voice coil motor which is one kind of linear motor. The voice coil motor is composed of a drive coil (not shown) and a magnetic circuit. The drive coil is wound up on the bobbin of the actuator arm. The magnetic circuit consists of opposed permanent magnets holding the drive coil and opposed yokes.

The actuator arm is supported by ball bearings (not shown) placed at top and bottom of the fixed axis, so that it is rotated by the voice coil-motor.

The Sixth Embodiment

If the magnetic element of the present invention is to be applied to a magnetic memory element, it should be constructed as follows. FIGS. 14 to 17 are sectional views showing the film structure of the magnetic element to be used for a magnetic memory element.

Figure 14:
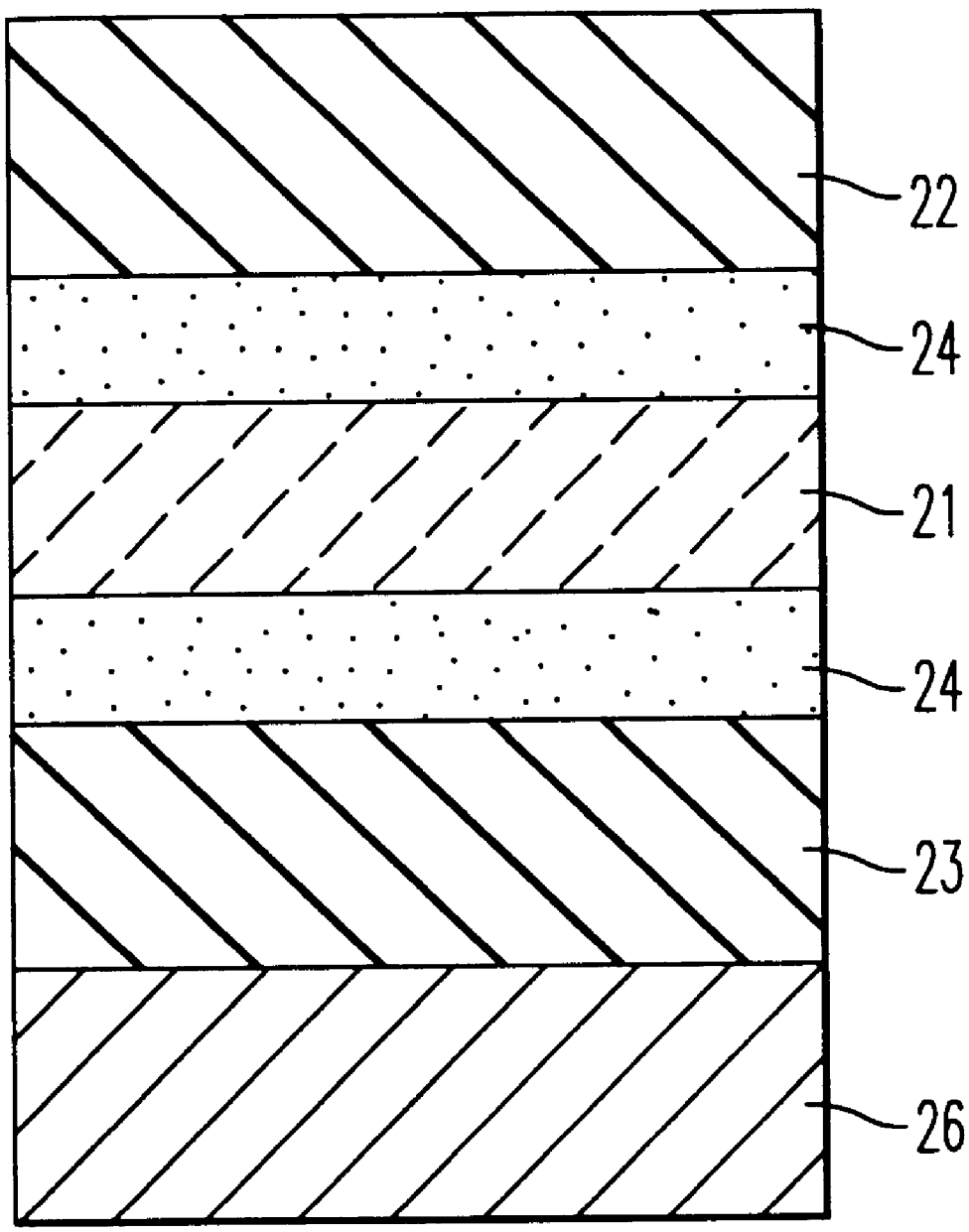
FIG. 14 is a sectional view showing the film structure of a magnetic memory element as the sixth embodiment of the first aspect of the present invention.
Figure 15:
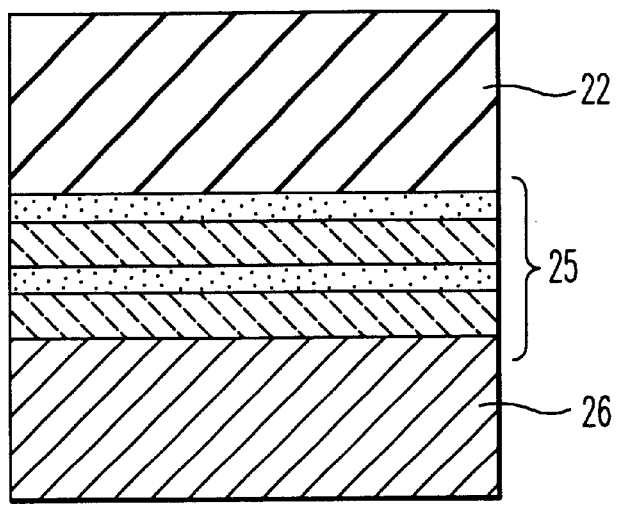
FIG. 15 is a sectional view showing the film structure of a magnetic memory element as the sixth embodiment according to the first aspect of the present invention.

FIGS. 14 and 15 show the structure of the magnetic memory element designed for destructive readout. It is desirable that the ferromagnetic electrode layer 22 or 23 and the ferromagnetic-dielectric mixed layer 21 or 25 should adjoin the antiferromagnetic film 26 of FeMn, PtMn, IrMi, PtCrMn, NiMn, NiO, or the like. This antiferromagnetic film 26 applies a bias magnetic field so that the spin of the magnetic layer is fixed in one direction. In FIG. 14, the ferromagnetic electrode layer 22 is a soft magnetic layer, and the ferromagnetic-dielectric mixed layer 21 and the ferromagnetic electrode layer 23 are hard magnetic layers. In FIG. 15, the ferromagnetic electrode layer 22 is a soft magnetic layer, and the multilayer film 25 composed of a ferromagnetic-dielectric mixed layer and a dielectric material is a hard magnetic layer.

Figure 16:
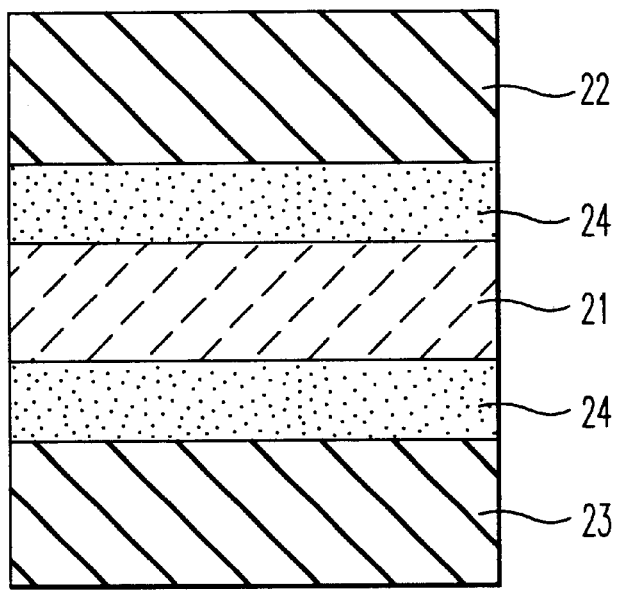
FIG. 16 is a sectional view showing the film structure of a magnetic memory element as the sixth embodiment according to the first aspect of the present invention.
Figure 17:
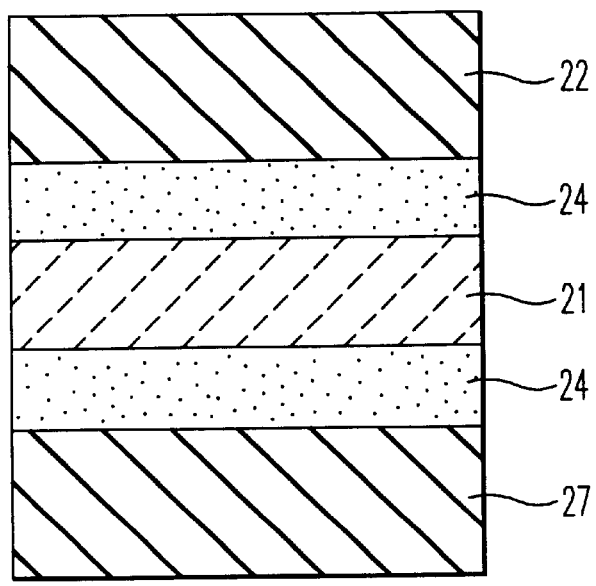
FIG. 17 is a sectional view showing the film structure of a magnetic memory element as the sixth embodiment according to the first aspect of the present invention.

FIGS. 16 and 17 show the structure of the magnetic memory element designed for non-destructive readout. A read layer and a write layer are formed by an adequate combination of a soft magnetic layer and a hard magnetic layer. This structure permits non-destructive readout of information from the write layer when magnetization of the soft magnetic layer is reversed by a current magnetic field. In FIG. 16, the ferromagnetic electrode layer 22 is a soft magnetic layer, and the ferromagnetic-dielectric mixed layer 21 and the ferromagnetic electrode layer 23 are hard magnetic layers. In FIG. 17, the ferromagnetic electrode layer 22 is a soft magnetic layer, and the ferromagnetic-dielectric mixed layer 21 is a hard magnetic layer. The lower electrode layer is a non-magnetic metal layer 27.

Figure 18:
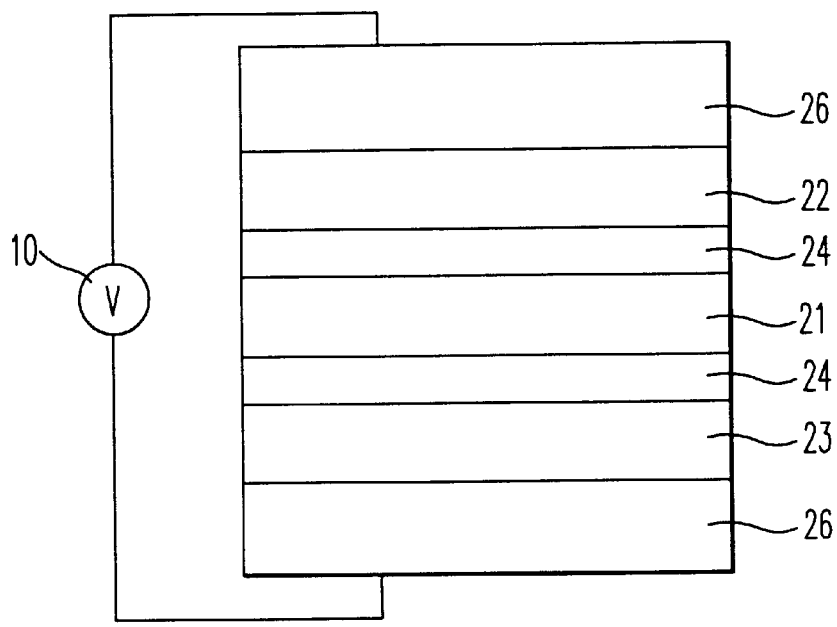
FIG. 18 is a sectional view showing the film structure of a magnetic memory element as the sixth embodiment according to the first aspect of the present invention.
Figure 19:
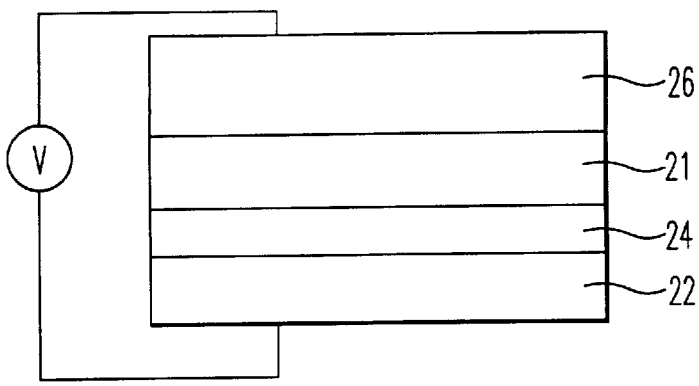
FIG. 19 is a sectional view showing the film structure of a magnetic memory element as the sixth embodiment according to the first aspect of the present invention.

FIGS. 18 and 19 are sectional views showing another example of the magnetic memory element designed for non-destructive readout.

The ferromagnetic electrode 22 or 23 or the ferromagnetic-dielectric mixed layer 21 is laminated with the antiferromagnetic film 26 (containing an antiferromagnetic material such as FeMn, PtMn, PrCrMn, NiMn, and IrMn) so that the ferromagnetic material in the ferromagnetic-dielectric mixed layer 21 has its magnetization fixed in one direction. This structure prevents magnetization reversal even when the ferromagnetic electrodes 22 and 23 or the ferromagnetic-dielectric mixed layer 21 is given a magnetic field several times. This provides a stable signal strength. In the structure shown in FIG. 18, the ferromagnetic-dielectric mixed layer 21 functions as a memory layer with a coercive force. In the structure shown in FIG. 19, the ferromagnetic layer 22 functions as a recording layer with a coercive force. The coercive force should be lower than 100 Oe so as to save energy for the current magnetic field.

The structure shown in FIGS. 18 and 19 permits one to see if the spin of the adjacent magnetic layers is parallel or antiparallel by measuring the absolute value with a voltmeter 10. Incidentally, FIGS. 18 and 19 show an instance in which change in resistance is measured by means of a voltmeter 10; however, it is also possible to measure change in resistance by means of an ammeter.

In the foregoing, FIGS. 14 to 19 (sectional views) served to explain the film structure of the magnetic memory element. A plurality of these magnetic memory elements (cells) may be arranged to form an array on a single substrate. The resulting product is an integrated magnetic memory device. Integration is accomplished in such a way that a plurality of magnetic memory elements (cells) adjoining each other in one direction (or word line direction) jointly hold the word line and a plurality of magnetic memory elements (cells) adjoining each other in the same direction as word line or in the orthogonal direction jointly hold the bit line. The resulting magnetic recording device operates with a small amount of electric power.

Figure 20:
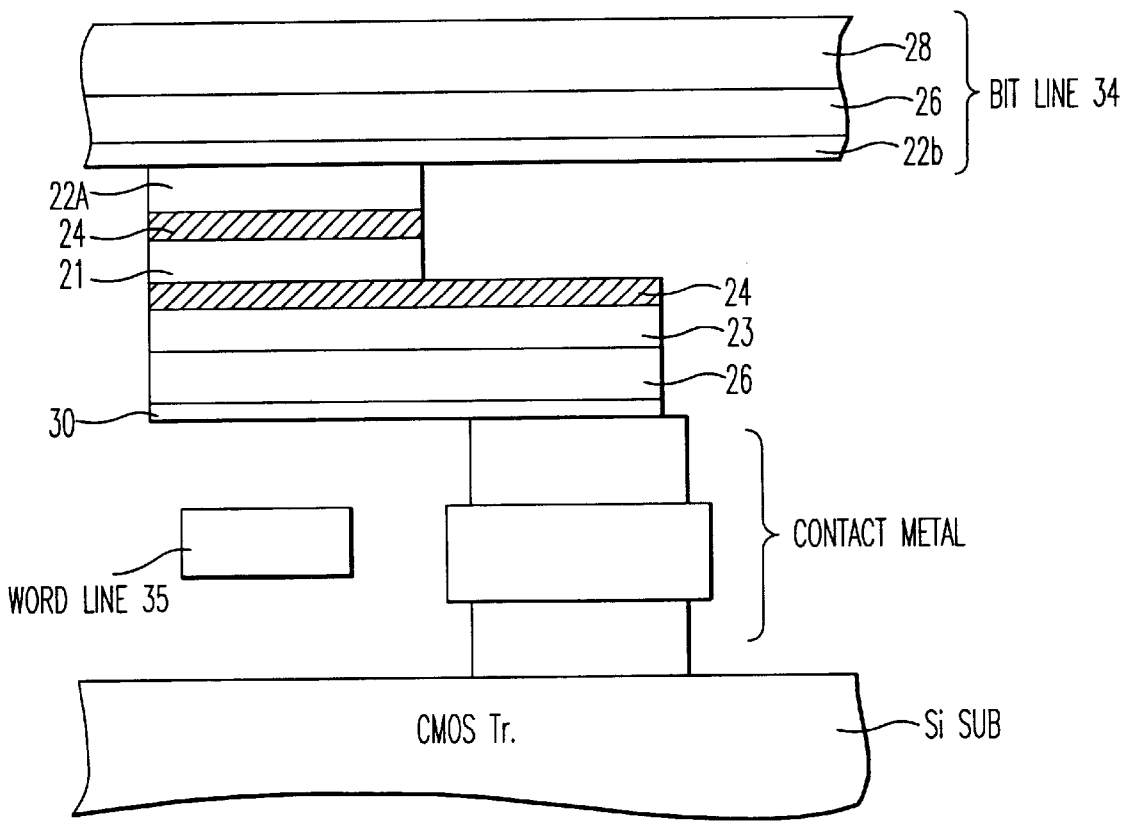
FIG. 20 is a sectional view showing the structure of a magnetic memory cell as the sixth embodiment according to the first aspect of the present invention.

FIG. 20 is a sectional view showing the arrangement of the cell (as shown in FIG. 18) and the bit line and word line.

The antiferromagnetic film 26 and a part 22b of the ferromagnetic layer 22 serve both as the bit line 34. As the result, the laminate for microfabrication can be made a thin film composed of the ferromagnetic layer 22a, the dielectric tunnel barrier layer 24, and the ferromagnetic-dielectric mixed layer 21. This offers the advantage of improving the precision of fabrication and reducing damages due to fabrication (such as etching). In addition, the fact that ferromagnetic layer 23 (laminated with the antiferromagnetic film 26 as the pinned layer) differs in area from the ferromagnetic-dielectric mixed layer 21 contributes to improvement in fabricating precision and also to reduction in damage due to fabrication. Incidentally, in FIG. 20, the ferromagnetic layer 23 laminated with the antiferromagnetic layer 26 is connected to the CMOS field effect transistor (not shown) through the metal underlying layer 30 and contact metal. (The CMOS field effect transistor is formed on the principal plane of the silicon substrate by the semiconductor technology.) The ferromagnetic-dielectric mixed layer 21 (as the free layer) has its magnetization reversed by the combined magnetic fields of the bit line 34 and the word line 35. Therefore, the bit line 34 and the word line 35 are arranged orthogonal to each other, and the word line 35 extends in the direction perpendicular to paper (in FIG. 20). The bit line 34 is owned jointly by other cells arranged in array in the direction parallel to paper surface, and the word line 35 is owned jointly by other cells arranged in array in the direction perpendicular to paper surface. Section of each cell is accomplished by causing current to flow through the word line 35 and the bit line 34 which intersect each other at the cell to be selected.

Figure 21:
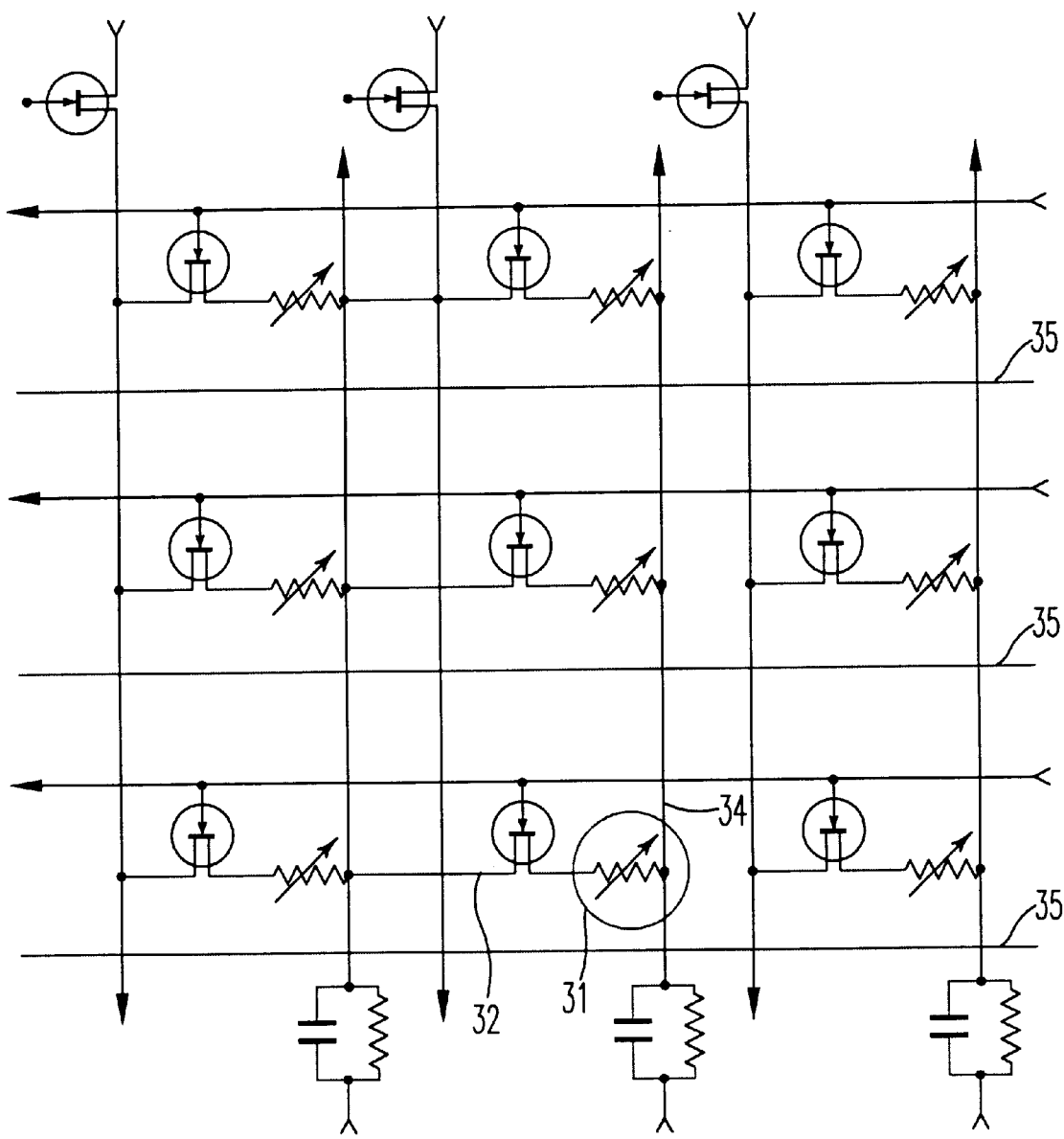
FIG. 21 is a circuit diagram of an integrated magnetic memory device as the sixth embodiment according to the first aspect of the present invention.

FIG. 21 is a circuit diagram showing cells (each shown in FIG. 20) arranged in array. There are shown magnetic elements 31, transistors 32, write lines 35, and bit lines 34, which are formed by microfabrication and arranged in array. The array thus constitutes an integrated magnetic recording device.

Figure 22:
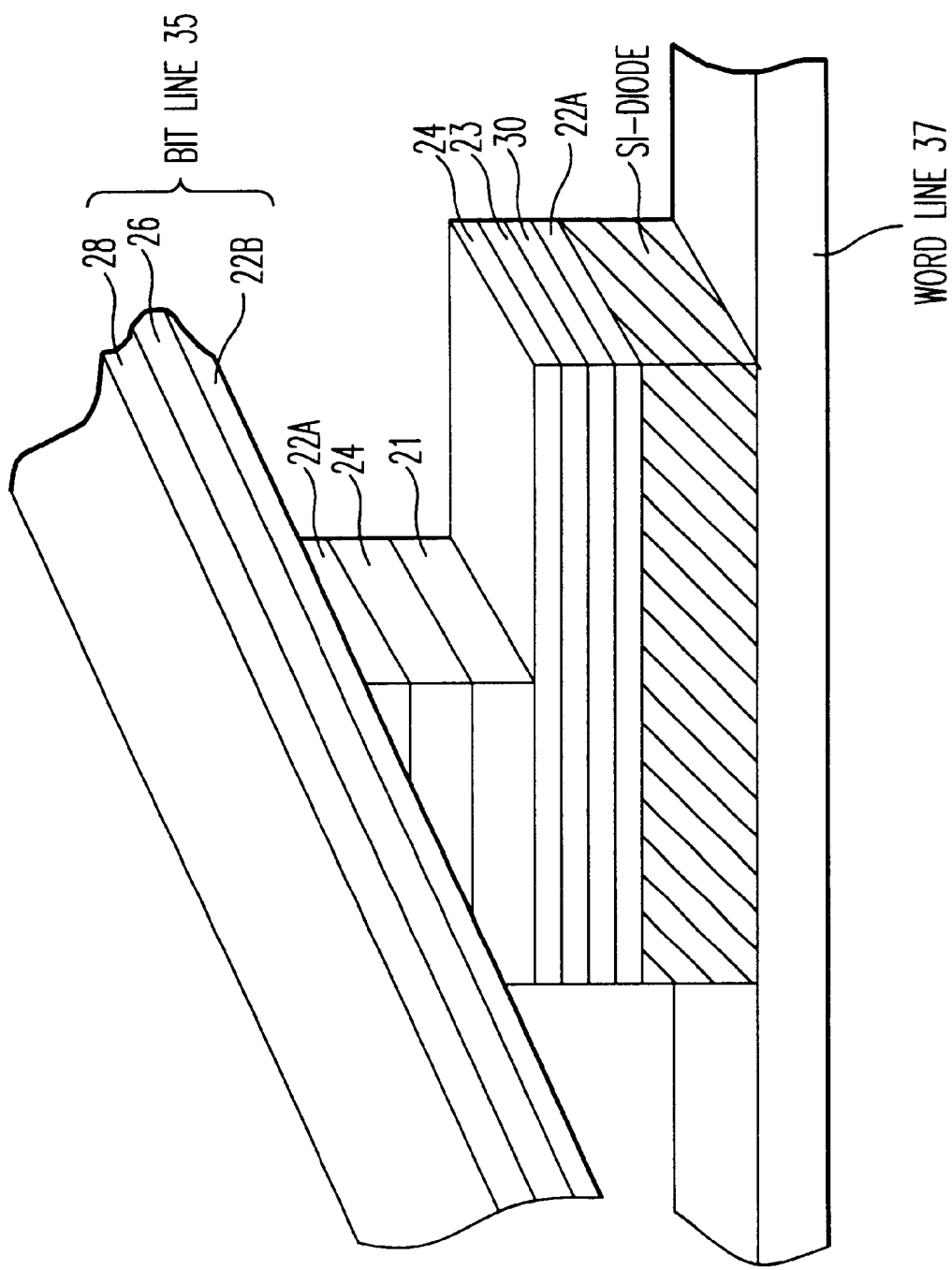
FIG. 22 is a sectional view showing a magnetic memory device as the sixth embodiment according to the first aspect of the present invention.

The magnetic element explained above with reference to FIGS. 20 and 21 is connected to a CMOS field effect transistor; now the magnetic element (cell) explained below with reference to FIG. 22 (perspective view) is connected to a diode.

The cell is connected to a silicon diode in the region where the word line and bit line intersect each other. The application of current magnetic field to the cells and the arrangement of the cells in array are the same as explained above with reference to FIG. 20, except that the CMOS field effect transistor has been replaced by the silicon diode. Therefore, their detailed description is omitted.

Figure 23A:
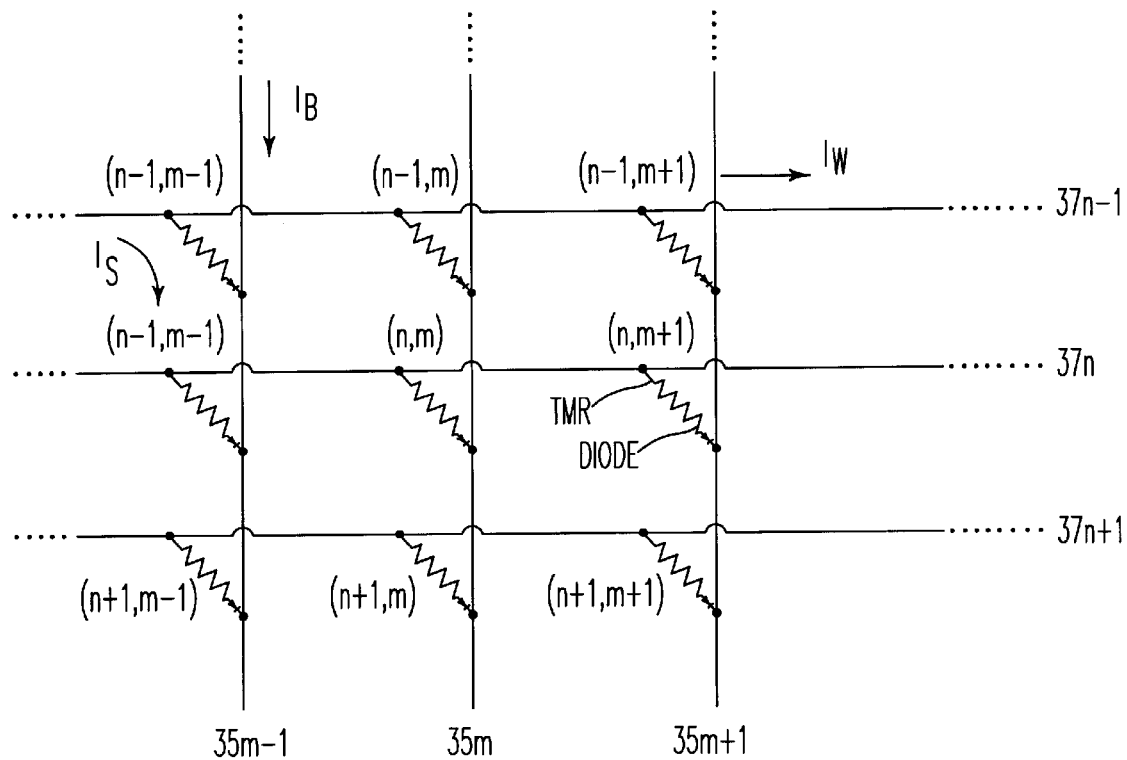
FIGS. 23A and 23B are circuit diagrams of a magnetic memory device as the sixth embodiment according to the first aspect of the present invention.
Figure 23B:
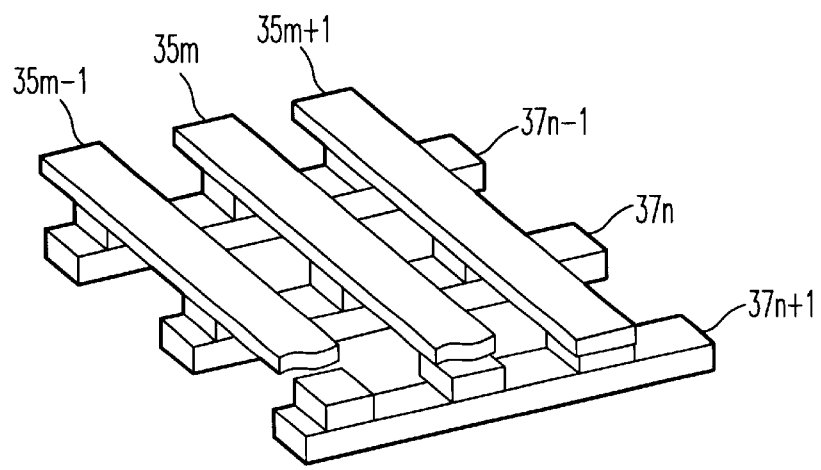

FIG. 23A is the circuit diagram of the magnetic memory elements used in conjunction with diodes. FIG. 23B is a perspective view showing the memory elements arranged in matrix. In FIG. 23A, Is denotes sense current, Ib denotes bit line current, and Iw denotes word line current.

EXAMPLES

The examples of the invention will be described below together with the results of their evaluation.

Example 1

This example demonstrates a ferromagnetic tunnel junction (double tunnel junction), which is formed on an Si/SiO$_2$ substrate or SiO$_2$ substrate by using a sputtering apparatus and a metal mask.

First, film for the lower ferromagnetic electrode 41 (0.1 mm wide) was formed in a magnetic field. This film is composed of Fe (11 nm thick) and Co$_{80}$Pt$_{20}$ (2 nm thick). Then, bias etching (with the metal mask replaced) was performed on the surface oxide film of the lower electrode 41. The laminate film 42 was formed alternate sputtering from Al$_2$O$_3$ and Co$_{80}$Pt$_{20}$ as the targets. The laminate film 42 is composed of Al$_2$O$_3$ (1.5 nm thick), Co$_{80}$Pt$_{20}$—Al$_2$O$_3$ mixed layer (1.7–3.2 nm thick), and Al$_2$O$_3$ (2.5 nm thick).

While the Co$_{80}$Pt$_{20}$ film was being formed, a substrate bias of 400 W was applied. The substrate bias permits the Co$_{80}$Pt$_{20}$—Al$_2$O$_3$ mixed layer to be made flat even though the Co$_{80}$Pt$_{20}$ film is thicker than 2 nm. In addition, the substrate bias makes it possible to obtain the CoPt—Al$_2$O$_3$ mixed layer (composed of a ferromagnetic matrix and Al$_2$O$_3$ dispersed therein) as shown in FIGS. 2A to 2C. Thus the substrate bias contributes to the rate of change of MR.

Subsequently, with the metal mask replaced, the upper ferromagnetic electrode 43 was formed, which is a Co$_{90}$Fe$_{10}$ film (30 nm thick). Each film was formed by sputtering in argon at 2×10$^{-3}$ Torr.

In this way there was obtained a square double tunnel junction, 100 μm$^2$, composed of Fe/Co$_{80}$Pt$_{20}$/(Al$_2$O$_3$/CoPt—Al$_2$O$_3$/Al$_2$O$_3$)/Co$_9$Fe. The CoPt—Al$_2$O$_3$ mixed layer (which is the ferromagnetic-dielectric mixed layer) was found to have the structure as shown in FIGS. 2A to 2C in response to the thickness of Co$_{80}$Pt$_{20}$ which ranges from 1.7 to 3.2 nm.

It was found that forming the lower ferromagnetic electrode in a magnetic field so as to impart uniaxial anisotropy also imparts uniaxial anisotropy to the upper CoPt—Al$_2$O$_3$ mixed layer and the upper ferromagnetic electrode (Co$_9$Fe) owing to its effective magnetic field (static magnetic field).

Figure 24:
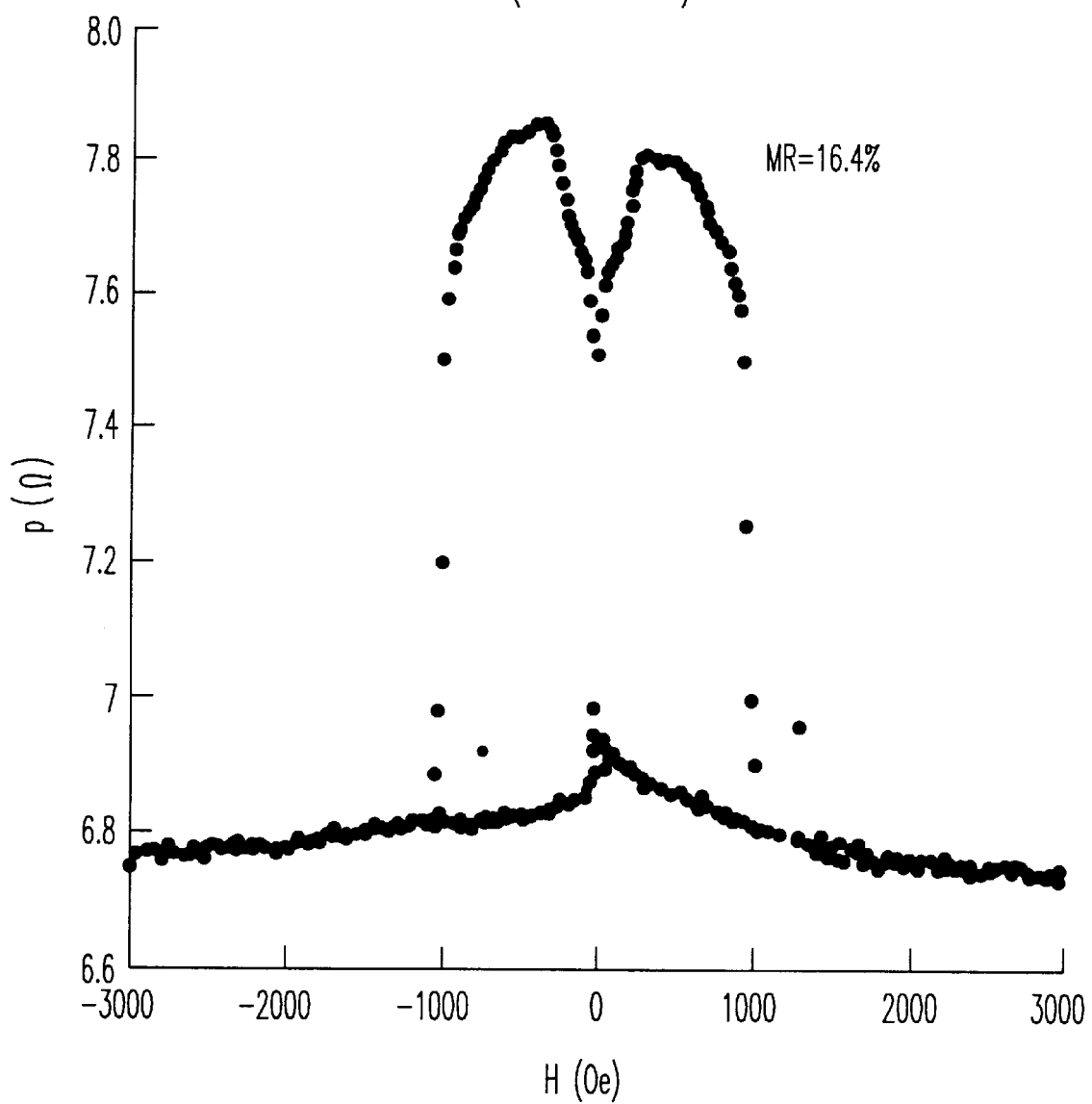
FIG. 24 is a graph showing the curve of magnetoresistance effect of the magnetic element in Example 1 according to the first aspect of the present invention.
Figure 25:
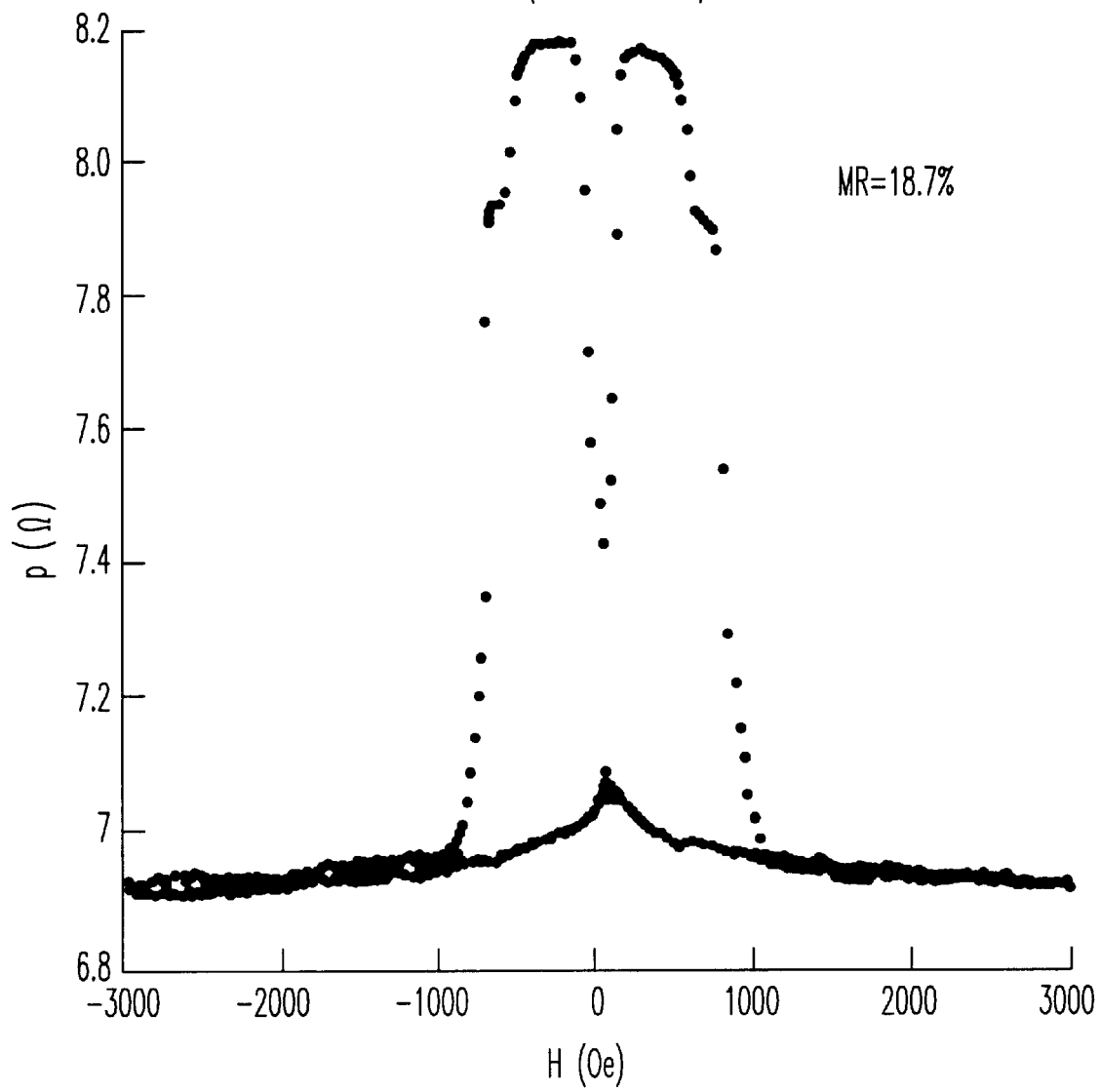
FIG. 25 is a graph showing the curve of magnetoresistance effect of the magnetic element in Example 1 according to the first aspect of the present invention.
Figure 26:
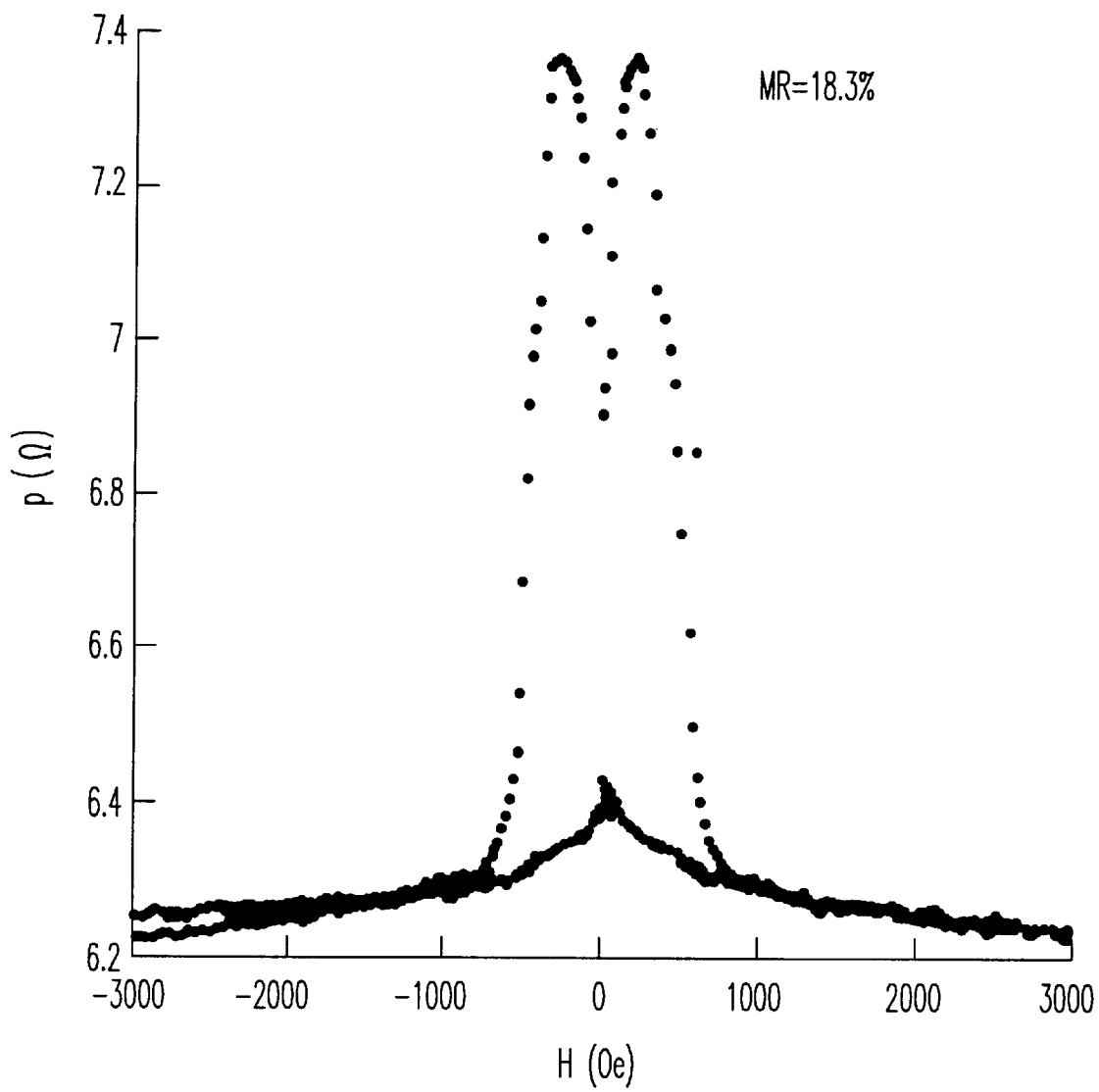
FIG. 26 is a graph showing the curve of magnetoresistance effect of the magnetic element in Example 1 according to the first aspect of the present invention.
Figure 27:
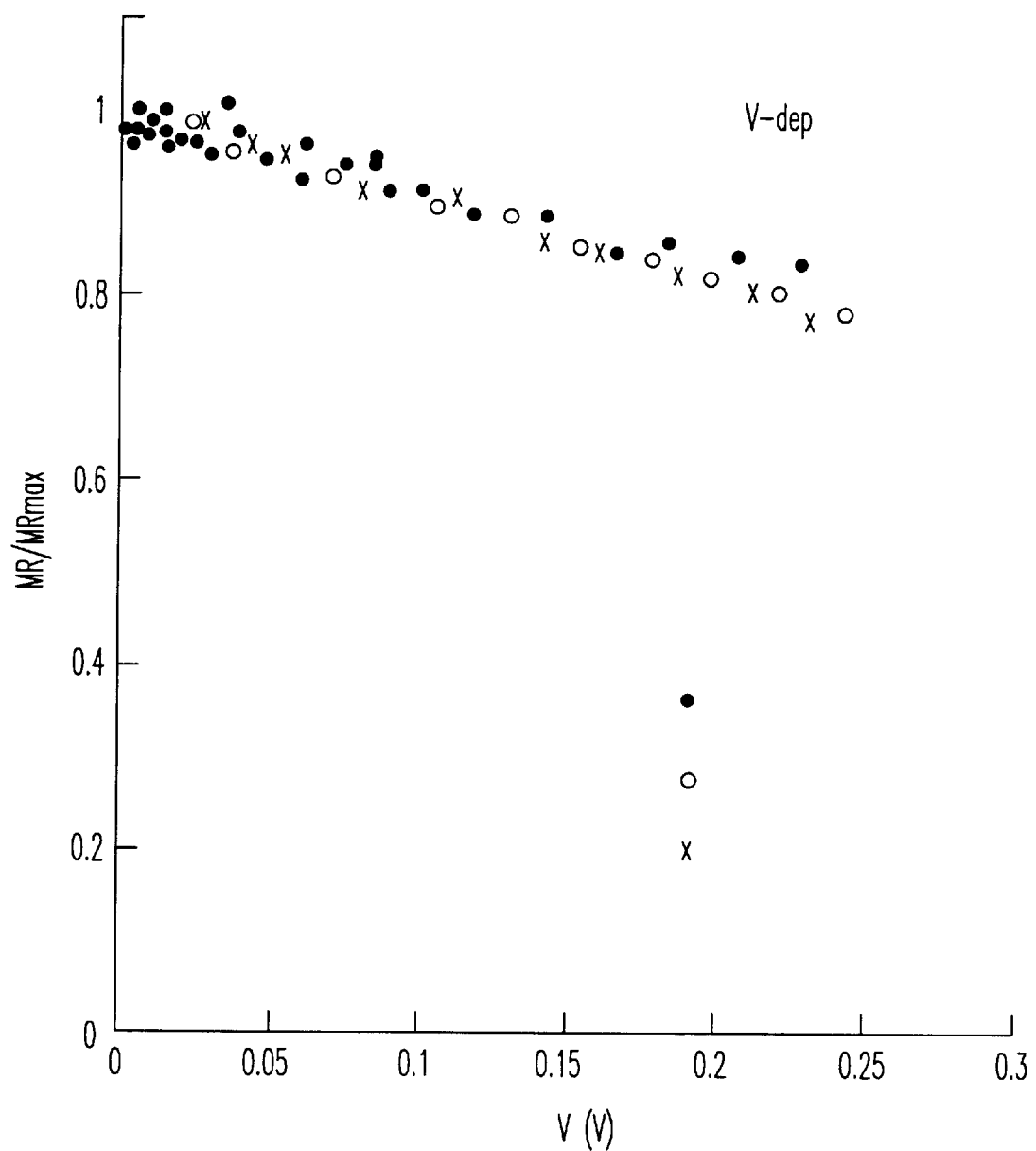
FIG. 27 is a graph showing how the normalized magnetoresistance changes depending on the applied voltage in the magnetic element in Example 1 according to the first aspect of the present invention.

The resulting magnetic element was tested for Kerr effect. As the result, a two-step hysteresis curve was observed which represents difference in coercive force as the superposition of the hysteresis curve of CoPt (with a large coercive force) and the hysteresis curve of Fe/Co$_{80}$Pt$_{20}$ and Co$_9$Fe (with a comparatively small coercive force). The magnetoresistance effect curve of each sample is shown in FIGS. 24, 25, and 26, and the dependence of element voltage on applied current is shown in FIG. 27. FIG. 24 represents the element in which the CoPt—Al$_2$O$_3$ mixed layer has the film structure as shown in FIG. 2A. FIG. 25 represents the element in which the CoPt—Al$_2$O$_3$ mixed layer has the film structure as shown in FIG. 2B. FIG. 26 represents the element in which the CoPt—Al$_2$O$_3$ mixed layer has the film structure as shown in FIG. 2C.

The resistance of the element is one to two orders of magnitude smaller than that of the ordinary single-tunnel junction formed from aluminum by plasma oxidation. Hence the rate of change of MR is large. The degree of decrease in the rate of change of magnetoresistance due to voltage dependence is smaller by half than the ordinary single tunnel junction. Therefore, magnetoresistance decreases less when current is applied to give a desired voltage change. These results suggest that the double tunnel junction in this example is effective as the magnetoresistance effect head, magnetic field sensor, and magnetic memory element.

The magnetoresistance effect curve shown in FIGS. 24, 25, and 26 indicate that Fe and Co$_9$Fe steeply change in magnetoresistance in a magnetic field as small as tens of Oe. This characteristic property is desirable for the magnetoresistance effect head, magnetic field sensor, and magnetic memory element.

Similar results as mentioned above were also obtained when the dielectric material was replaced by any of SiO$_2$, AlN, MgO, Bi$_2$O$_3$, MgF$_2$, and CaF$_2$.

Example 2

The procedure of film forming was repeated under the same conditions as in Example 1. First, a laminate film composed of Ni$_{80}$Fe$_{10}$ (10 nm thick) and Co$_8$Pt$_2$ (10 nm thick) was formed on a thermally-oxidized silicon substrate by sputtering with a metal mask. This laminate film serves as the lower electrode. Then a laminate film composed of SiO$_2$, CoPt—SiO$_2$, and SiO$_2$ was formed from Co$_{80}$Pt$_{20}$ and SiO$_2$ as the targets. Finally, a laminate film composed of Co$_{90}$Fe$_{10}$ and Ni$_{80}$Fe$_{20}$ was formed, which serves as the upper electrode.

There was obtained a square double tunnel junction, 100 μm$^2$, composed of Ni$_{80}$Fe$_{20}$/Co$_{80}$Pt$_{20}$/(SiO$_2$/Co$_{80}$Pt$_{20}$—SiO$_2$/SiO$_2$)/Co$_{90}$Fe$_{10}$/Ni$_{80}$Fe$_{20}$. The ferromagnetic-dielectric mixed layer was found to be constructed as shown in FIG. 2B.

The resulting magnetic element was tested for Kerr effect. As the result, a two-step hysteresis curve was observed which represents difference in coercive force as the superposition of the hysteresis curve of Co$_{80}$Pt$_{20}$—SiO$_2$ mixed layer (with a large coercive force) and the hysteresis curve of Ni$_{80}$Fe$_{20}$/Co$_{80}$Pt$_{20}$ and Co$_{90}$Fe$_{10}$/Ni$_{80}$Fe$_{20}$ (with a comparatively small coercive force). The magnetoresistance effect curve of this sample is shown in FIG. 28, and the dependence on applied current of the normalized rate of change of magnetoresistance is shown in FIG. 29.

The resistance of the element is one to two orders of magnitude smaller than that of the ordinary single-tunnel junction. Hence the rate of change of MR is large. The degree of decrease in the rate of change of magnetoresistance due to voltage dependence is smaller by half than the ordinary single tunnel junction. Therefore, magnetoresistance decreases less when current is applied to give a desired voltage change. These results suggest that the double tunnel junction in this example is effective as the magnetoresistance effect head, magnetic field sensor, and magnetic memory element.

Figure 28:
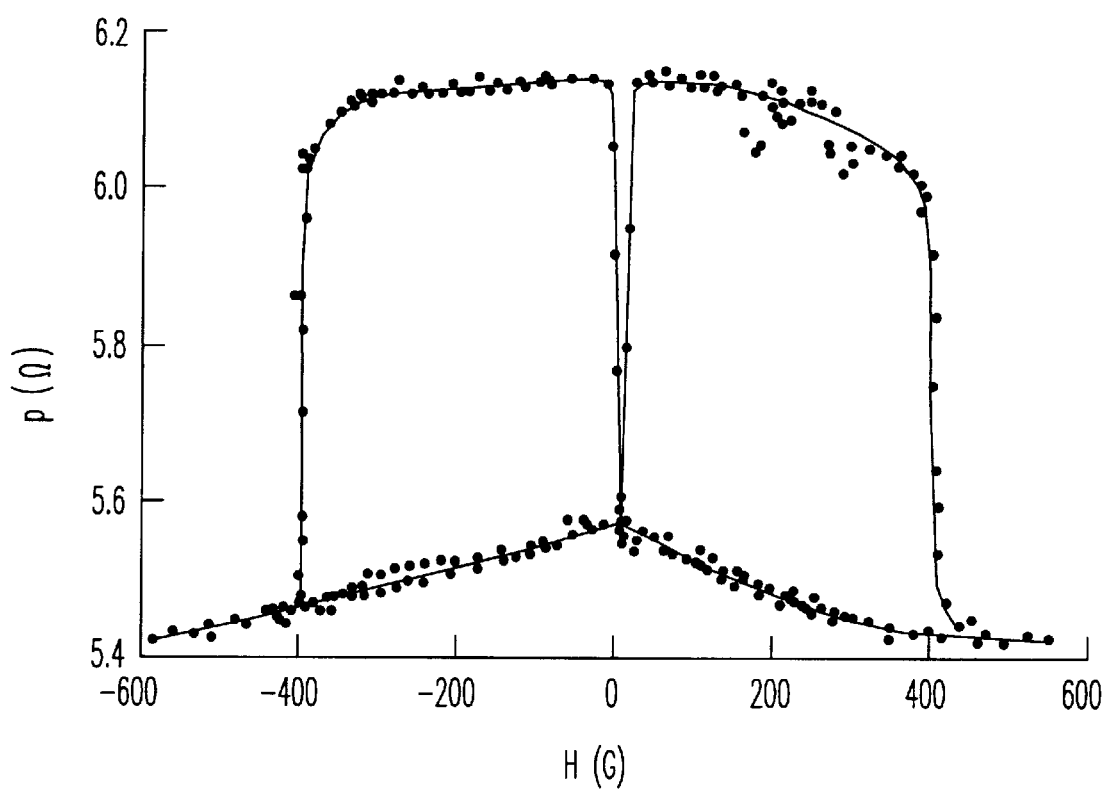
FIG. 28 is a graph showing the curve of magnetoresistance effect of the magnetic element in Example 2 according to the first aspect of the present invention.
Figure 29:
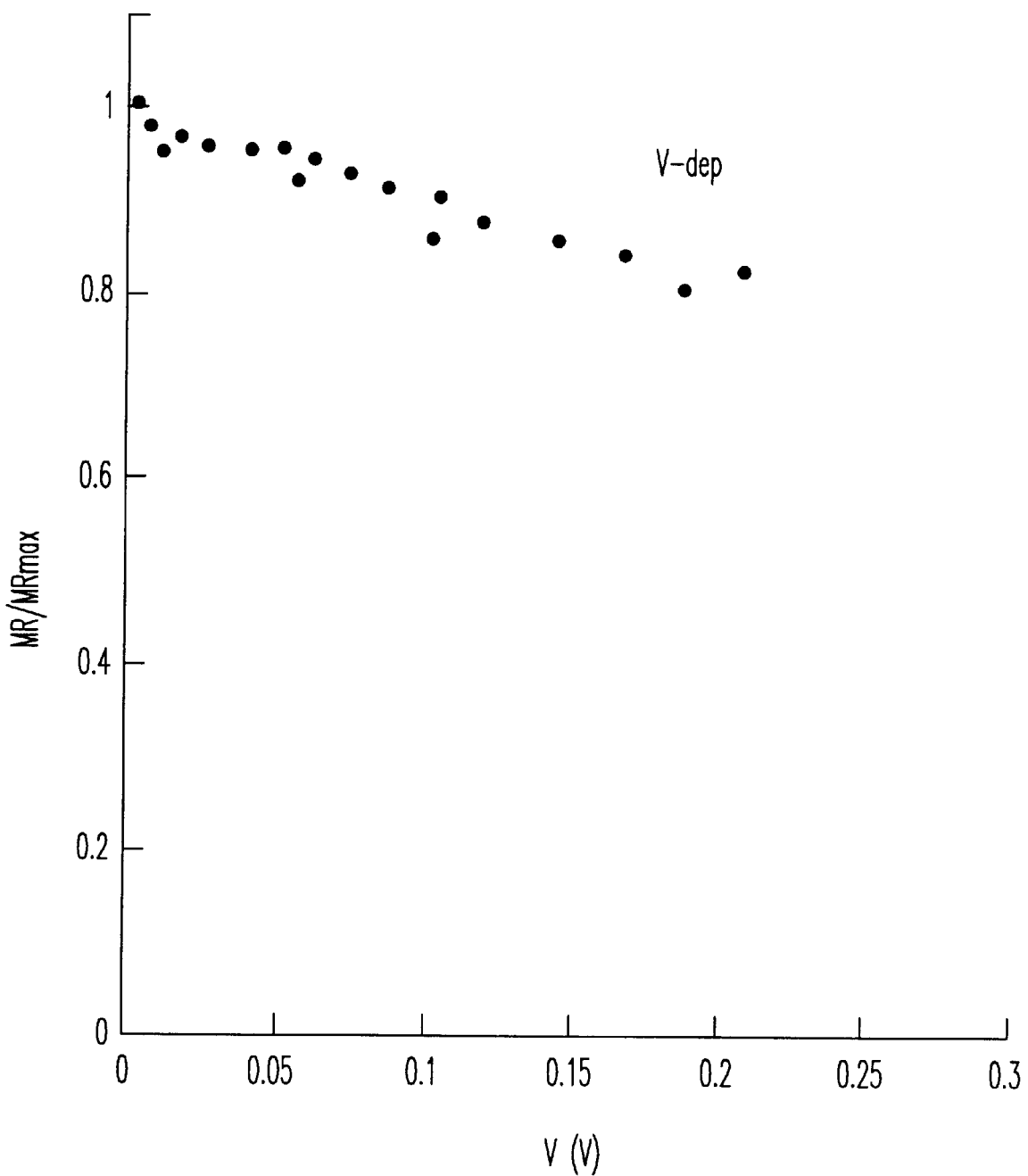
FIG. 29 is a graph showing how the normalized magnetoresistance changes depending on the applied voltage in the magnetic element in Example 2 according to the first aspect of the present invention.

The magnetoresistance effect curve in FIG. 28 indicates that $Ni_{80}Fe_{20}/Co_{80}Pt_{20}$ and $Co_{90}Fe_{10}/Ni_{80}Fe_{20}$ steeply change in magnetoresistance in a magnetic field as small as about 7 Oe. This characteristic property is desirable for the magnetoresistance effect head, magnetic field sensor, and magnetic memory element.

Similar results as mentioned above were also obtained when the dielectric material was replaced by any of $Al_2O_3$, AlN, MgO, $Bi_2O_3$, $MgF_2$, and $CaF_2$.

Example 3

This example demonstrates an element constructed as shown in FIG. 6. This element is formed on a thermally oxidized silicon substrate by sputtering with a metal mask and a micropattern formed by lift-off technique.

First, a thermally oxidized silicon substrate, with a metal mask placed thereon, was subjected to sputtering with $Fe_{30}Co_{50}Pt_{20}$ and $Al_2O_3$ targets alternately. During sputtering for the $Fe_{30}Co_{50}Pt_{20}$ film, a bias of 400 W was applied. There was obtained a square laminate film composed of $SiO_2/Fe_{30}Co_{50}Pt_{20}$—$SiO_2/SiO_2$ with an area of 100 $\mu m^2$. The ferromagnetic-dielectric mixed layer was found to be constructed as shown in FIG. 2A. The procedure of film forming was carried out under the same conditions as in Example 1.

On the mixed layer was formed a laminate film composed of $Co/Ni_{80}Fe_{20}/Au$, which serves as the upper ferromagnetic electrode. This film underwent resist patterning through a chromium mask and then ion etching to form a gap of 2-$\mu m$ (the distance between the electrode 11 and the electrode 15. There was obtained an element with a junction as shown in FIG. 6. Finally, this element was heat-treated at 200° C. in a magnetic field so as to impart uniaxial anisotropy.

Figure 30:
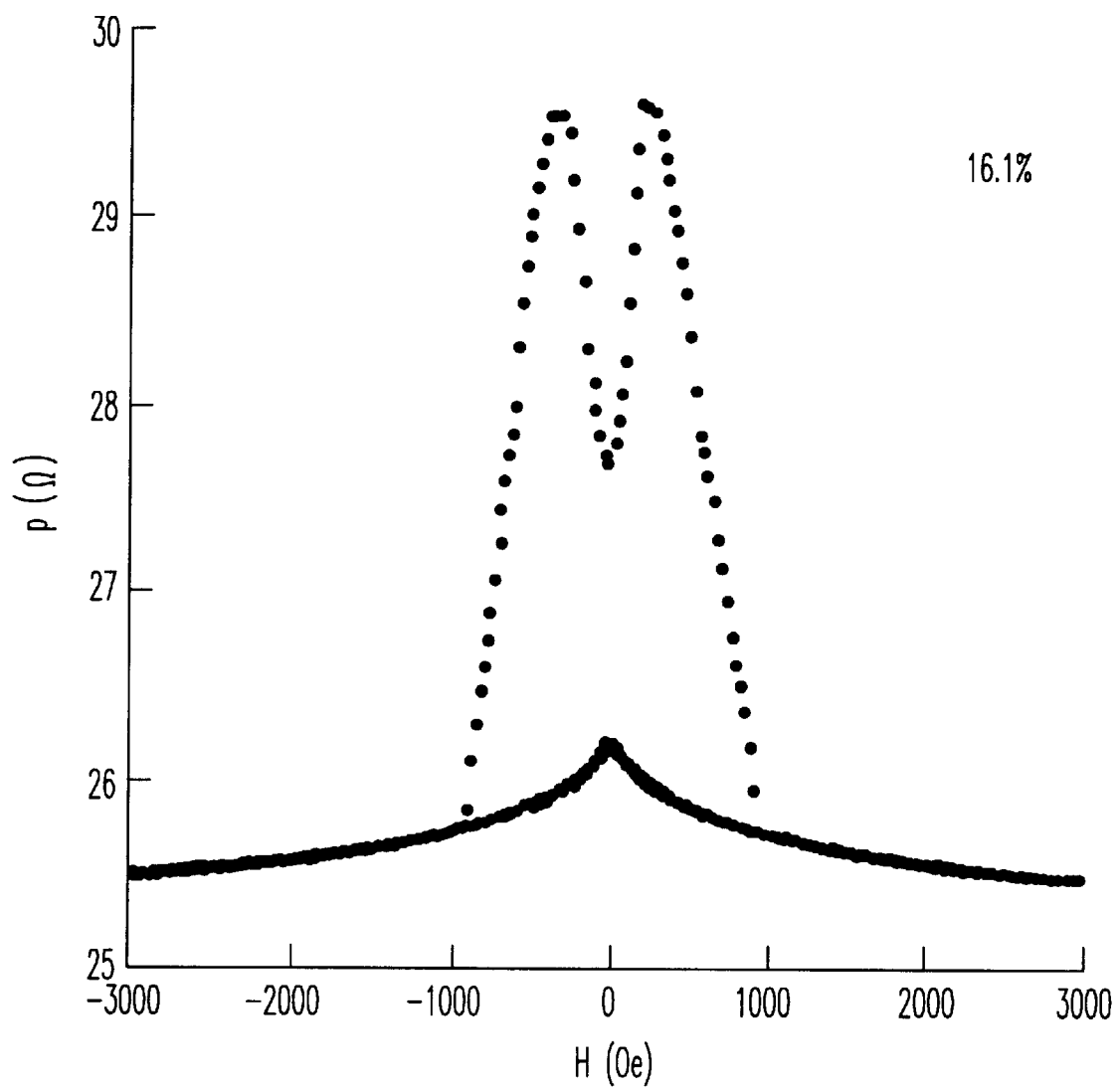
FIG. 30 is a graph showing the curve of magnetoresistance effect of the magnetic element in Example 3 according to the first aspect of the present invention.
Figure 31:
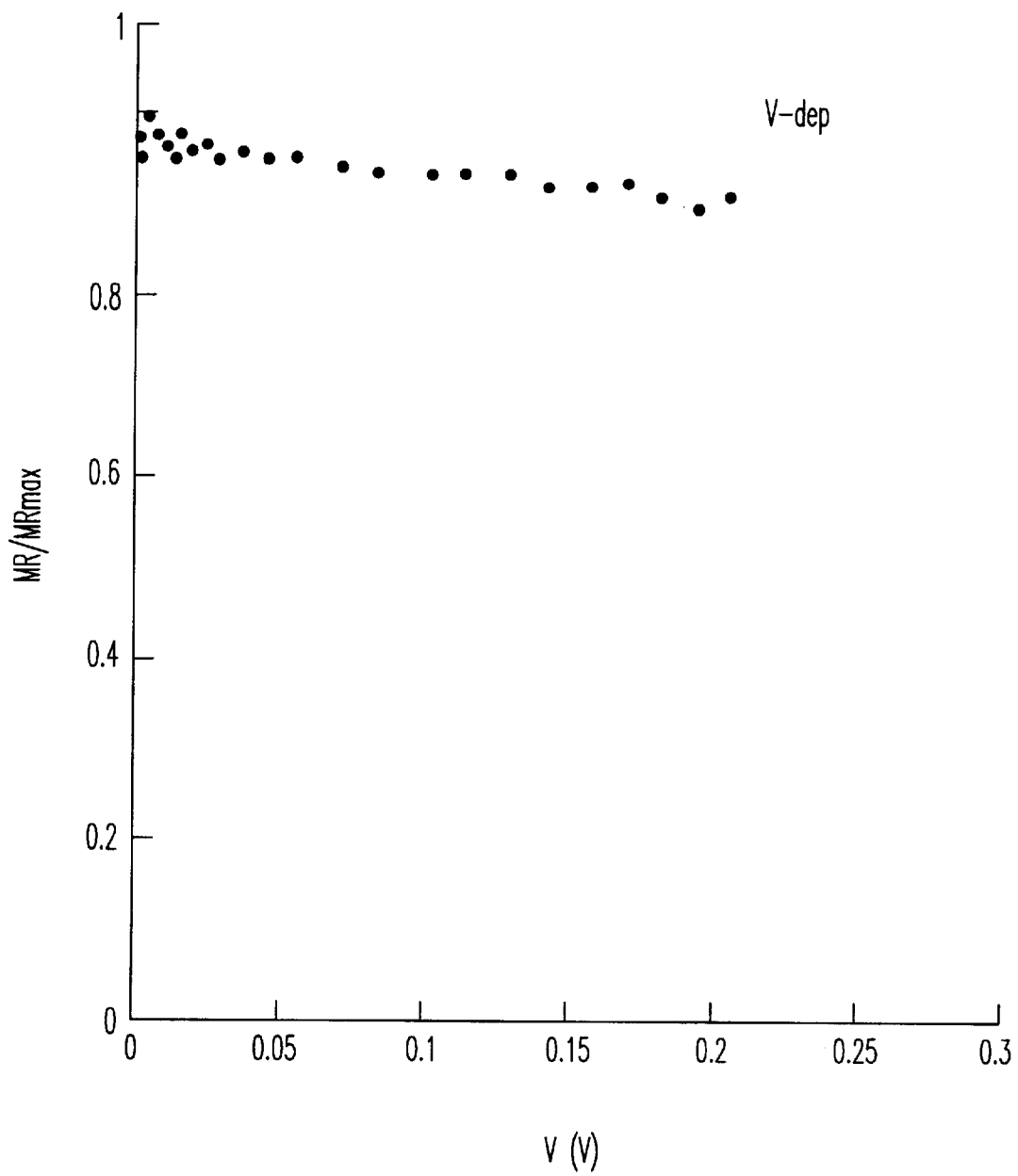
FIG. 31 is a graph showing how the normalized magnetoresistance changes depending on the applied voltage in the magnetic element in Example 3 according to the first aspect of the present invention.

The resulting element gave the magnetoresistance effect curve as shown in FIG. 30 and also gave the dependence of voltage on applied current as shown in FIG. 31. The resistance of the element is about one order of magnitude smaller than that of the ordinary single-tunnel junction. Hence the rate of change of MR is large. The degree of decrease in the rate of change of magnetoresistance due to voltage dependence is smaller by half than the ordinary single tunnel junction. Therefore, magnetoresistance decreases less when current is applied to give a desired voltage change. These results suggest that the double tunnel junction in this example is effective as the magnetoresistance effect head, magnetic field sensor, and magnetic memory element.

The magnetoresistance effect curve shown in FIG. 30 indicates that $Co/Ni_{80}Fe_{20}$ layer steeply change in magnetoresistance in a magnetic field as small as about 6 Oe. This characteristic property is desirable for the magnetoresistance effect head, magnetic field sensor, and magnetic memory element.

Similar results as mentioned above were also obtained when the dielectric material was replaced by any of $SiO_2$, AlN, MgO, $Bi_2O_3$, $MgF_2$, and $CaF_2$.

Example 4

On a thermally oxidized silicon substrate, with a metal mask placed thereon, was formed a laminate film composed of Pt—Mn (20 nm thick) and $Co_{90}Fe_{10}$ (10 nm thick) by sputtering in argon at $2\times 10^{-3}$ Torr. On the laminate film was performed additional sputtering with $Co_{90}Fe_{10}$ and $Al_2O_3$ targets alternately and with $Ni_{81}Fe_{19}$ and $Al_2O_3$ targets alternately. Other conditions for sputtering are the same as in Example 1. The second sputtering gave a laminate film composed of $Al_2O_3/Co_{90}Fe_{10}$—$Al_2O_3/Al_2O_3$ and a laminate film composed of $Al_2O_3/Ni_{81}Fe_{19}$—$Al_2O_3/Al_2O_3$. Another laminate film composed of Co (5 nm thick) and Pt—Mn (20 nm thick) was formed on them.

In this way there was obtained a square element (100 $\mu m^2$) with a double tunnel junction, as shown in FIG. 10. The sample underwent heat-treatment at 300° C. in a magnetic field so that it was given unidirectional anisotropy and uniaxial anisotropy.

Figure 32:
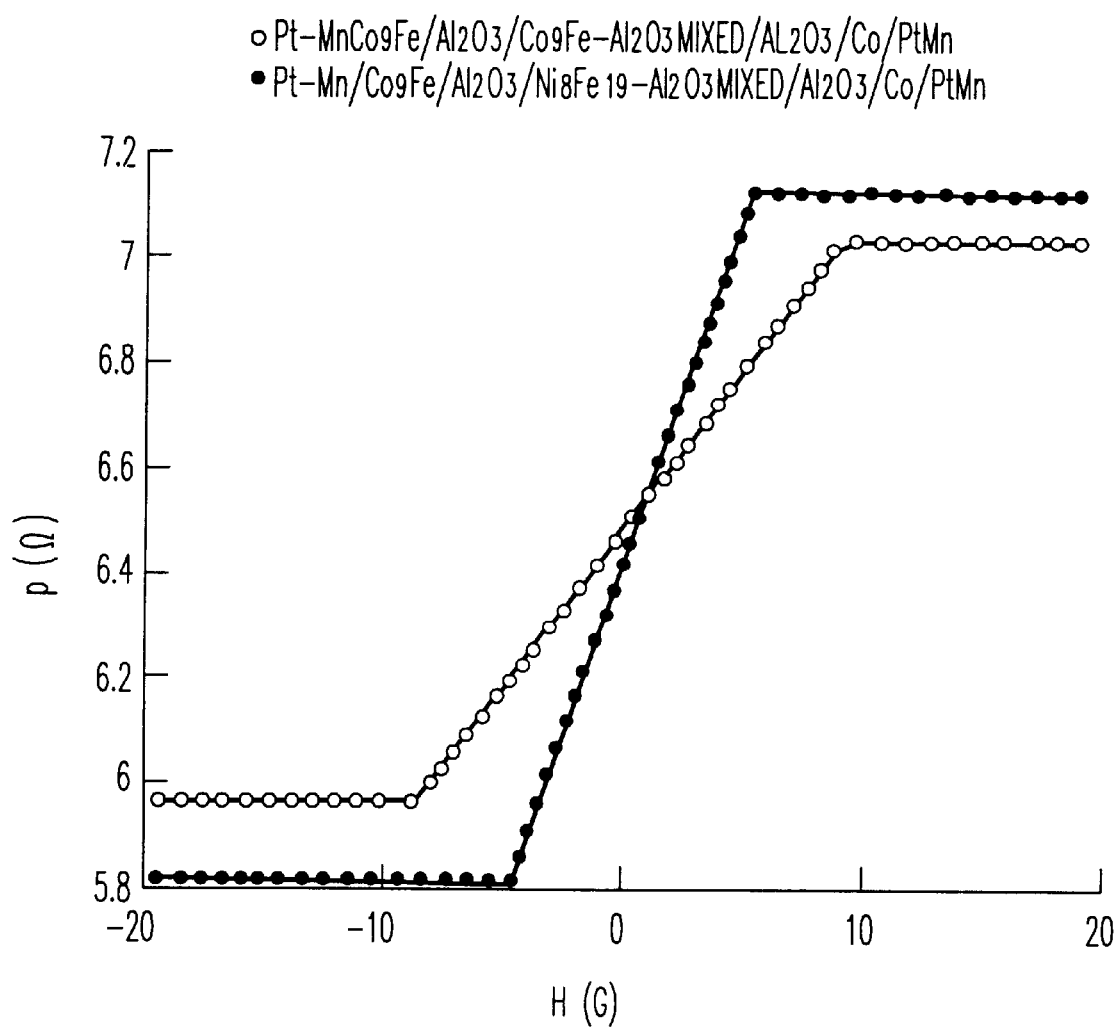
FIG. 32 is a graph showing the curve of magnetoresistance effect of the magnetic element in Example 4 according to the first aspect of the present invention.
Figure 33:
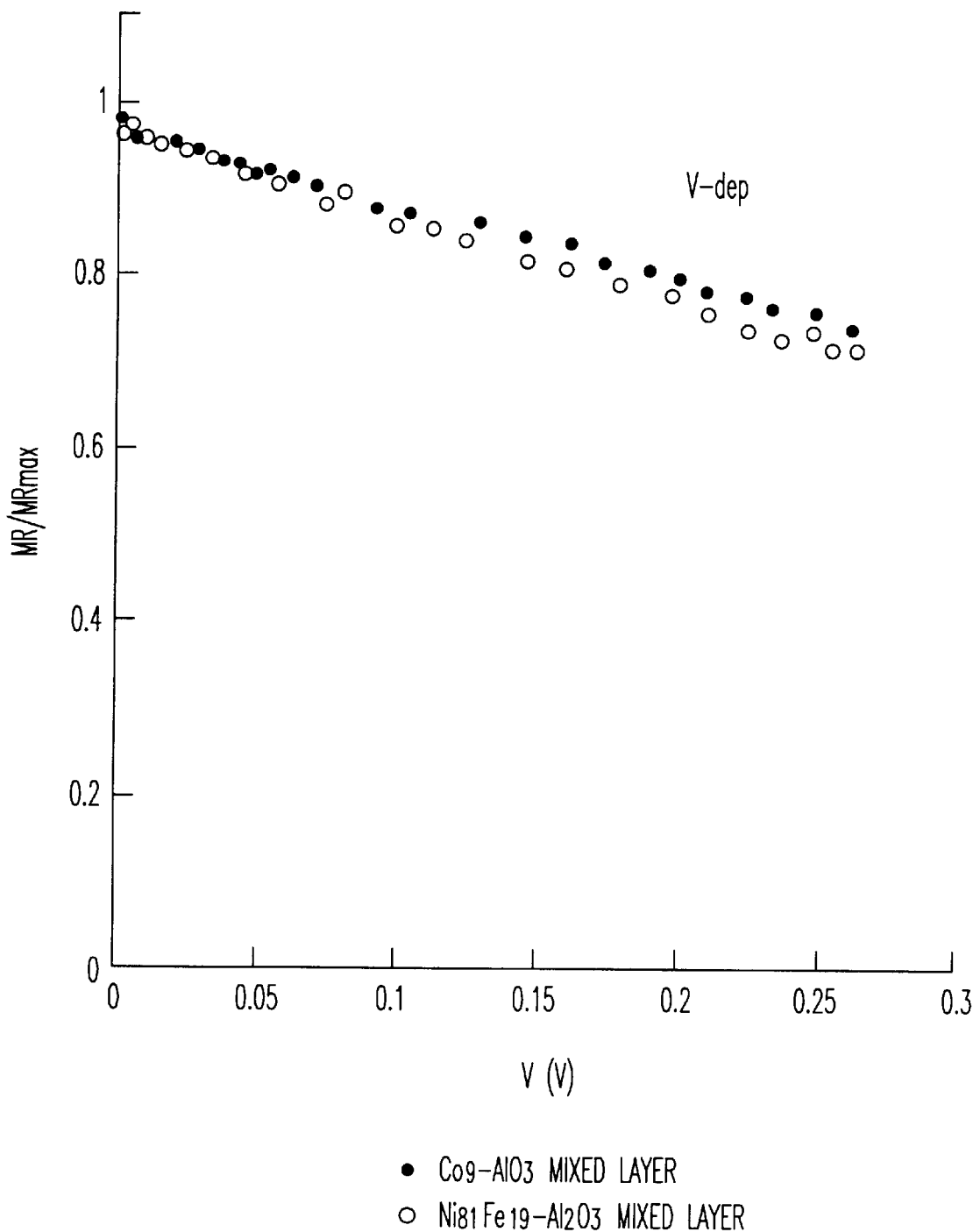
FIG. 33 is a graph showing how the normalized magnetoresistance changes depending on the applied voltage in the magnetic element in Example 4 according to the first aspect of the present invention.

The resulting element gave the rate of change in magnetoresistance as shown in FIG. 32 and also gave the dependence of voltage on applied current as shown in FIG. 33. The resistance of the element is about one to two orders of magnitude smaller than that of the ordinary single-tunnel junction. Hence the rate of change of MR is large. The degree of decrease in the rate of change of magnetoresistance due to voltage dependence is smaller by half to one-third than the ordinary single-tunnel junction. Therefore, magnetoresistance decreases less when current is applied to give a desired voltage change. These results suggest that the double tunnel junction in this example is effective as the magnetoresistance effect head, magnetic field sensor, and magnetic memory element.

The magnetoresistance effect curve shown in FIG. 32 indicates that $Co_\pi Fe_{10}$ layer and $Ni_{81}Fe_{19}$ layer steeply change in magnetoresistance in a magnetic field as small as about 90 Oe and 5.5 Oe, respectively. This characteristic property is desirable for the magnetoresistance effect head, magnetic field sensor, and magnetic memory element.

Similar results as mentioned above were also obtained when the dielectric material was replaced by any of $SiO_2$, AlN, MgO, $Bi_2O_3$, $MgF_2$, and $CaF_2$.

Example 5

On a thermally oxidized silicon substrate, with a metal mask placed thereon, was formed by sputtering a square multiple tunnel junction (100 $\mu m^2$) whose layer construction is specified in Table 1. Each sample was tested for the rate of change of magnetoresistance and element resistance. The results are shown in Table 1. Each element was prepared in the same manner as in Example 1.

TABLE 1

| Sample | Structure of ferromagnetic-dielectric mixed layer | Resistance of element (Ω) (Zero magnetic field) | Rate of change of MR (%) |
|---|---|---|---|
| $Ni_{81}Fe_{19}$ (10 nm)/Co (5 nm)/AlN (1.5 nm)/ $Co_{80}Pd_{20}$ - AlN mixed layer/AlN (1.9 nm)/CoFe (5 nm)/$Ni_{81}Fe_{19}$ (15 nm) | FIG. 2B | 6.7 | 17 |
| $Ir_2Mn_8$ (15 nm)/$Ni_8Fe_2$ (5 nm)/CoFe (1 nm)/$Al_2O_3$ (1.2 nm)/$Ni_5Fe_3Co_2$ - $Al_2O_3$ mixed layer/$Al_2O_3$ (1.5 nm)/CoFe (1 nm)/ $Ni_8Fe_2$(7 nm)/$Ir_2Mn_8$ (15 nm) | FIG. 2C | 5.1 | 19 |
| NiMnSb (20 nm)/$SiO_2$ (1.5 nm)/$Co_9Pt_1$ - $SiO_2$ mixed layer/$SiO_2$ (1.5 nm)/ CoFe (5 nm)/$Ni_{81}Fe_{19}$ (15 nm) | FIG. 2A | 4.2 | 21 |
| FeMn (20 nm)/CoFe (5 nm)/$Al_2O_3$ (1.2 nm)/ $Co_9Fe$ - $Al_2O_3$ mixed layer/$Al_2O_3$ (1.4 nm)/ CoFe (5 nm)/IrCrMn (20 nm) | FIG. 2A | 4.7 | 18 |
| $Ir_2Mn_8$ (15 nm)/CoFe (14 nm)/$Al_2O_3$ (1.3 nm)/ $Ni_{81}Fe_{19}$ - $Al_2O_3$ mixed layer/$Al_2O_3$ (1.5 nm)/CoFe (10 nm)/$Ir_2Mn_8$ (15 nm) | FIG. 2B | 6.3 | 15 |
| $Ni_8Fe_2$ (20 nm)/CoFe (2 nm)/$SiO_2$ (1.5 nm)/ $CrO_2$ - $SiO_2$ mixed layer/ $SiO_2$ (1.5 nm)/CoFe (5 nm)/ $Ni_{81}Fe_{19}$ (15 nm) | FIG. 2C | 5.2 | 11 |
| FeMn (20 nm)/CoFeNi (5 nm)/$Al_2O_3$ (1.2 nm)/ $Co_9Fe$ - $Ni_8Fe_2$ - $Al_2O_3$ mixed layer/ $Al_2O_3$ (1.4 nm)/CoFeNi (5 nm)/IrCrMn (20 nm) | FIG. 2A | 6.2 | 19 |

The resistance of the element is about one to two orders of magnitude smaller than that of the ordinary single-tunnel junction. Hence the rate of change of MR is large. The degree of decrease in the rate of change of magnetoresistance due to voltage dependence is smaller by half than the ordinary single tunnel junction. Therefore, magnetoresistance decreases less when current is applied to give a desired voltage change. These results suggest that the multiple tunnel junction in this example is effective as the magnetoresistance effect head, magnetic field sensor, and magnetic memory element. The large MR value and low resistance are desirable for the magnetoresistance effect head, magnetic field sensor, and magnetic memory element.

Example 6

Figure 34:
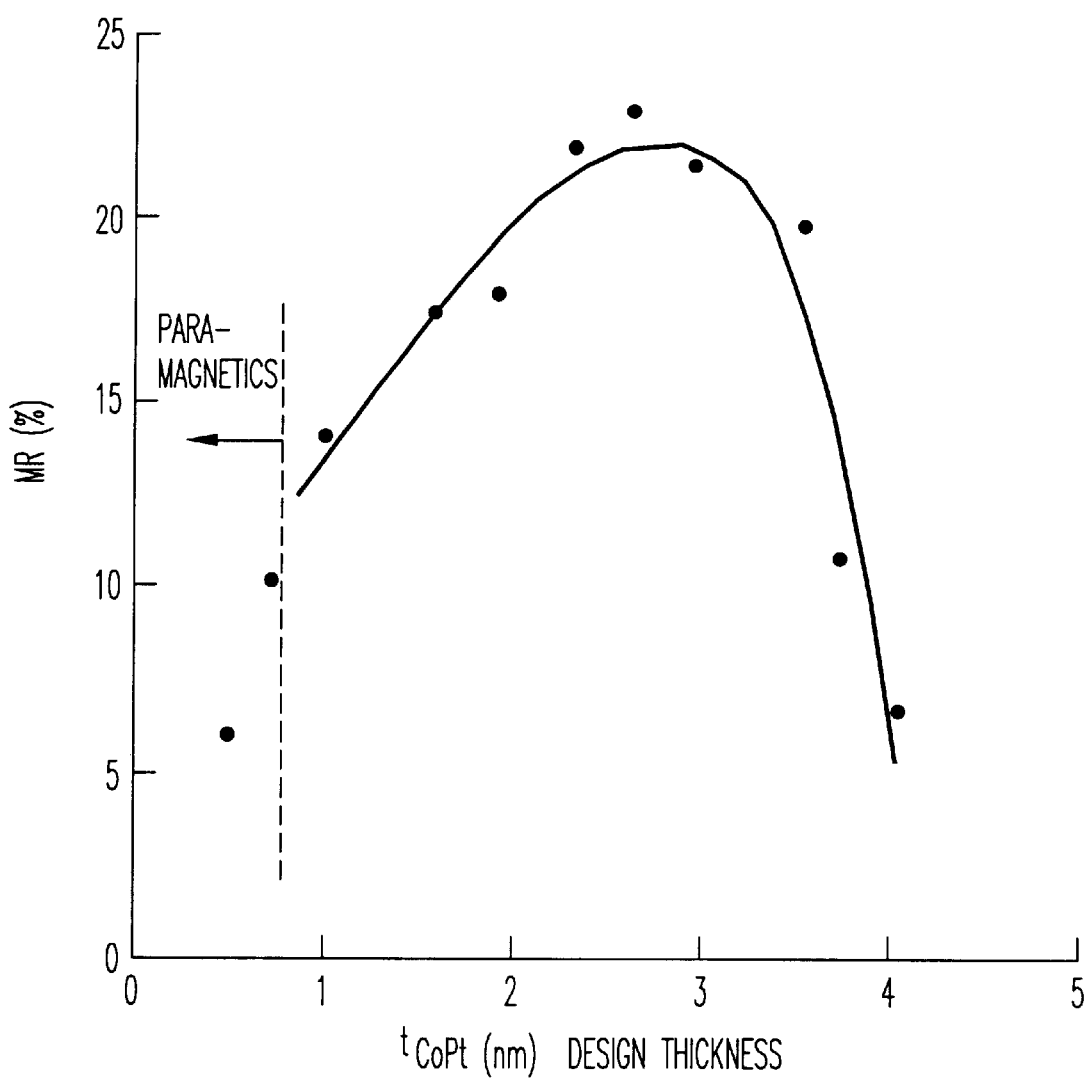
FIG. 34 is a graph showing the curve of magnetoresistance effect that is observed when the thickness of the mixed layer is changed in the magnetic element in Example 6 according to the first aspect of the present invention.

On a thermally oxidized silicon substrate, with a metal mask placed thereon, was formed by sputtering a square double tunnel junction (100 $\mu m^2$) composed of $Ni_{80}Fe_{20}$/ $Co_{90}Fe_{10}$/$Al_2O_3$ (1.5 nm)/CoPt—$Al_2O_3$ (t nm)/$Al_2O_3$ (2 nm)/$Co_{90}Fe_{10}$/$Ni_{80}Fe_{20}$. Several samples were prepared in the same way as in Example 1, with the thickness of the ferromagnetic-dielectric mixed layer varied. They were tested for how the rate of change of magnetoresistance changes depending on the thickness of the ferromagnetic-dielectric mixed layer. The results are shown in FIG. 34. The resistance of the element is about one to two orders of magnitude smaller than that of the ordinary single-tunnel junction. Hence the rate of change of MR is large. The degree of decrease in the rate of change of magnetoresistance due to voltage dependence is smaller by half than the ordinary single tunnel junction. Therefore, magnetoresistance decreases less when current is applied to give a desired voltage change. These results suggest that the double tunnel junction in this example is effective as the magnetoresistance effect head, magnetic field sensor, and magnetic memory element.

When the ferromagnetic-dielectric mixed layer is thinner than 3.5 nm, the quantum level is formed in the ferromagnetic matrix (thin ferromagnetic material in the ferromagnetic-dielectric mixed layer). The fluctuating spin, with magnon excited in the ferromagnetic electrode, does not tunnel easily through this quantum level. This prevents the rate of change of MR from decreasing further due to excitation of magnon. This suggests that the element has a large MR value and a low resistance, which are desirable for the magnetoresistance effect head, magnetic field sensor, and magnetic memory element.

Example 7

On the principal plane of a silicon substrate was formed a silicon oxide film. On this silicon oxide film was formed a Ta underlying film. On this underlying film were formed sequentially by sputtering a ferromagnetic electrode layer 22 of NiFe/CoFe, a dielectric tunnel barrier layer 24 of Al$_2$O$_3$, a mixed layer 21 of CoFe—Al$_2$O$_3$, and an antiferromagnetic film 26 of IrMn. The layer structure is sectionally shown in FIG. 19. Finally, a Ta protective film was formed on the IrMn film 26.

The resulting laminate film was fabricated into 50-μm wide line by the known photolithography and ion milling technique, with the initial vacuum being 2×10$^7$ Torr. Thus there were obtained a magnetic element A (of this example) and a magnetic element B (of comparative example). Their layer structure is as follows.

A: Ta (5 nm)/NiFe (15 nm)/CoFe (5 nm)/Al$_2$O$_3$ (1.8 nm)/ CoFe—Al$_2$O$_3$ (4 nm) /Ir$_{22}$Mn$_{78}$ (18 nm)/Ta (5 nm)

B: Ta (5 nm)/NiFe (15 nm)/CoFe (5 nm)/Al$_2$O$_3$ (1.8 nm)/ CoFe (3 nm)/Ir$_{22}$Mn$_{78}$ (18 nm)/Ta (5 nm)

The tunnel barrier layer 24 was formed successively on the CeFe layer by using an aluminum target in a vacuum, with pure argon being introduced, and then oxidizing the aluminum in a plasma, with oxygen being introduced without the vacuum being broken (or the system is not opened to the atmosphere) Subsequently, the mixed layer 21 (4 nm) was formed with application of RF bias such that CeFe grows at a rate of 3 nm and Al$_2$O$_3$ grows at a rate of 1 nm. Consequently, the resulting mixed film is rich in CoFe. Finally, the antiferromagnetic film 26 of IrMn was formed by sputtering in pure argon with a partial pressure of 1×10$^3$ Torr.

The resulting laminate film was given a Ta protective film. On this protective film was formed a resist pattern defining the dimensions of the tunnel junction by the known photolithography and ion milling technique. Using this resist pattern as a mask, the layer of CeFe—Al$_2$O$_3$ (4 nm)/ Ir$_{22}$Mn$_{78}$ (18 nm)/Ta (5 nm) was processed. With this resist pattern unremoved, an interlayer insulating film of Al$_2$O$_3$ (300 nm thick) was formed by electron beam deposition. The resist pattern was removed by lift-off. Another resist pattern was formed for the upper wiring. The substrate surface was cleaned by reverse sputtering, and then an aluminum wiring was formed. The substrate, with the above-mentioned laminate film formed thereon, was heat-treated in a magnetic field so as to introduce a unidirectional anisotropy into the pinned layer.

Figure 35:
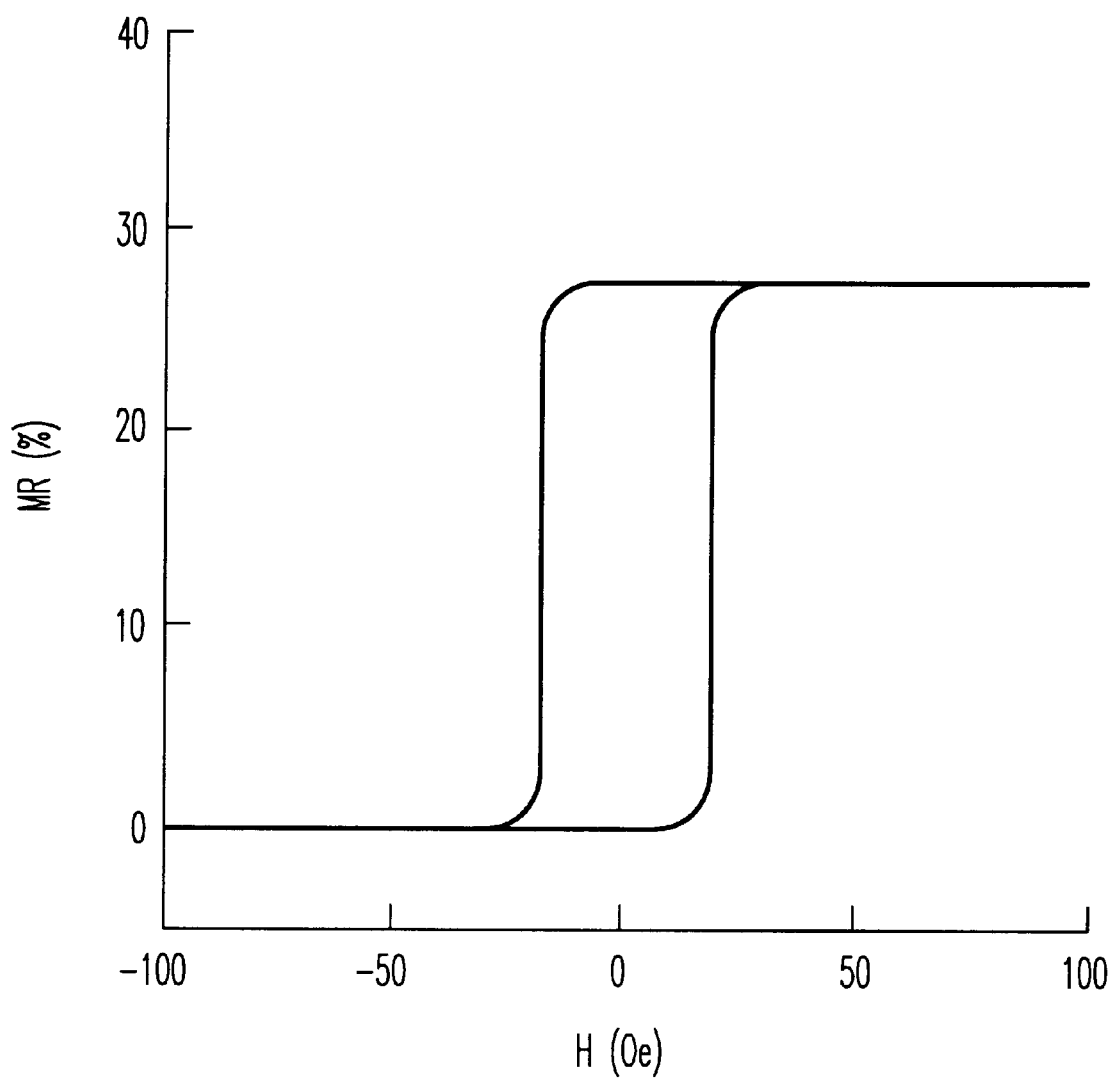
FIG. 35 is a graph showing the curve of magnetoresistance effect of the magnetic element in Example 7 according to the first aspect of the present invention.

Element A gave the magnetoresistance effect curve as shown in FIG. 35, which was obtained by plotting the rate of change in magnetoresistance MR (in %) against the applied magnetic field H (Oe). It is noted that the magnetoresistance steeply changes with a magnetic field as small as about 17 Oe. This is also observed in elements in which the dielectric tunnel layer contains SiO$_2$, AlN, or MgO.

Figure 36:
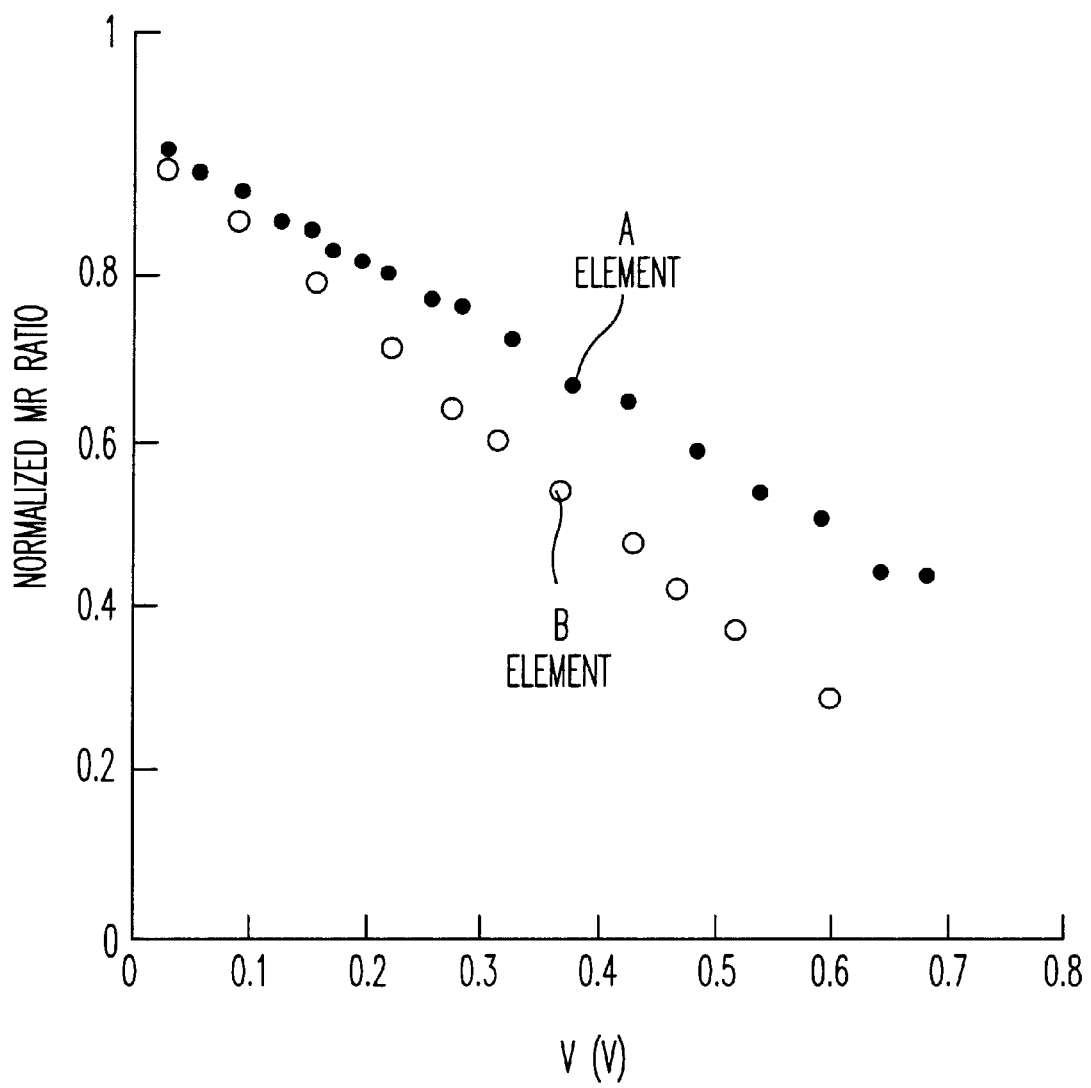
FIG. 36 is a graph showing the relation between the applied voltage and the normalized magnetoresistance change in the magnetic element in Example 7 according to the first aspect of the present invention.

FIG. 36 shows the relation between the applied voltage V (V) and the normalized MR ratio for element A and element B. Element A is smaller than element B in the degree of decrease in magnetoresistance due to change in applied voltage. In other words, element A decreases only a little in magnetoresistance when a prescribed voltage is applied to make the output voltage to change as desired.

Example 8

On the principal plane of a silicon substrate was formed a silicon oxide film. On this silicon oxide film was formed a Ta underlying film (50 nm). On this underlying film was formed a laminate film with double tunnel junction which is composed of FeMn (20 nm)/NiFe (5 nm)/CeFe (3 nm)/ Al$_2$O$_3$ (1.8 nm)/Co$_9$Fe—Al$_2$O$_3$ (3.5 nm)/Al$_2$O$_3$ (2.5 nm)/ CoFe (3 nm)/NiFe (5 nm)/FeMn (20 nm). The layer structure is shown in FIG. 18. Finally, a Ta protective film (5 nm) was formed on the laminate film. The resulting laminate film was fabricated into 50-μm wide line in the same way as in Example 7. Incidentally, the Co$_9$Fe—Al$_2$O$_3$ mixed line was formed in the same way as in Example 7.

The Al$_2$O$_3$ tunnel barrier layer was formed by using an aluminum target in a vacuum, with pure argon being introduced, and then exposing the aluminum film to pure oxygen, without the vacuum being broken. The resulting tunnel barrier layer is thin and free of oxygen defects.

A resist pattern defining the area of tunnel junction was formed on the laminate film of CoFe (3 nm)/NiFe (5 nm)/FeMn (20 nm)/Ta (50 nm) in the same way as in Example 7. Ion milling was performed until the Co$_9$Fe layer was reached. With this resist pattern unremoved, an interlayer insulating film of Al$_2$O$_3$ (300 nm thick) was formed by electron beam deposition. The resist pattern was removed by lift-off. Another resist pattern was formed for the upper wiring. The substrate surface was cleaned by reverse sputtering, and then an aluminum wiring was formed. The substrate was heat-treated in a magnetic field so as to introduce a unidirectional anisotropy into the pinned layer. Thus there was obtained a magnetic element.

Figure 37:
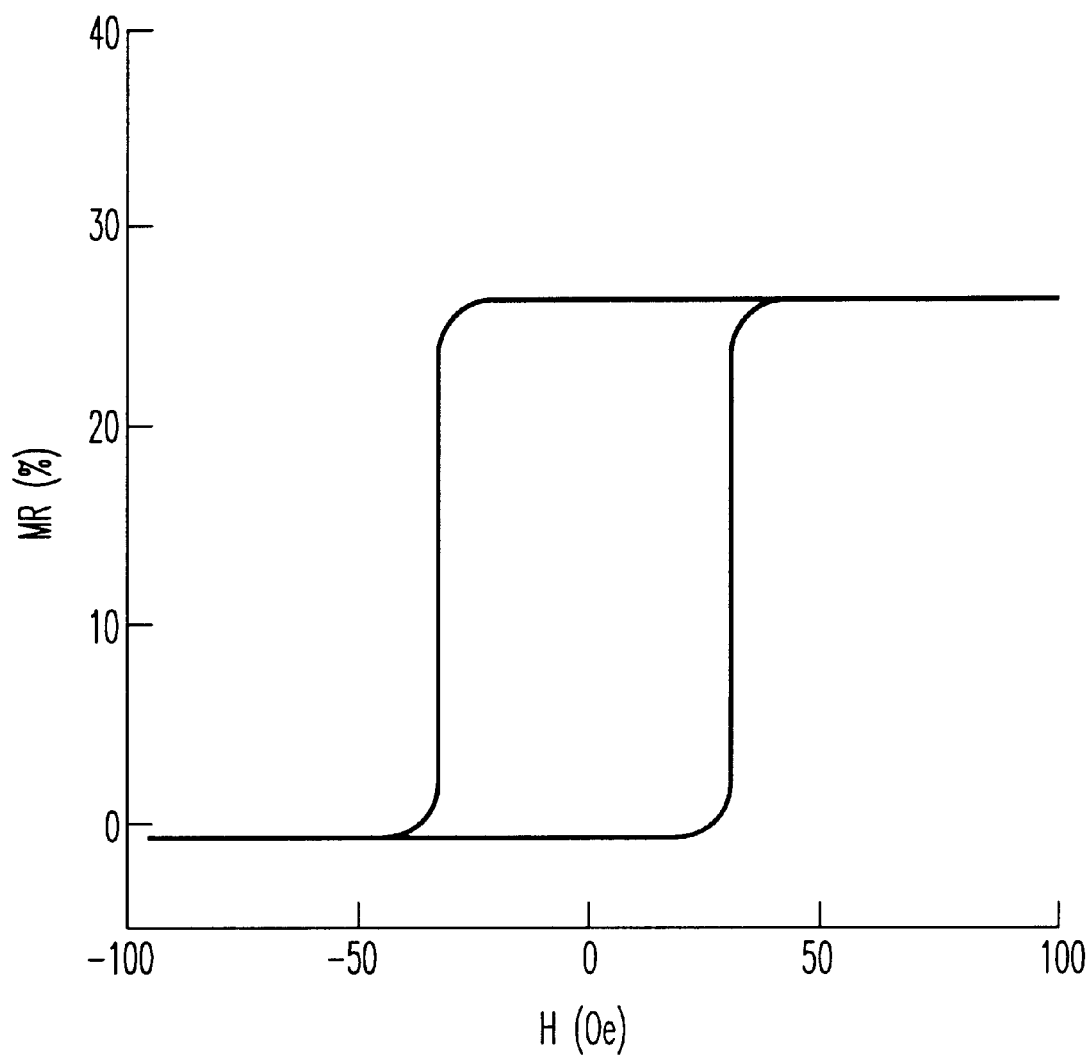
FIG. 37 is a graph showing the curve of magnetoresistance effect of the magnetic element in Example 8 according to the first aspect of the present invention.
Figure 38:
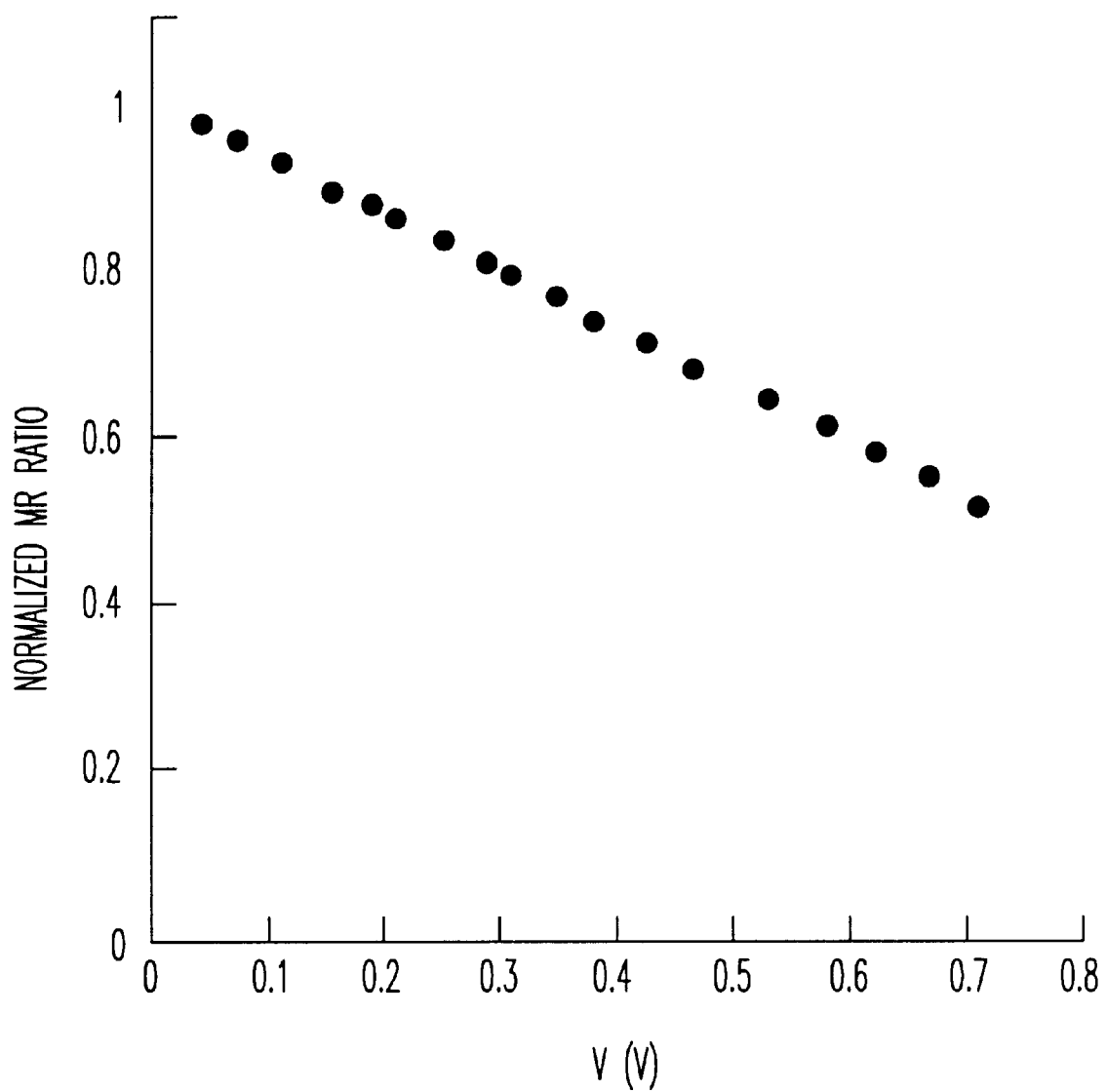
FIG. 38 is a graph showing the relation between the applied voltage and the normalized magnetoresistance change in the magnetic element in Example 8 according to the first aspect of the present invention.

This magnetic element gave the magnetoresistance effect curve as shown in FIG. 37, which was obtained by plotting the rate of change in magnetoresistance MR (in %) against the applied magnetic field H (Oe). FIG. 38 shows the relation between the applied voltage V (V) and the normalized MR ratio. The resistance of the element is one to two orders of magnitude smaller than that obtained by the ordinary plasma oxidation. Hence the rate of change in MR is large. The degree of decrease in the rate of change of magnetoresistance due to voltage dependence is smaller by half than the ordinary single tunnel junction. Therefore, magnetoresistance decreases less when current is applied to give a desired voltage change. These results suggest effective use as the magnetoresistance effect head, magnetic field sensor, and magnetic memory element. FIG. 37 shows that the Ce$_9$Fe—Al$_2$O$_3$ mixed layer steeply changes in magnetoresistance in a magnetic field as small as about 30 Oe. This characteristic property is desirable for the magnetoresistance effect head, magnetic field sensor, and magnetic memory element. Incidentally, similar results as mentioned above were also obtained when the dielectric material was replaced by any of SiO$_2$, AlN, and MgO.

Example 9

On a thermally oxidized silicon substrate was formed by sputtering a square laminate film (100 μm$^2$) whose layer structure is specified in Table 2. In Table 2, the laminate film Nos. 1 to 5 has a single tunnel junction and the laminate film Nos. 6 to 11 has a double tunnel junction.

Each sample was tested for the rate of change of magnetoresistance (in %) and the voltage$_{1/2}$ (V) at which the rate of change of magnetoresistance is halved. The results are shown in Table 2. The materials constituting each layer differ from those used in Example 1; however, the procedure for film making is the same as in Example 1.

TABLE 2

((*nm): film thickness as designed)

| No. | Sample | MR (%) | V$_{1/2}$ (V) |
|---|---|---|---|
| 1 | Ta (5 nm)/Ni$_{80}$Fe$_{20}$ (10 nm)/Co$_9$Fe (2 nm)/SiO$_2$ (1.7 nm)/Co$_9$ Fe (3 nm) - SiO$_2$ (0.5 nm) mixed layer/PtMn (20 nm)/Ta (5 nm) | 15.3 | 0.61 |

TABLE 2-continued ((*nm): film thickness as designed)

| No. | Sample | MR (%) | $V_{1/2}$ (V) |
|---|---|---|---|
| 2 | Ti (7 nm)/Pd (3 nm)/FeMn (14 nm)/Ni$_5$Co$_3$Fe$_2$ (4 nm) - AlN$_x$ (1 nm) mixed layer - AlN (2 nm)/CoFe (9 nm)/Ta (7 nm) | 18.2 | 0.6 |
| 3 | Ti (5 nm)/ Pt (5 nm)/NiMn (18 nm)/CoFe (5 nm) - Al$_2$O$_3$ (2 nm) mixed layer/Al$_2$O$_3$ (2 nm)/Co$_4$Fe$_6$ (7 nm)/Ta (5 nm) | 27 | 0.59 |
| 4 | Ta (4 nm)/Ni$_{83}$Fe$_{17}$ (15 nm)/AlN (2.5 nm)/ CoFe (2.5 nm) - AlN$_x$ (0.5 nm) mixed layer/ Ir$_{21.5}$Mn$_{78.5}$ (9 nm)/Ta (5 nm) | 16.1 | 0.56 |
| 5 | Ta (4 nm)/Co$_{85}$Ni$_{15}$ (10 nm)/MgO (1.5 nm)/ Co$_7$Fe$_2$Ni (2 nm) - MgO$_x$ (0.3 nm) mixed layer/ NiMn (20 nm)/Pt (4 nm) | 14.1 | 0.57 |
| 6 | Ta (5 nm)/Pt (5 nm)/PtMn (17 nm)/ Co$_9$Fe$_1$ (3 nm)/AlN (2 nm)/Fe$_{55}$Co$_{45}$ (5 nm) - AlN (0.2 nm) mixed layer/AlN (2.6 nm)/ Co$_8$FeNi (3 nm)/PtMn (19 nm)/Ta (5 nm) | 23.3 | 0.75 |
| 7 | Ti (5 nm)/Pt (5 nm)/Ir$_{22}$Mn$_{78}$ (15 nm)/CoFeNi (3 nm)/Al$_2$O$_3$ (1.6 nm)/Fe$_{65}$Co$_{35}$ (3 nm) - Al$_2$O$_3$ (0.2 nm) mixed layer/Al$_2$O$_3$ (1.9 nm)/ Co$_7$Fe$_2$Ni (5 nm)/Ir$_{22}$Mn$_{78}$ (10 nm)/Ta (5 nm) | 29.8 | 0.81 |
| 8 | Ta (5 nm)/NiMn (19 nm)/CoFe (3 nm)/SiO$_2$ (1.8 nm)/Co (4 nm) - SiO$_x$ (0.5 nm) mixed layer/SiO$_2$ (2.4 nm)/CoFe (5 nm)/NiMn (20 nm)/Ta (3 nm) | 18.9 | 0.74 |
| 9 | Pt (5 nm)/Ir$_{22}$Mn$_{78}$ (15 nm)/CoFeNi (2 nm)/ MgO (1.6 nm)/FeCo$_2$Ni (5 nm) - MgO$_x$ (0.5 nm) mixed layer/MgO (1.7 nm)/CoFeNi/ Ir$_{22}$Mn$_{78}$ (17 nm)/Ta (5 nm) | 15.9 | 0.71 |
| 10 | Ti (5 nm)/Pd (3 nm)/FeMn (17 nm)/CoFeNi$_2$ (2 nm)/Al$_2$O$_3$ (1.6 nm)/Fe$_{65}$Co$_{35}$ (3 nm) - Al$_2$O$_x$ (0.2 nm) mixed layer/Al$_2$O$_3$ (2.1 nm)/ Co$_7$Fe$_2$Ni (3 nm)/FeMn (20 nm)/Ta (5 nm) | 14.5 | 0.78 |
| 11 | Ta (5 nm)/Ir$_{22}$Mn$_{78}$ (15 nm)/CoFe (3 nm)/ Al$_2$O$_3$ (1.6 nm)/Co$_{90}$Pt$_{10}$ (3 nm) - Al$_2$O$_x$ (0.2 nm) mixed layer/Al$_2$O$_3$ (1.9 nm)/Co$_7$Fe$_2$Ni (4 nm)/Ir$_{22}$Mn$_{78}$ (20 nm)/Ta (5 nm) | 30 | 0.81 |

It is noted that the double tunnel junction has a higher voltage$_{1/2}$ than the single tunnel junction and hence gives a higher rate of change in MR even at a high voltage. The fact that the element decreases in magnetoresistance only a little when it is given a current to produce a desired voltage change means that it greatly changes in magnetoresistance even when it is given a high voltage. Consequently, it is useful as the magnetoresistance effect head, magnetic sensor, and magnetic memory element.

As mentioned above, the magnetic element according to the first aspect of the present invention provides a large rate of change in magnetoresistance with a comparatively low resistance. In addition, the rate of change in magnetoresistance varies little depending on voltage. Therefore, the magnetic element produces a stable output voltage. It is suitable for the magnetoresistance effect head, magnetic sensor, magnetic head assembly, and magnetic recording system designed for high performance and high reliability.

The Seventh Embodiment

Figure 39:
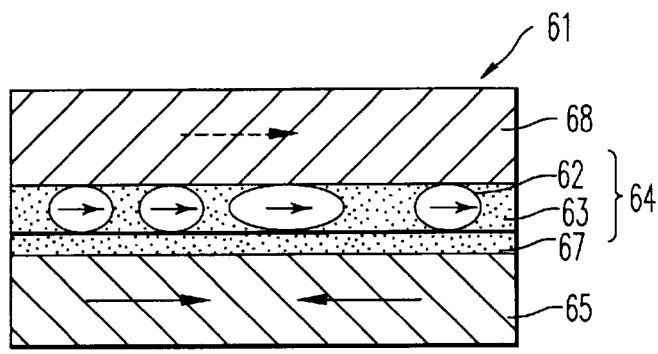
FIG. 39 is a sectional view showing the seventh embodiment according to the second aspect of the present invention.

A magnetic element as the seventh embodiment pertaining to the second aspect of the present invention is schematically shown in section in FIG. 39. The arrows in FIG. 39 denote the direction of magnetization (spin). The magnetic element 61 shown in FIG. 39 has a mixed layer 64 and a pair of electrodes 65 and 66 placed close thereto. The mixed layer 64 is made of a mixture of a ferromagnetic material 62 (having a coercive force) and a dielectric material 63. The ferromagnetic material 62 and the dielectric material 63 may be mixed together in any ratio (by volume).

The electrode 65 is laminated onto the mixed layer 64, with the dielectric layer 67 interposed between them. The other electrode 66 is substantially in contact with the ferromagnetic material 62 in the mixed layer 64. The electrode 65, which is separated from the mixed layer 64 by the dielectric layer 67, is made of a ferromagnetic material. The electrode 65 is not specifically restricted so long as it has a difference in coercive force between it and the mixed layer 64. The other electrode 66 may be made of a ferromagnetic metal or non-magnetic metal.

Figure 40:
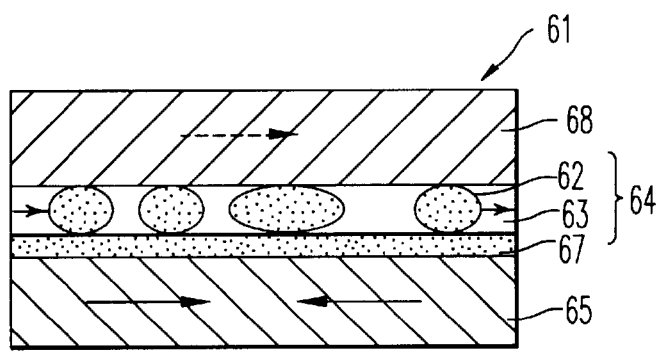
FIG. 40 is a sectional view showing a modified example of the seventh embodiment.

The magnetic element shown in FIG. 39 is constructed such that the mixed layer 64 is composed of the dielectric material 63 as a matrix and the ferromagnetic material 62 dispersed therein. The mixed layer 64 may be constructed differently as shown in FIG. 40. That is, it is composed of the ferromagnetic material 62 as a matrix and the dielectric material 63 dispersed therein. In any case, the ferromagnetic material 62 is one which does not exhibit superparamagnetism and has a finite coercive force. Ideally, it should be one which has its spin aligned in one direction.

Incidentally, a detailed description will be given later of the material constituting the electrodes 65 and 66 and the construction of the mixed layer 64.

The magnetic element 61 shown in FIGS. 39 and 40 is based on the following principle. It is assumed that the electrode 66 is made of a ferromagnetic material and the ferromagnetic electrode 65 has the least coercive force. Incidentally, the electrode 66 may be formed from a non-magnetic material, and which electrode should have a larger or smaller coercive force does not matter.

The magnetic element 61 shown in FIGS. 39 and 40 permits tunnel current to flow if the dielectric layer 67 is adequately thin, when a voltage is applied across the two electrodes 65 and 66. The tunnel current varies in magnitude depending on the angle made by the spin of the ferromagnetic electrodes 65 and 66 and the spin of the mixed layer 64, thereby generating tunnel magnetoresistance. This is the ferromagnetic tunnel effect.

If a large external magnetic field is applied so that all the magnetic materials of the mixed layer 64 and the ferromagnetic electrodes 65 and 66 have their spin aligned in one direction and subsequently the magnitude of the magnetic field is reduced and the sign (or direction) of the magnetic field is reversed, then only the spin of the ferromagnetic electrode 65 is reversed with a magnitude of magnetic field corresponding to the coercive force of the ferromagnetic electrode 65. With the spin reversal of the ferromagnetic electrode 65, tunnel current decreases and resistance increases. This produces the tunnel magnetoresistance. The magnetic layer that undergoes spin reversal by an external magnetic field is not limited to the ferromagnetic electrode 85; it may be the ferromagnetic material 62 in the granular magnetic film 64.

Figure 41:
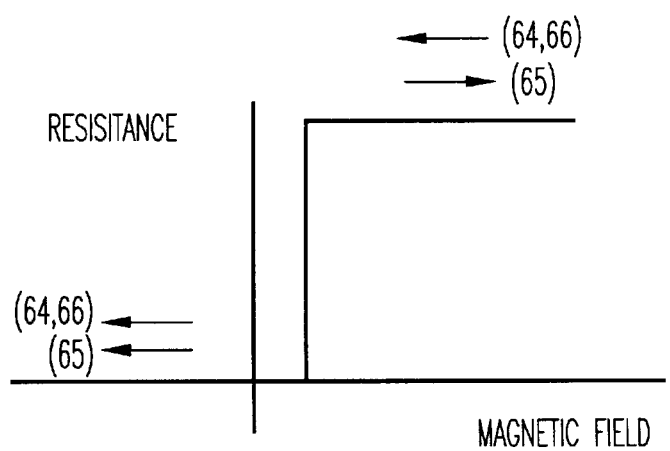
FIG. 41 is a diagram showing the characteristics of magnetoresistance in a magnetic element as the seventh embodiment.
Figure 42:
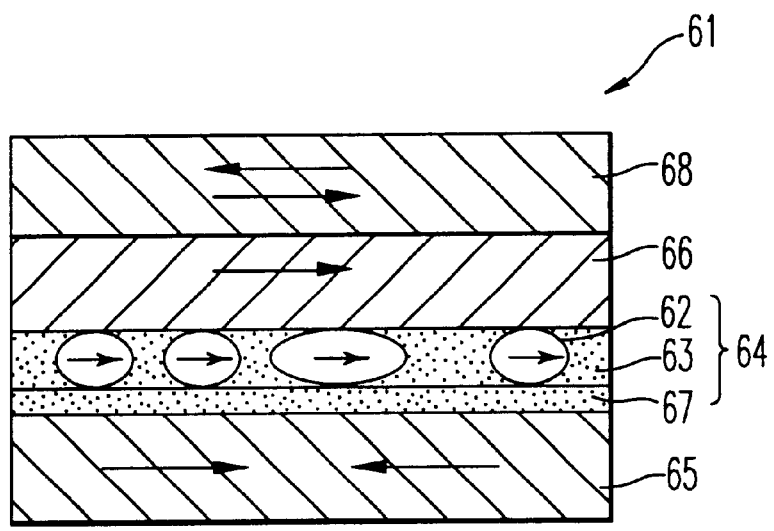
FIG. 42 is a sectional view showing a magnetic element as the eighth embodiment according to the second aspect of the present invention.

This is illustrated in FIG. 41. In FIG. 41, the arrow denotes the direction of spin. In the case of the ferromagnetic tunnel effect element shown in FIGS. 39 and 40, the electrode 66 (or the ferromagnetic electrode) is substantially in contact with the ferromagnetic material 62 in the mixed layer 64, and hence their spins are in the same direction. And, resistance between the mixed layer 64 and the electrode 66 is small, and current due to ordinary conduction, which is not tunnel current, flows across them.

Therefore, the tunnel magnetoresistance occurs only between the ferromagnetic electrode 65 and mixed layer 64; this makes it necessary to control only the thickness of the dielectric layer 67 if magnetoresistance is to be obtained. In other words, the magnetic element shown in FIGS. 39 and 40 is constructed such that the tunnel magnetoresistance is controlled by the single tunnel junction; therefore, unlike the double tunnel effect element having two tunnel barriers, this magnetic element does not pose a problem of fluctuating in resistance and magnetic field sensitivity depending on whether the two tunnel barriers vary from each other in thickness.

In other words, for the ferromagnetic tunnel effect element 61 shown in FIGS. 39 and 40 to produce tunnel magnetoresistance, it is only necessary to control the thickness of the dielectric layer 67. Therefore, the element can be free from fluctuation in resistance and magnetic field sensitivity. In addition, having only one tunnel barrier, the ferromagnetic tunnel effect element 61 permits its resistance to be decreased greatly. The fact that the electrode 68 is substantially in contact with the ferromagnetic material 62 in the mixed layer 64 offers the advantage of preventing the spin of the ferromagnetic material 62 in the mixed layer from being reversed by temperature rise and disturbing magnetic field. This strengthens the magnetoresistance effect in a stable manner.

The magnetic element 61 shown in FIGS. 39 and 40 is constructed such that the ferromagnetic material 62 in the mixed layer 64 does not exhibit superparamagnetism but has a finite coercive force; therefore, it does not suffer the disadvantage of having a large magnetic field for saturation unlike the conventional granular-type tunnel film. In addition, the fact that the mixed layer 64 is a mixture of the ferromagnetic material 62 and the dielectric material 63 makes the magnetic element 61 free from the problem of becoming unstable in resistance and magnetoresistance effect due to fluctuation in insulating layer and pinholes as in the conventional ferromagnetic tunnel junction. In addition, the magnetic element has an advantage of being small in electric resistance.

In addition, electric resistance can be properly controlled by controlling the length of path (across the film thickness or along the film surface) of electric current flowing in the mixed layer 64 and also controlling the filling ratio (by volume), size, and dispersion of the ferromagnetic material 62. Therefore, the magnetic element 61 can have its electric resistance adjusted as desired when it is applied to a variety of magnetic devices.

As mentioned above, the magnetic element 61 provides a large magnetoresistance easily and stably in a small magnetic field. In addition, it keeps good stability in resistance and magnetic field sensitivity and permits its resistance to be reduced or to be set at an adequate value. Thus, the ferromagnetic tunnel effect element 61 of the present invention is of practical use as magnetic heads, magnetic field sensors, and magnetic memory elements.

Incidentally, the state in which the electrode 66 is substantially in contact with the ferromagnetic material 62 in the mixed layer 64 denotes the state in which current between them is not tunnel current but ordinary current due to conduction. Therefore, it is permissible to interpose an extremely thin dielectric material between the electrode 66 and the ferromagnetic material 62 in the mixed layer 64 so long as ordinary current flows between the mixed layer 64 and the electrode 66. The foregoing is mainly about the instance in which both of the electrodes 66 and 67 are made of a ferromagnetic material. It is apparent from the principle that the electrode 67, which is substantially in contact with the ferromagnetic material 62 in the mixed layer 64, may be a non-magnetic material or an antiferromagnetic material.

A detailed description is given below of the constituent parts of the magnetic element 61. As mentioned above, the mixed layer 64 may be constructed of the dielectric material 63 (as a matrix) and the ferromagnetic material 62 dispersed therein, as shown in FIG. 39, or constructed of the ferromagnetic material 62 (as a matrix) and the dielectric material 63 dispersed therein, as shown in FIG. 40.

In other words, the mixed layer 64 used in the present invention is satisfactory so long as it is constructed such that the ferromagnetic material 62 and the dielectric material 63 are separated from each other in the sectional view. The mixing ratio of the ferromagnetic material 62 and the dielectric material 63 is not specifically restricted. The mixed layer 62 of any kind differing in mixing ratio may be used so long as the ferromagnetic material 62 in the mixed layer 64 has a coercive force and tunnel current can flow through the ferromagnetic material 62 in the mixed layer 64.

The ferromagnetic material 62 in the mixed layer 64 may be selected from a variety of soft and hard ferromagnetic materials. The former includes Fe—Ni alloy (typified by permalloy), amorphous alloy, Fe, Co, Ni, and alloys thereof (which exhibit ferromagnetism), half metal or Heusler alloys such as NiMnSb and PtMnSb, oxide half metal such as $CrO_2$, magnetite, and Mn—perovskite. The latter includes Co—Pt alloy, Fe—Pt alloy, and transition metal-rare earth alloy.

And, the dielectric material 63 may be selected from a variety of dielectric materials such as $Al_2O_3$, $SiO_2$, MgO, $MgF_2$, $Bi_2O_3$, AlN, and $CaF_2$. One of these dielectric materials is used to separate the above-mentioned ferromagnetic material 62, so that the mixed layer 64 of the present invention is obtained. Incidentally, the above-mentioned oxide, nitride, and fluoride usually have defective elements; however, such dielectric materials do not pose any problem.

On the other hand, the ferromagnetic electrode 65 may be selected from a variety of ferromagnetic materials (including soft magnetic materials and hard magnetic materials), as in the case of the ferromagnetic material 62 in the mixed layer 64, so long as it has a coercive force which is different from that of the mixed layer 64. For example, half metal produces a magnetoresistance effect more significantly because its one spin band has an energy gap and only those electrons having spin in one direction contribute to conduction.

The dielectric layer 67 may be formed from a variety of dielectric materials in the case of the dielectric material 63 in the mixed layer 64. It may be the same as or different from the dielectric material 63. The dielectric layer is not specifically restricted so long as it permits tunnel current to flow through it between the ferromagnetic electrode 65 and the mixed layer 64.

The electrode 66, which is substantially in contact with the ferromagnetic material 62 in the mixed layer 64, is not limited to a ferromagnetic material, as mentioned above. It may be made of a non-magnetic material or antiferromagnetic material because tunnel current does not substantially flow between the mixed layer 64 and the electrode 66. If the electrode 66 is made of a ferromagnetic material or antiferromagnetic material, the ferromagnetic material 62 in the mixed layer 64 comes into contact with the electrode 66 for bonding with exchange interaction. This results in the spin direction becoming stable for a larger magnetoresistance. This also prevents the spin from being disturbed by temperature rise and disturbing magnetic field. For this reason, it is desirable to form the electrode 66 from a ferromagnetic material or antiferromagnetic material. Incidentally, in the case where the electrode 66 is made of a ferromagnetic material, this ferromagnetic material is not necessarily the same material for the ferromagnetic electrode 65; it may be a different ferromagnetic material.

Also, the electrode 66 may be a laminate film composed of a ferromagnetic material and a non-magnetic material. In this case, if the adjacent ferromagnetic materials, with a non-magnetic material interposed between them, have spins coupled antiparallel, the electrode 66 stabilizes the spin direction of the ferromagnetic material 62 in the mixed layer 64. This enhances the magnetoresistance effect. An additional advantage in this case is that leakage of magnetic flux from the magnetic film can be prevented.

In the case where the electrode 66 is made of a ferromagnetic material, it is possible to employ a structure in which the ferromagnetic electrode 66 is in contact with the antiferromagnetic material 68. This structure permits the spin of the ferromagnetic electrode 66 to be stabilized by the antiferromagnetic material 68. Consequently, the ferromagnetic material 62 in the mixed layer 64 in contact with it has its spin direction stabilized. This enhances the magnetoresistance effect. If the spin of the ferromagnetic material 62 in the mixed layer 64 is to be reversed by an external magnetic field, it is possible to employ a structure in which the ferromagnetic electrode 65 is in contact with the antiferromagnetic material.

The mixed layer 64 and the ferromagnetic electrode 65 (and the electrode 66 if it is made of a ferromagnetic material) should preferably have the uniaxial magnetic anisotropy in the film plane. This permits the steep magnetization reversal to take place and the magnetized state to be held stably. These characteristic properties are effective for application to magnetic heads and magnetic memory elements. The film thickness of the electrodes 65 and 66 is not specifically restricted; but it should preferably be about 0.1–100 nm. An excessively large thickness makes the element unduly large. The film thickness of the mixed layer 64 should preferably be rather thin, for example, thinner than 100 nm.

The Eighth Embodiment

The magnetic element 61 according to the second aspect of the present invention, as shown in FIGS. 39 and 40, has the constituent layers laminated in the direction perpendicular to the substrate. This layer structure may be applied to the planar-type element in which two divided ferromagnetic electrodes 85a and 85b are arranged side by side on the dielectric layer 87 adjacent to the mixed layer 84, as shown in FIG. 43.

Figure 43:
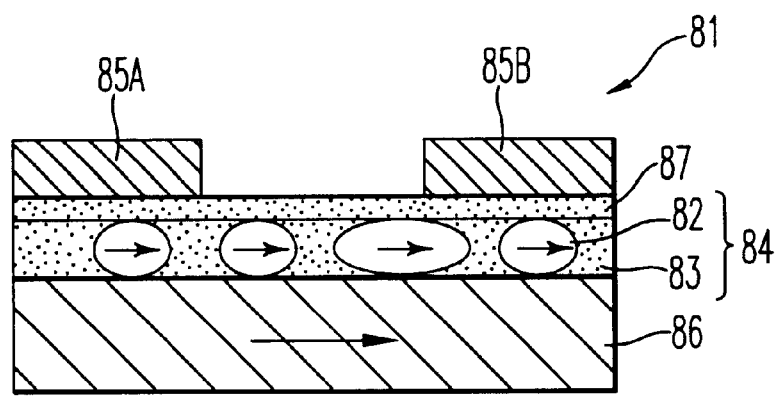
FIG. 43 is a sectional view showing a planar-type magnetic element as the ninth embodiment according to the second aspect of the present invention.

The magnetic element 81 of planar type as shown in FIG. 43 functions as follows. When a voltage is applied across the two ferromagnetic electrodes 85a and 85b, a tunnel current flows from the ferromagnetic electrode 85a to the mixed layer 84 and then to the other ferromagnetic electrode 85b through the electrode 86 in contact with the ferromagnetic material 82 in the mixed layer 84. In other words, the electrode 86 is substantially in contact with the ferromagnetic material 82 in the mixed layer 84 and there is only a small resistance between them. Therefore, the current flowing through the mixed layer 84 along the substrate can be suppressed. As mentioned above, the magnetic element according to the second aspect of the present invention, particularly the magnetic element 81 of planar type, permits easy production and exhibits improved characteristic properties.

Also, in the magnetic element 81 of planer type as shown in FIG. 43, since a plurality of laminate layers of the mixed layer 84 and ferromagnetic electrode 85 can be used, it is possible to increase the rate of change in magnetoresistance. In this case, current flows mainly through the electrode 86, which has a small resistance that can be neglected compared with the resistance across the mixed layer 84 if the sectional area of the element is made smaller. Therefore, as the path for current traversing the mixed layer 84 doubled, the electric current increases accordingly. In this way it is possible to adjust the characteristic properties individually.

The magnetic elements 61 and 81 according to the second aspect of the present invention, which have been explained above with reference to FIGS. 39, 40, and 43, are intended for use as two-terminal elements. However, they may also be used as three-terminal elements, if a third gate electrode is formed on the mixed layer 64 or 84, with a dielectric layer interposed between them, so that the gate electrodes controls the tunnel current flowing through the mixed layer 64 or 84 and also controls the spin direction. Such three-terminal elements should preferably be manufactured after the structure of the magnetic element 81 of planar type as shown in FIG. 43.

The above-mentioned magnetic elements 61 and 81 according to the second aspect of the present invention are typically in the form of thin film. Therefore, they can be manufactured by the ordinary thin film forming methods, such as molecular beam epitaxy, sputtering, vapor deposition, and plating. The mixed layer 64 may be manufactured by depositing the ferromagnetic material 62 and the dielectric material 63 simultaneously and laminating them alternately.

The ferromagnetic tunnel effect elements 61 and 81 have the constituent laminate film formed on a substrate of glass, ceramics, or metal (single crystal or polycrystal). A silicon substrate is desirable because it permits the gate electrodes to be formed easily and also it permits the use of conventional semiconductor technologies. Incidentally, the ferromagnetic tunnel effect element of the present invention may have an underlying layer of magnetic or non-magnetic material or an overcoating layer of non-magnetic material.

The magnetic elements 61 and 81 according to the second aspect of the present invention may be applied to magnetic devices such as magnetoresistance effect-type magnetic head, magnetic field sensor, and magnetic memory element. Such magnetic heads and magnetic memory elements should preferably have film with magnetic anisotropy.

The magnetoresistance effect-type magnetic head mentioned above may be constructed in the same way as the conventional magnetoresistance effect head. In other words, the magnetic film of the mixed layer 64 or 84 or the magnetic film of the ferromagnetic electrode 65 or 85, whichever has a lower coercive force, is utilized as a magnetosensitive layer, so that the magnetosensitive layer has its direction of magnetization changed according to the signal magnetic field. The sense current (including tunnel current) thus generated is measured for voltage to detect the signal magnetic field. The magnetic head is useful as the reproducing head (for magnetic recording devices) and the magnetic field sensor.

The Ninth Embodiment

Figure 44:
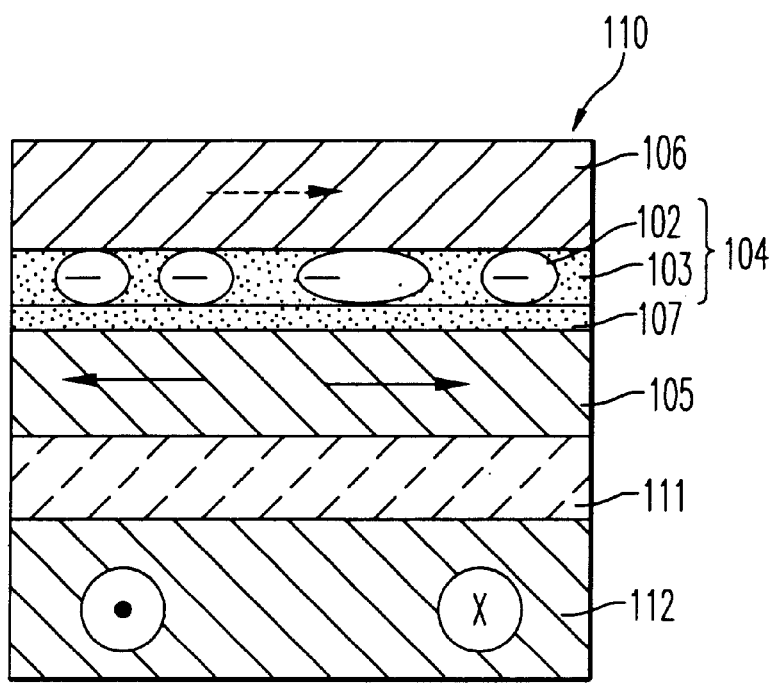
FIG. 44 is a sectional view showing the tenth embodiment according to the second aspect of the present invention.

The magnetic element according to the second aspect of the present invention may be applied to magnetic memory elements as mentioned above. In this case, the ferromagnetic electrode or mixed layer serves for writing. The writing of signals is accomplished by controlling the direction of spin with current which flows in either direction in the conducting layer 112 adjacent to the ferromagnetic electrode 105, with an insulating layer 111 interposed between them. The direction of spin represents "1" or "0". The reading is accomplished by reversing only the spin with a smaller coercive force and utilizing the magnetoresistance effect. FIG. 44 shows an instance in which the mixed layer 104 serves as the memory layer and the ferromagnetic electrode 105 serves as the reproduction layer.

The foregoing embodiment may be modified such that the conductor layer is adjacent to the mixed layer 104, with an insulating layer interposed between them.

The Tenth Embodiment

Figure 45:
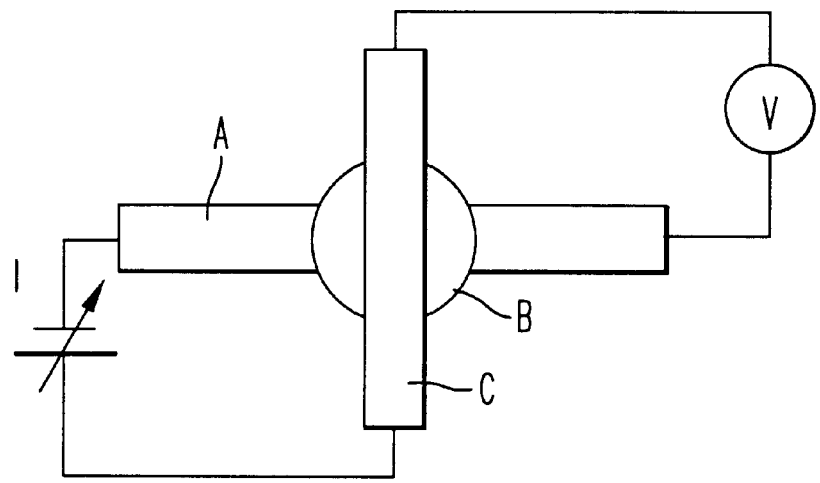
FIG. 45 is a plan view showing the eleventh embodiment according to the second aspect of the present invention.
Figure 46:
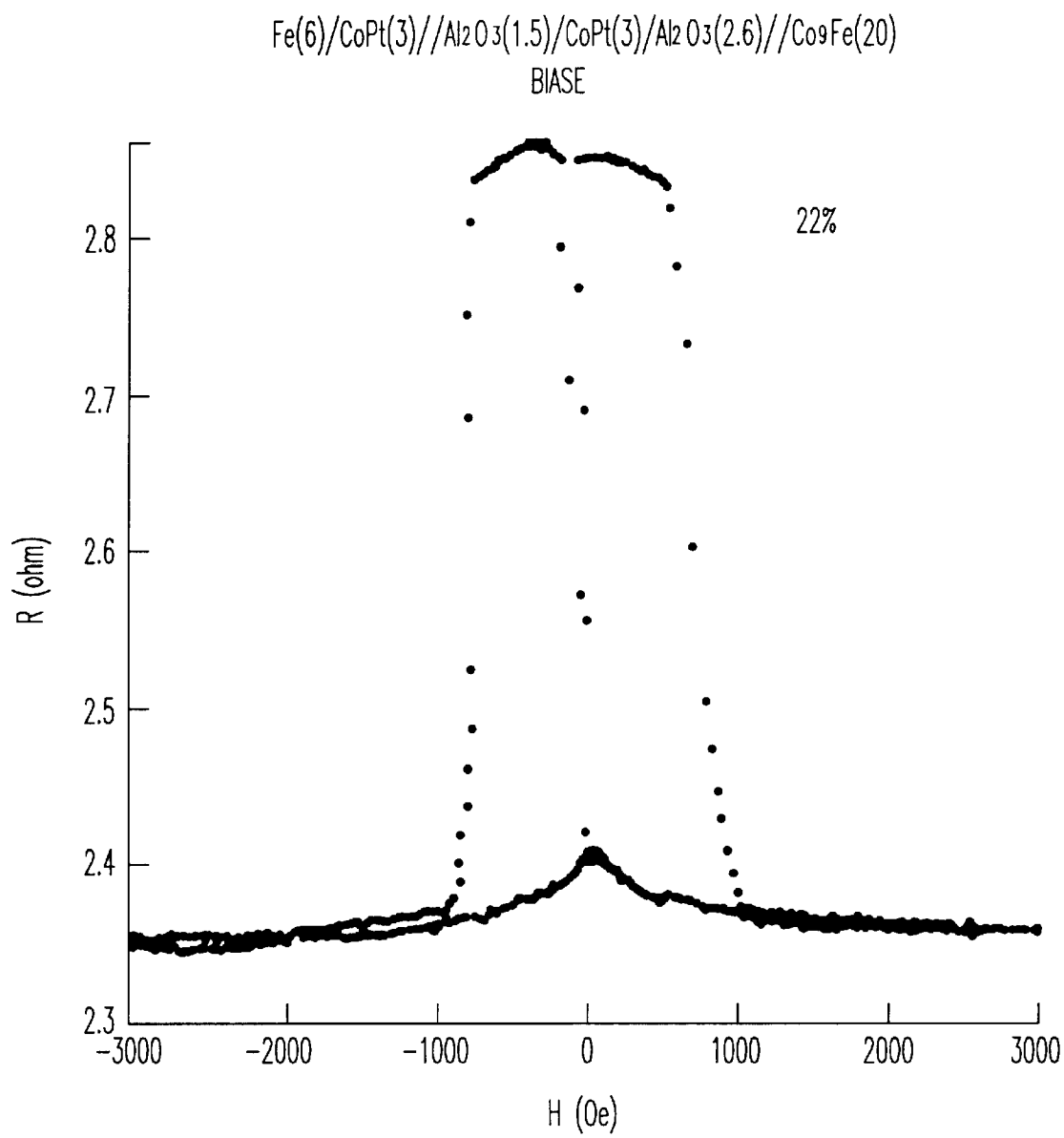
FIG. 46 is a graph showing the change in resistance by magnetic field which occurs in the magnetic element in Example 9 according to the second aspect of the present invention.

The tenth embodiment according to the second aspect of the present invention will be described with reference to FIG. 46. The magnetic element shown in FIG. 45 is composed of two ferromagnetic electrodes A and C in strip form, which intersect each other at right angles, with a round mixed layer B interposed between them. The electrodes A and C are connected to a power source and a voltmeter (V). Several samples were prepared from different materials as demonstrated in the following examples, and they were evaluated.

Example 10

A magnetic element constructed as shown in FIG. 45 was prepared by sputtering in the following manner. On an MgO (110) substrate was formed through a metal mask a ferromagnetic laminate film A in strip form (0.1 mm wide) which is composed of Fe (6 nm thick) and $Co_{80}Pt_{20}$ (3 nm thick).

On this laminate film was formed through a round mask a laminate film B composed of $Al_2O_3$ and $Co_{80}Pt_{20}$ alloy by using targets of $Co_{80}Pt_{20}$ alloy and $Al_2O_3$. The laminate film B was formed in three steps. First, a film of $Al_2O_3$, 1.5 nm thick and 2 mm in diameter, was formed. Next, a film of $Co_{80}Pt_{20}$ alloy, 2.8 nm thick, was formed thereon, with the substrate biased with 400 W. Finally, a film of $Al_2O_3$, 1.5 nm thick, was formed.

With the mask replaced, a film C of $Co_9Fe$ (20 nm thick) in strip form was formed on the laminate film B, such that it intersects the ferromagnetic laminate film A at right angles. In this way there was obtained a ferromagnetic tunnel effect element as shown in FIG. 45.

The resulting granular magnetic film was examined for sectional structure by using a transmission electron microscope. It was found that the film is composed of $Co_{80}Pt_{20}$ alloy and $Al_2O_3$, which are separated from each other, as schematically shown in FIG. 39. It was also found that the $Al_2O_3$ film in the granular magnetic film is thin and the $Co_{80}Pt_{20}$ magnetic ally and $Co_9Fe$ film are in contact with each other in the granular magnetic film.

The above-mentioned ferromagnetic laminate film A and $Co_9Fe$ film C were coated with Au by sputtering. Using the deposited Au as the electrodes, a voltage was applied across the two films and their magnetoresistance in a magnetic field was measured. The change of resistance versus the magnetic field is shown in FIG. 46. It is noted that resistance steeply changes at about 30 Oe, which corresponds to the coercive force of the ferromagnetic laminate layer A composed of Fe (6 nm)/$Co_{80}Pt_{20}$ (3 nm). The rate of change in resistance is 22%, and the peak value of resistance is about $2.9\Omega$.

Comparative Example 1

The same procedure as in Example 10 was repeated to form a tunnel junction, except that the $Co_9Fe$ film (as the upper electrode) was formed on the granular magnetic film, with a 2.5-nm thick $Al_2O_3$ film interposed between them. The resulting granular magnetic film was examined for sectional structure by using a transmission electron microscope. It was found that there exists a 2.5-nm thick $Al_2O_3$ film between the $Co_9Fe$ film and the granular magnetic film.

Figure 47:
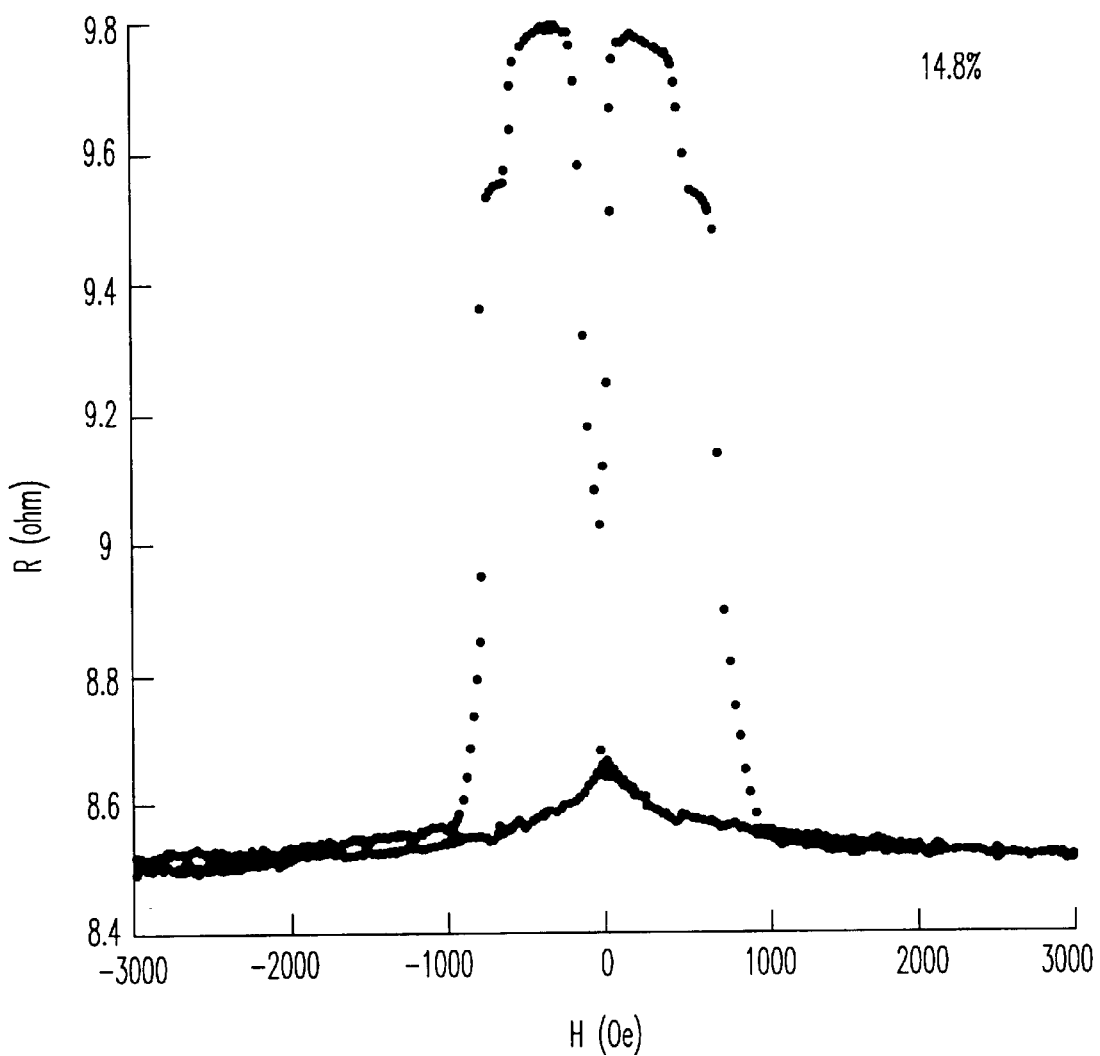
FIG. 47 is a graph showing the change in resistance by magnetic field which occurs in the magnetic element in Comparative Example.

The tunnel junction was measured for magnetoresistance in a magnetic field in the same way as in Example 1. The change in magnetoresistance versus the magnetic field is shown in FIG. 47. It is noted that resistance changes stepwise at about 30 Oe, which corresponds to the coercive force of Fe (6 nm)/$CO_{80}Pt_{20}$ (3 nm), and also at about 100 Oe, which corresponds to the coercive force of the $Co_9Fe$ film. The rate of change in resistance is about 15%, and the peak value of resistance is about $9.8\Omega$.

It is noted that resistance increases and the rate of change in magnetoresistance decreases if a dielectric layer is interposed between each of the two electrodes and the granular magnetic film.

Example 11

Figure 48:
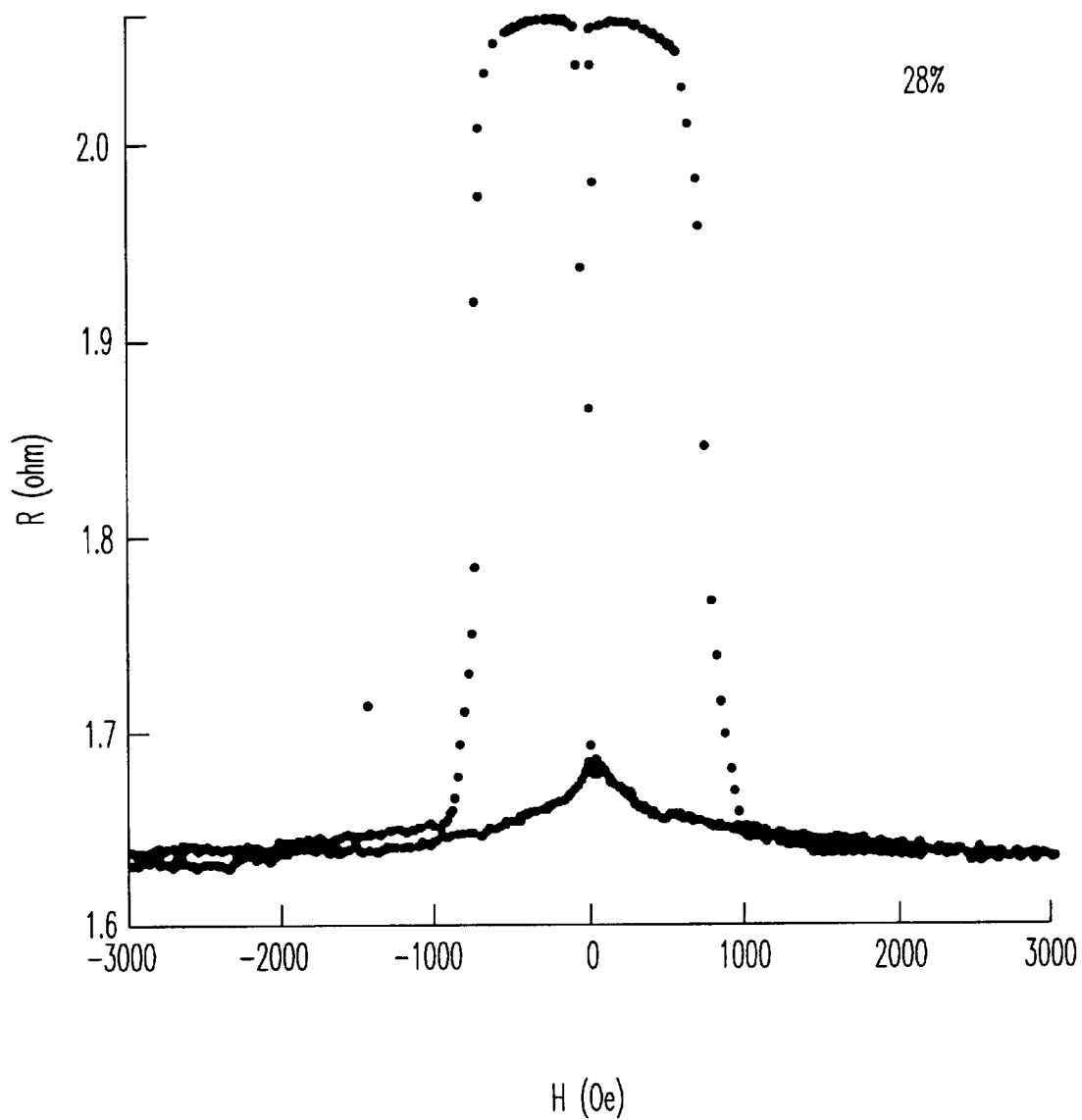
FIG. 48 is a graph showing the change in resistance by magnetic field which occurs in the magnetic element in Example 10 according to the second aspect of the present invention.

The same procedure as in Example 10 was repeated to form a tunnel junction, except that the lower ferromagnetic electrode of Fe (6 nm)/$Co_{80}Pt_{20}$ (3 nm) was replaced by a laminate film of Fe (6 nm)/CoFe (3 nm). The change of resistance versus the magnetic field is shown in FIG. 48. It is noted that resistance steeply changes at about 20 Oe, which corresponds to the coercive force of the laminate film of Fe (6 nm)/CoFe (3 nm). The rate of change in resistance is 28%, and the peak value of resistance is $2.1\Omega$.

Example 12

The magnetoresistance effect elements in Example 10 and Comparative Example 1 were tested for fluctuation in magnetoresistance with temperature change. It was found that the magnetoresistance decreased from 15% to 9% at 100° C. in Comparative Example 1, whereas the magnetoresistance decreased only slightly from 22% to 20% at 100° C. in Example 10. This indicates that the magnetoresistance effect element of the present invention is superior in temperature stability.

As mentioned above, the magnetic element pertaining to the first aspect of the present invention easily provides a large rate of change in magnetoresistance with a small magnetic field. In addition, it permits the junction resistance to be reduced and exhibits characteristic properties with good reproducibility. It changes little in magnetoresistance by temperature rise and external disturbing magnetic field. The ferromagnetic tunnel effect element of the present invention may be used as constituents for magnetic heads and magnetic field sensors with high sensitivity and large output voltage. It may also be applied to magnetic memory devices as non-volatile solid magnetic memory with high speed and high output.

Incidentally, the methods for measuring the change in resistance which were used in the above-mentioned embodiments and examples may be used in all other embodiments and examples.

Whereas the present invention has been particularly shown and described with reference to preferred embodiments thereof, it will be understood by those skilled in the art that various other changes in the form and details may be made therein without departing from the spirit and scope of the invention.

What is claimed is:

1. A magnetic element, comprising:
    ferromagnetic-dielectric mixed layer having ferromagnetic material and dielectric material; the ferromagnetic material in the ferromagnetic-dielectric mixed layer having volume not smaller than that of the dielectric material in the ferromagnetic-dielectric mixed layer,
    first and second tunnel dielectric barriers respectively formed on the ferromagnetic-dielectric mixed layer,
    first layer of ferromagnetic material formed so that the first dielectric barrier is interposed between the ferromagnetic-dielectric mixed layer and the first layer of ferromagnetic material; and second layer of ferromagnetic material formed on the second dielectric barrier so that electric current flowing between the first and second layers of ferromagnetic material flows through each of the first and second dielectric tunnel barriers and the ferromagnetic-dielectric mixed layer.

2. The magnetic element as set forth in claim 1, wherein the dielectric material of the ferromagnetic-dielectric mixed layer is dispersed such that the ferromagnetic material serves as matrix to surround the dispersed ferromagnetic material.

3. The magnetic element as set forth in claim 1, further comprising antiferromagnetic layer; the antiferromagnetic layer being exchange coupled with and providing coupling force to either one of first and second layers of ferromagnetic material.

4. The magnetic element as set forth in claim 1, further comprising layer of antiferromagnetic material; the layer of antiferromagnetic material being exchange coupled with and providing coupling force to the ferromagnetic material in the ferromagnetic-dielectric layer.

5. The magnetic element as set force in claim 1, wherein the first and second tunnel dielectric barriers are formed by one dielectric layer, and the first and second layers of ferromagnetic material are formed on one surface of the dielectric layer.

6. The magnetic element as set forth in claim 1, wherein either one of the ferromagnetic material of the ferromagnetic-dielectric layer, and the first and second layers of ferromagnetic material comprises one material selected from the group consisting Co, CoPt, FePt, and alloy of transition metal and rare earth metal.

7. The magnetic element as set forth in claim 6, wherein other one of the ferromagnetic material of the ferromagnetic-dielectric layer, and the first and second layers of ferromagnetic material comprises one material selected from the group consisting Fe, Ni, Co, Fe alloy, Ni alloy, Co alloy, magnetite, oxide magnetic material, and Heusler alloy.

8. A magnetic memory device, comprising;
memory cell, having
ferromagnetic-dielectric mixed layer having ferromagnetic material and dielectric material; the ferromagnetic material in the ferromagnetic-dielectric mixed layer having volume not smaller than that of the dielectric material in the ferromagnetic-dielectric mixed layer,
first and second tunnel dielectric barriers respectively formed on the ferromagnetic-dielectric mixed layer,
first layer of ferromagnetic material formed so that the first dielectric barrier is interposed between the ferromagnetic-dielectric mixed layer and the first layer of ferromagnetic material; and
second layer of ferromagnetic material formed on the second dielectric barrier so that electric current flowing between the first and second layers of ferromagnetic material flows through each of the first and second dielectric tunnel barriers and the ferromagnetic-dielectric mixed layer.

9. A magnetoresistance effect head, comprising;
ferromagnetic-dielectric mixed layer having ferromagnetic material and dielectric material; the ferromagnetic material in the ferromagnetic-dielectric mixed layer having volume not smaller than that of the dielectric material in the ferromagnetic-dielectric mixed layer,
first and second tunnel dielectric barriers respectively formed on the ferromagnetic-dielectric mixed layer,
first layer of ferromagnetic material formed so that the first dielectric barrier is interposed between the ferromagnetic-dielectric mixed layer and the first layer of ferromagnetic material; and
second layer of ferromagnetic material formed on the second dielectric barrier so that electric current flowing between the first and second layers of ferromagnetic material flows through each of the first and second dielectric tunnel barriers and the ferromagnetic-dielectric mixed layer.

10. A magnetic storage system, comprising:
magnetic media;
magnetoresistance effect head for reproducing magnetic information of the magnetic media having
ferromagnetic-dielectric mixed layer having ferromagnetic material and dielectric material; the ferromagnetic material in the ferromagnetic-dielectric mixed layer having volume not smaller than that of the dielectric material in the ferromagnetic-dielectric mixed layer,
first and second tunnel dielectric barriers respectively formed on the ferromagnetic-dielectric mixed layer,
first layer of ferromagnetic material formed so that the first dielectric barrier is interposed between the ferromagnetic-dielectric mixed layer and the first layer of ferromagnetic material; and
second layer of ferromagnetic material formed on the second dielectric barrier so that electric current flowing between the first and the second layers of ferromagnetic material flows through each of the first and second dielectric tunnel barriers and the ferromagnetic-dielectric mixed layer.

11. A magnetic element, comprising:
ferromagnetic-dielectric mixed layer having ferromagnetic material and dielectric material;
tunnel dielectric barrier formed on the ferromagnetic-dielectric mixed layer;
layer of ferromagnetic material formed on the tunnel dielectric barrier so that the tunnel dielectric barrier is interposed between the ferromagnetic-dielectric mixed layer and the layer of ferromagnetic material;
electrode formed in direct contact with the ferromagnetic material of the ferromagnetic-dielectric mixed layer so that electric current flowing between the layer of ferromagnetic material and the electrode flows through the dielectric tunnel barrier and the ferromagnetic-dielectric mixed layer.

12. The magnetic element as set forth in claim 11, wherein the magnetic element has plurality of the layer of ferromagnetic material formed on one surface of the first dielectric barrier.

13. The magnetic element as set forth in claim 12, further comprising layer of antiferromagnetic material; the layer of antiferromagnetic material being exchange coupled with and providing coupling force to the layer of ferromagnetic material.

14. The magnetic device as set forth in claim 11, further comprising layer of antiferromagnetic material; the layer of antiferromagnetic material being exchange coupled with and providing coupling force to the ferromagnetic material of the ferromagnetic-dielectric mixed layer.

15. The magnetic device as set forth in claim 11, wherein the ferromagnetic material of the ferromagnetic-dielectric mixed layer comprising material selected from the group consisting FeNi, amorphous alloy, Fe, Co, Ni, Fe alloy, Co alloy, Ni alloy, half metal, and alloy of transition metal and rare earth metal.

16. The magnetic element as set forth in claim 11, wherein the dielectric material of the ferromagnetic-dielectric mixed layer comprises material selected from the group consisting $Al_2O_3$, $SiO_2$, MgO, $MgF_2$, $Ni_2O_3$, AlN, and $CaF_2$.

17. A magnetic memory device, comprising magnetic memory cell having ferromagnetic-dielectric mixed layer of ferromagnetic material and dielectric material;

tunnel dielectric barrier formed on the ferromagnetic-dielectric mixed layer;

layer of ferromagnetic material formed so that the tunnel dielectric barrier is interposed between the ferromagnetic-dielectric mixed layer and layer of ferromagnetic material;

electrode formed in direct contact with the ferromagnetic material of the ferromagnetic-dielectric mixed layer and formed so that electric current flowing between the layer of ferromagnetic material and the electrode flows through the dielectric tunnel barrier and the ferromagnetic-dielectric mixed layer.

18. A magnetoresistance effect head, comprising:

ferromagnetic-dielectric mixed layer having ferromagnetic material and dielectric material;

tunnel dielectric barrier formed on the ferromagnetic-dielectric mixed layer;

layer of ferromagnetic material formed so that the tunnel dielectric barrier is interposed between the ferromagnetic-dielectric mixed layer and layer of ferromagnetic material;

electrode formed in direct contact with the ferromagnetic material of the ferromagnetic-dielectric mixed layer and formed so that electric current flowing between the layer of ferromagnetic material and the electrode flows through the dielectric tunnel barrier and the ferromagnetic-dielectric mixed layer.

19. A magnetic storage system, comprising:

magnetic media;

magnetoresistance effect head for reproducing magnetic information of the magnetic media having ferromagnetic-dielectric mixed layer having ferromagnetic material and dielectric material;

tunnel dielectric barrier formed on the ferromagnetic-dielectric mixed layer;

layer of ferromagnetic material formed so that the tunnel dielectric barrier is interposed between the ferromagnetic-dielectric mixed layer and layer of ferromagnetic material;

electrode formed in direct contact with the ferromagnetic material of the ferromagnetic-dielectric mixed layer and formed so that electric current flowing between the layer of ferromagnetic material and the electrode flows through the dielectric tunnel barrier and the ferromagnetic-dielectric mixed layer.

20. A magnetic element, comprising:

a ferromagnetic-dielectric layer comprising two or more zones of ferromagnetic material interrupted by at least one zone of dielectric material in which the volume of ferromagnetic material is not less than the volume of dielectric material;

first and second tunnel dielectric barriers respectively formed on the ferromagnetic-dielectric layer;

first layer of ferromagnetic material formed so that the first dielectric barrier is interposed between the ferromagnetic-dielectric layer and the first layer of ferromagnetic material; and second layer of ferromagnetic material formed on the second dielectric barrier so that the electric current flowing between the first and second layers of ferromagnetic material flows through each of the first and second dielectric tunnel barriers and the ferromagnetic-dielectric layer.

21. The magnetic element as set forth in claim 20, wherein the dielectric material of the ferromagnetic-dielectric layer is dispersed in the layer such that the ferromagnetic material serves as a matrix surrounding the dispersed ferromagnetic material.

22. The magnetic element as set forth in claim 20, which further comprises an antiferromagnetic layer, the antiferromagnetic layer being exchange coupled with and providing coupling force to either one of the first and second layers of ferromagnetic material.

23. The magnetic element as set forth in claim 20, which further comprises an antiferromagnetic layer, the antiferromagnetic layer being exchange coupled with and providing coupling force to the ferromagnetic material in the ferromagnetic-dielectric layer.

24. The magnetic element as set forth in claim 20, wherein the first and second tunnel dielectric barriers are formed by one dielectric layer, and the first and second layers of ferromagnetic material are formed on one surface of the dielectric layer.

25. The magnetic element as set forth in claim 20, wherein either one of the ferromagnetic material of the ferromagnetic-dielectric layer or the first and second layers of ferromagnetic material comprises one material selected from the group consisting of Co, CoPt, FePt and an alloy of a transition metal and a rare earth metal.

26. The magnetic element as set forth in claim 25, wherein the other one of the ferromagnetic material of the ferromagnetic-dielectric layer, and the first and second layers of ferromagnetic material comprises one material selected from the group consisting of Fe, Ni, Co, Fe alloy, Ni alloy, Co alloy, magnetite, a magnetic oxide material and Heusler alloy.

27. A magnetic memory device, comprising:

a memory cell, having:

a ferromagnetic-dielectric layer comprising two or more zones of ferromagnetic material interrupted by at least one zone of dielectric material in which the volume of ferromagnetic material is not less than the volume of dielectric material;

first and second tunnel dielectric barriers respectively formed on ferromagnetic-dielectric mixed layer;

a first layer of ferromagnetic material formed so that the first dielectric barrier is interposed between the ferromagnetic-dielectric layer and the first layer of ferromagnetic material; and a second layer of ferromagnetic material formed on the second dielectric barrier so that the electric current flowing between the first and second layers of ferromagnetic material flows through each of the first and second dielectric tunnel barriers and the ferromagnetic-dielectric layer.

28. A megnetoresistance effect head, comprising;

a ferromagnetic-dielectric layer comprising two or more zones of ferromagnetic material interrupted by at least one zone of dielectric material in which the volume of ferromagnetic material is not less than the volume of dielectric material;

first and second tunnel dielectric barriers respectively formed on the ferromagnetic-dielectric mixed layer;

a first layer of ferromagnetic material formed so that the first dielectric barrier is interposed between the ferromagnetic-dielectric layer and the first layer of ferromagnetic material; and a second layer of ferromagnetic material formed on the second dielectric barrier so that the electric current flowing between the first and second layers of ferromagnetic material flows through each of the first and second dielectric tunnel barriers and the ferromagnetic-dielectric layer.

29. A magnetic storage system, comprising:

magnetic media, and magnetoresistance effect head for reproducing magnetic information on the magnetic media having:
 a ferromagnetic-dielectric layer comprising two or more zones of ferromagnetic material interrupted by at least one zone of dielectric material in which the volume of ferromagnetic material is not less than the volume of dielectric material;
 first and second tunnel dielectric barriers respectively formed on the ferromagnetic-dielectric mixed layer;
 a first layer of ferromagnetic material formed so that the first dielectric barrier is interposed between the ferromagnetic-dielectric layer and the first layer of ferromagnetic material; and
 a second layer of ferromagnetic material formed on the second dielectric barrier so that the electric current flowing between the first and second layers of ferromagnetic material flows through each of the first and second dielectric tunnel barriers and the ferromagnetic-dielectric layer.

30. A magnetic element, comprising:

a ferromagnetic-dielectric layer comprising ferromagnetic material and dielectric material;

a tunnel dielectric barrier formed on the ferromagnetic-dielectric layer;

a layer of ferromagnetic material formed on the tunnel dielectric barrier so that the tunnel dielectric barrier is interposed between the ferromagnetic-dielectric layer and the layer of ferromagnetic material; and an electrode formed in direct contact with the ferromagnetic material of the ferromagnetic-dielectric layer so that electric current flowing between the layer of ferromagnetic material and the electrode flows through the dielectric tunnel barrier and the ferromagnetic-dielectric layer.

31. A magnetic memory device, comprising:

a magnetic memory cell, having:
 a ferromagnetic-dielectric layer comprising ferromagnetic material and dielectric material;
 a tunnel dielectric barrier formed on the ferromagnetic-dielectric layer;
 a layer of ferromagnetic material formed so that the tunnel dielectric barrier is interposed between the ferromagnetic-dielectric layer and the layer of ferromagnetic material; and
 an electrode formed in direct contact with the ferromagnetic material of the ferromagnetic-dielectric layer so that electric current flowing between the layer of ferromagnetic material and the electrode flows through the dielectric tunnel barrier and the ferromagnetic-dielectric layer.

32. A magnetoresistance effect head, comprising:

a ferromagnetic-dielectric layer comprising ferromagnetic material and dielectric material;

a tunnel dielectric barrier formed on the ferromagnetic-dielectric layer;

a layer of ferromagnetic material formed so that the tunnel dielectric barrier is interposed between the ferromagnetic-dielectric layer and the layer of ferromagnetic material; and an electrode formed in direct contact with the ferromagnetic material of the ferromagnetic-dielectric layer so that electric current flowing between the layer of ferromagnetic material and the electrode flows through the dielectric tunnel barrier and the ferromagnetic-dielectric layer.

33. A magnetic storage system, comprising:

magnetic media, and a magnetoresistance effect head for reproducing magnetic information on the magnetic media having:
 a ferromagnetic-dielectric layer comprising ferromagnetic material and dielectric material;
 a tunnel dielectric barrier formed on the ferromagnetic-dielectric layer;
 a layer of ferromagnetic material formed so that the tunnel dielectric barrier is interposed between the ferromagnetic-dielectric layer and the layer of ferromagnetic material; and
 an electrode formed in direct contact with the ferromagnetic material of the ferromagnetic-dielectric layer so that electric current flowing between the layer of ferromagnetic material and the electrode flows through the dielectric tunnel barrier and the ferromagnetic-dielectric layer.

* * * * *